(12) United States Patent
Prahlad et al.

(10) Patent No.: US 11,338,449 B2
(45) Date of Patent: May 24, 2022

(54) METHODS AND SYSTEMS FOR ELECTROADHESION-BASED MANIPULATION IN MANUFACTURING

(71) Applicant: GRABIT, INC., Sunnyvale, CA (US)

(72) Inventors: Harsha Prahlad, Cupertino, CA (US); Richard J. Casler, Los Gatos, CA (US); Susan Kim, Menlo Park, CA (US); Matthew Leettola, San Jose, CA (US); Jon Smith, San Jose, CA (US); Kenneth Tan, San Jose, CA (US); Patrick Wang, San Jose, CA (US); John Mathew Farren, Beaverton, OR (US); Patrick Conall Regan, Beaverton, OR (US); Po Cheng Chen, Taichung (TW); Howard Fu, Beaverton, OR (US); Dragan Jurkovic, Beaverton, OR (US); Aishwarya Varadhan, Beaverton, OR (US); Chang-Chu Liao, Douliu (TW); Chih-Chi Chang, Douliu (TW); Kuo-Hung Lee, Douliu (TW); Ming-Feng Jean, Douliu (TW)

(73) Assignee: Grabit, Inc., Ada, MI (US)

( * ) Notice: Subject to any disclaimer, the term of this patent is extended or adjusted under 35 U.S.C. 154(b) by 0 days.

(21) Appl. No.: 16/030,340

(22) Filed: Jul. 9, 2018

(65) Prior Publication Data

US 2018/0326596 A1    Nov. 15, 2018

Related U.S. Application Data

(63) Continuation of application No. PCT/US2017/013262, filed on Jan. 12, 2017.

(Continued)

(51) Int. Cl.
*B25J 15/00* (2006.01)
*B25J 9/00* (2006.01)
(Continued)

(52) U.S. Cl.
CPC ......... *B25J 15/0085* (2013.01); *B23P 19/007* (2013.01); *B25H 1/20* (2013.01);
(Continued)

(58) Field of Classification Search
CPC .. B25J 15/0085; B25J 15/0616; B25J 9/0093; B25J 9/0096; B25J 9/1697;
(Continued)

(56) References Cited

U.S. PATENT DOCUMENTS 3,480,174 A   11/1969   Sherwood et al.
3,797,691 A   3/1974    Williams et al.
(Continued)

FOREIGN PATENT DOCUMENTS

CN   203889500 U   10/2014
CN   203911809 U   10/2014
(Continued)

OTHER PUBLICATIONS

Translation of DE-10320557-A1 (Year: 2004).*
(Continued)

*Primary Examiner* — Matthew P Travers
(74) *Attorney, Agent, or Firm* — Gardner, Linn, Burkhart & Ondersma LLP

(57) ABSTRACT

Systems, apparatus, and methods of manufacturing an article using electroadhesion technology for the pick-up and release of materials, respectively.

20 Claims, 36 Drawing Sheets

Related U.S. Application Data

(60) Provisional application No. 62/277,756, filed on Jan. 12, 2016.

(51) Int. Cl.

| | | |
|---|---|---|
| *B25J 19/02* | (2006.01) | |
| *B25J 15/06* | (2006.01) | |
| *B25J 9/16* | (2006.01) | |
| *B23P 19/00* | (2006.01) | |
| *B32B 37/18* | (2006.01) | |
| *B25H 1/20* | (2006.01) | |
| *H02N 13/00* | (2006.01) | |
| *B23P 21/00* | (2006.01) | |
| *B32B 38/18* | (2006.01) | |
| *A43D 111/00* | (2006.01) | |

(52) U.S. Cl.
CPC ............ *B25J 9/0093* (2013.01); *B25J 9/0096* (2013.01); *B25J 9/1697* (2013.01); *B25J 15/065* (2013.01); *B25J 15/0616* (2013.01); *B25J 15/0666* (2013.01); *B25J 19/023* (2013.01); *B32B 37/18* (2013.01); *H02N 13/00* (2013.01); *A43D 111/003* (2013.01); *B23P 21/00* (2013.01); *B32B 2038/1891* (2013.01); *B32B 2309/70* (2013.01)

(58) Field of Classification Search
CPC ...... H01L 21/6831–6833; B23P 19/007; B23P 21/002–21/004; B25H 1/00; B25H 1/0092; B25H 1/20; B32B 37/18; B32B 38/18; B32B 2038/1891; B32B 39/00; B32B 2309/70; D06M 17/00
See application file for complete search history.

(56) References Cited

U.S. PATENT DOCUMENTS

| | | | |
|---|---|---|---|
| 4,723,353 A | 2/1988 | Monforte | |
| 4,856,769 A | 8/1989 | Andrew et al. | |
| 5,207,313 A | 5/1993 | Gebhardt | |
| 5,532,903 A | 7/1996 | Kendall | |
| 5,765,707 A | 6/1998 | Kenevan | |
| 5,883,357 A | 3/1999 | Newman et al. | |
| 6,123,185 A | 9/2000 | Demarest et al. | |
| 6,548,982 B1 | 4/2003 | Papanikolopoulos et al. | |
| 6,622,063 B1 | 9/2003 | Moritz et al. | |
| 6,721,762 B1 | 4/2004 | Levine et al. | |
| 7,034,432 B1 | 4/2006 | Pelrine et al. | |
| 7,598,651 B2 | 10/2009 | Kornbluh et al. | |
| 8,469,342 B2 | 6/2013 | Tatsumi et al. | |
| 9,987,755 B2 | 6/2018 | Prahlad et al. | |
| 2001/0045755 A1 | 11/2001 | Schick et al. | |
| 2004/0045963 A1 | 3/2004 | Hoogland | |
| 2004/0146380 A1 | 7/2004 | Baker et al. | |
| 2004/0162639 A1 | 8/2004 | Watanabe et al. | |
| 2005/0036873 A1 | 2/2005 | Ikehata et al. | |
| 2007/0005180 A1 | 1/2007 | Stingel, III et al. | |
| 2007/0271857 A1 | 11/2007 | Heather et al. | |
| 2008/0089002 A1 | 4/2008 | Pelrine et al. | |
| 2009/0060693 A1* | 3/2009 | Takahashi ............ B25J 21/00 414/222.02 |
| 2010/0018964 A1 | 1/2010 | Smith | |
| 2010/0147842 A1 | 6/2010 | Reynard et al. | |
| 2010/0178139 A1 | 7/2010 | Sundar et al. | |
| 2010/0249553 A1 | 9/2010 | MacLaughlin | |
| 2011/0193362 A1 | 8/2011 | Prahlad et al. | |
| 2011/0202157 A1 | 8/2011 | Spikker | |
| 2012/0024740 A1 | 2/2012 | Gollnick et al. | |
| 2012/0101627 A1 | 4/2012 | Lert | |
| 2012/0120544 A1 | 5/2012 | Pelrine et al. | |
| 2012/0181270 A1 | 7/2012 | Smith | |
| 2012/0330453 A1 | 12/2012 | Samak et al. | |
| 2013/0010398 A1 | 1/2013 | Prahlad et al. | |
| 2013/0125319 A1 | 5/2013 | Regan | |
| 2013/0129464 A1 | 5/2013 | Regan et al. | |
| 2013/0149485 A1 | 6/2013 | Furukawa et al. | |
| 2013/0242455 A1 | 9/2013 | Prahlad et al. | |
| 2013/0276826 A1 | 10/2013 | Koenig et al. | |
| 2013/0292303 A1 | 11/2013 | Prahlad et al. | |
| 2013/0294875 A1 | 11/2013 | Prahlad et al. | |
| 2014/0008359 A1 | 1/2014 | Ferren | |
| 2014/0030679 A1* | 1/2014 | Wong .............. G09B 5/02 434/88 |
| 2014/0035855 A1* | 2/2014 | Feldman ............. G06F 3/0488 345/173 |
| 2014/0036404 A1 | 2/2014 | Prahlad et al. | |
| 2014/0104744 A1 | 4/2014 | Prahlad et al. | |
| 2014/0241844 A1 | 8/2014 | Golda et al. | |
| 2015/0102993 A1* | 4/2015 | Gadjali ............ G06F 3/038 345/156 |
| 2015/0176981 A1 | 6/2015 | Regan et al. | |
| 2015/0295206 A1 | 10/2015 | Hsieh | |
| 2015/0298320 A1 | 10/2015 | Eisele et al. | |
| 2015/0314583 A1 | 11/2015 | Jess et al. | |
| 2016/0318190 A1 | 11/2016 | Prahlad et al. | |
| 2017/0036798 A1 | 2/2017 | Prahlad et al. | |
| 2018/0250832 A1 | 9/2018 | Prahlad et al. | |
| 2018/0304556 A1* | 10/2018 | Reinhold ............ B29C 31/085 |
| 2018/0319019 A1 | 11/2018 | Prahlad et al. | |
| 2018/0319020 A1 | 11/2018 | Prahlad et al. | |

FOREIGN PATENT DOCUMENTS

| | | | |
|---|---|---|---|
| CN | 203990927 U | 12/2014 | |
| CN | 104718609 A | 6/2015 | |
| DE | 10320557 A1 * | 12/2004 | ............ B23P 21/00 |
| DE | 102009011302 A1 | 9/2010 | |
| DE | 102011051585 A1 | 1/2013 | |
| DE | 102013220107 A1 | 4/2015 | |
| EP | 1473764 A2 | 11/2004 | |
| JP | S58104806 A | 6/1983 | |
| JP | H0539885 U | 5/1993 | |
| JP | H07116984 A | 5/1995 | |
| JP | H09269995 A | 10/1997 | |
| JP | 2000286543 A | 10/2000 | |
| JP | 2003285289 A | 10/2003 | |
| JP | 2004142878 A | 5/2004 | |
| JP | 2005035751 A | 2/2005 | |
| JP | 2007222967 A | 9/2007 | |
| JP | 2009166859 A | 7/2009 | |
| JP | 2012131612 A | 7/2012 | |
| JP | 2013037538 A | 2/2013 | |
| KR | 20110078566 A | 7/2011 | |
| KR | 20130130405 A | 12/2013 | |
| WO | WO-2007128398 A1 | 11/2007 | |
| WO | WO-2013166317 A2 | 11/2013 | |
| WO | WO-2013166324 A2 | 11/2013 | |
| WO | WO-2015094375 A1 | 6/2015 | |
| WO | WO-2015095826 A1 | 6/2015 | |
| WO | WO-2015142754 A1 | 9/2015 | |
| WO | WO-2015142911 A1 | 9/2015 | |
| WO | WO-2015164264 A1 | 10/2015 | |
| WO | WO-2016054561 A1 | 4/2016 | |
| WO | WO-2017123816 A1 | 7/2017 | |
| WO | WO-2017123817 A1 | 7/2017 | |
| WO | WO-2017123818 A1 | 7/2017 | |
| WO | WO-2018071722 A1 | 4/2018 | |

OTHER PUBLICATIONS

Translation DE102013220107 (Year: 2015).*
U.S. Appl. No. 15/105,941 Office Action dated Sep. 21, 2018.
PCT/US2013/077280 International Preliminary Report on Patentability dated Jun. 30, 2016.
PCT/US2013/077280 International Search Report and Written Opinion dated Oct. 2, 2014.
PCT/US2014/071725 International Preliminary Report on Patentability dated Jun. 30, 2016.
PCT/US2014/071725 International Search Report and Written Opinion dated Apr. 16, 2015.

(56) References Cited

OTHER PUBLICATIONS

PCT/US2015/020805 International Preliminary Report on Patentability dated Sep. 29, 2016.
PCT/US2015/020805 International Search Report and Written Opinion dated Jul. 20, 2015.
PCT/US2015/021051 International Preliminary Report on Patentability dated Sep. 29, 2016.
PCT/US2015/021051 International Search Report and Written Opinion dated Sep. 3, 2015.
PCT/US2015/026679 International Preliminary Report on Patentability dated Nov. 3, 2016.
PCT/US2015/026679 International Search Report and Written Opinion dated Aug. 27, 2015.
PCT/US2017/013262 International Preliminary Report on Patentability dated Jul. 26, 2018.
PCT/US2017/013262 International Search Report and Written Opinion dated May 24, 2017.
PCT/US2017/013262 Invitation to Pay Additional Fees dated Mar. 20, 2017.
PCT/US2017/013264 International Preliminary Report on Patentability dated Jul. 26, 2018.
PCT/US2017/013264 International Search Report and Written Opinion dated May 16, 2017.
PCT/US2017/013266 International Search Report and Written Opinion dated Apr. 3, 2017.
PCT/US2017/056413 International Search Report and Written Opinion dated Jan. 12, 2018.
U.S. Appl. No. 15/126,709 Office Action dated Jul. 11, 2017.
U.S. Appl. No. 15/105,941 Office Action dated Jun. 28, 2019.
U.S. Appl. No. 15/299,984 Office Action dated Aug. 21, 2019.

* cited by examiner

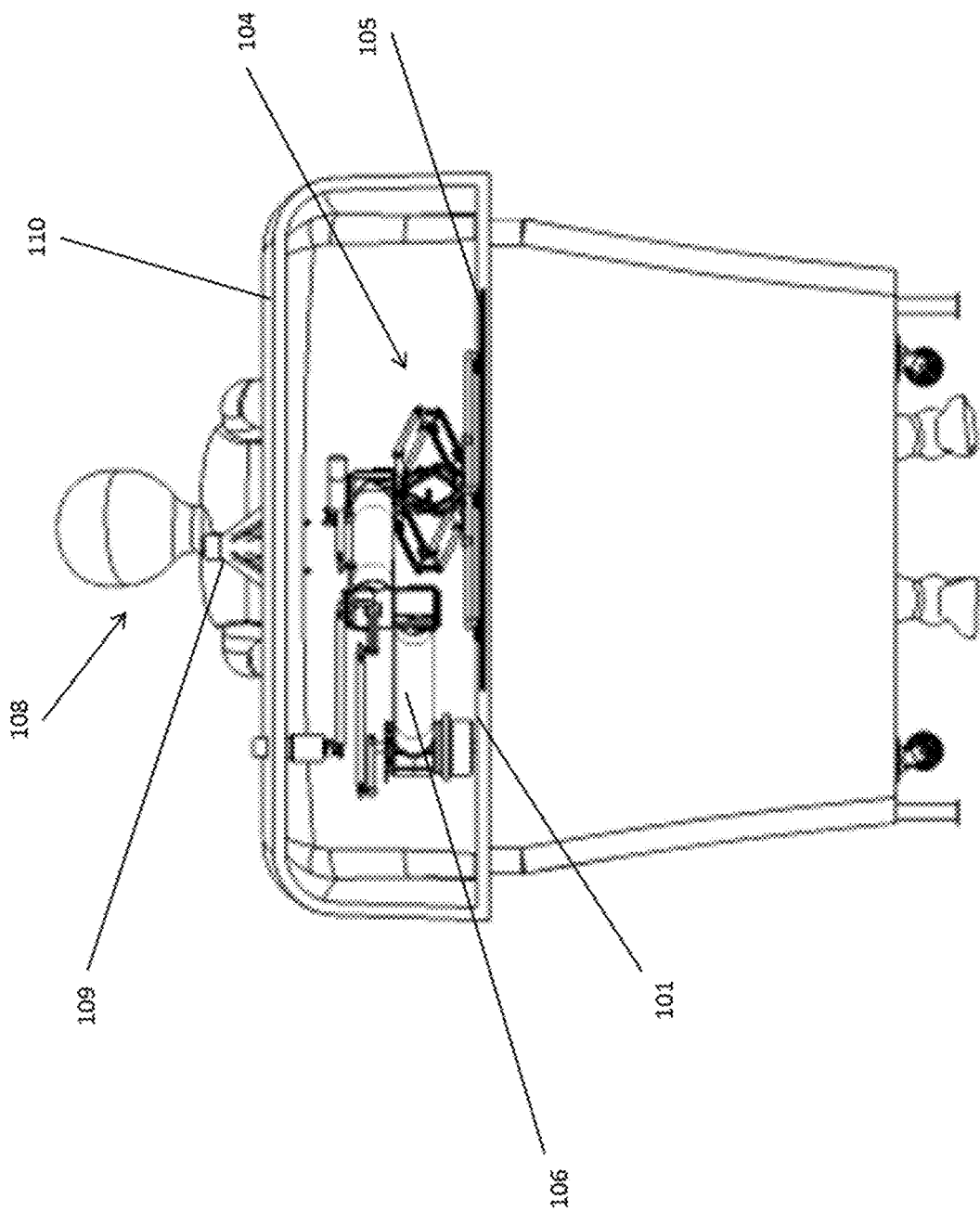

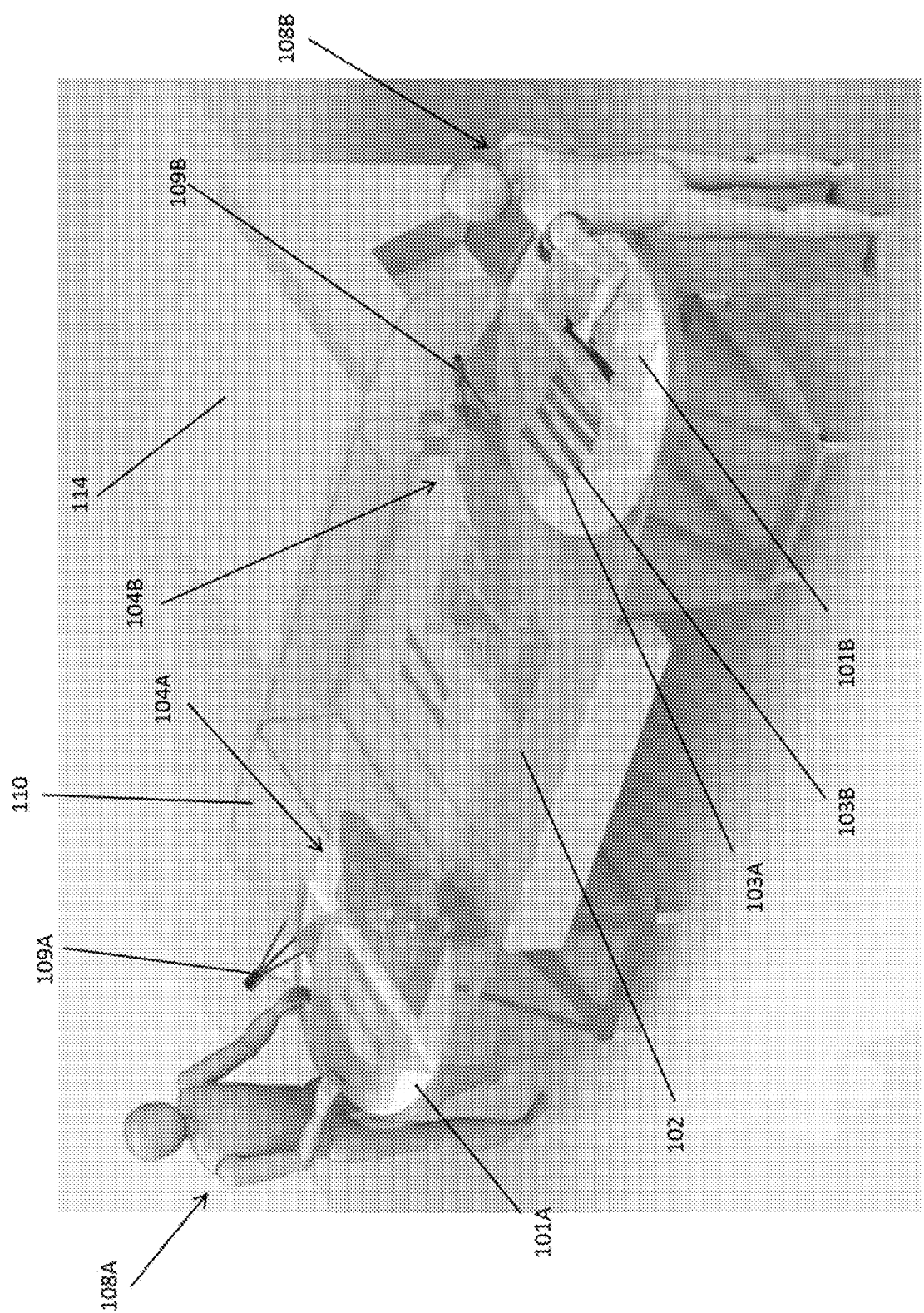

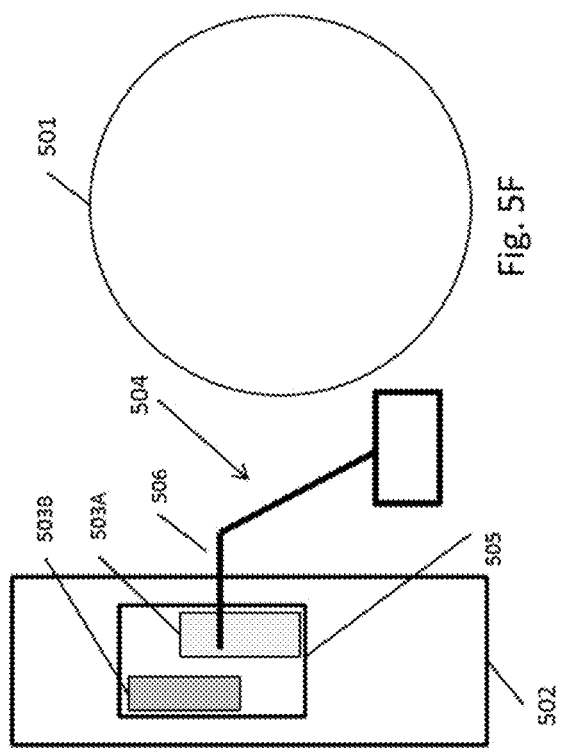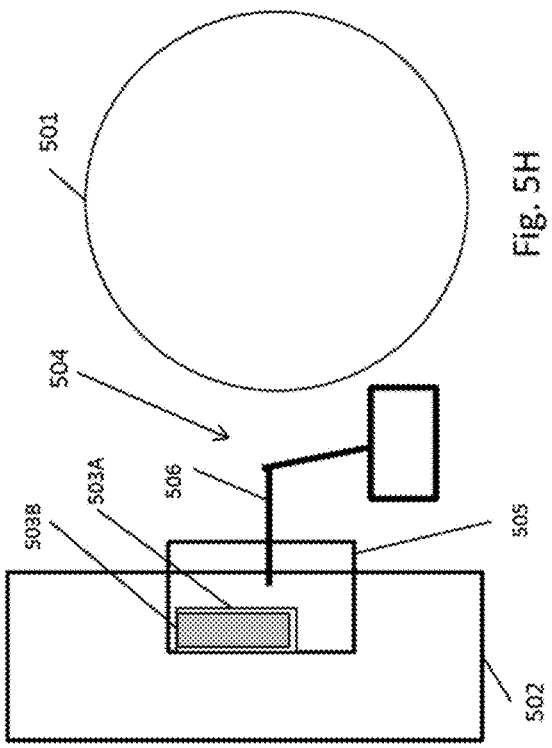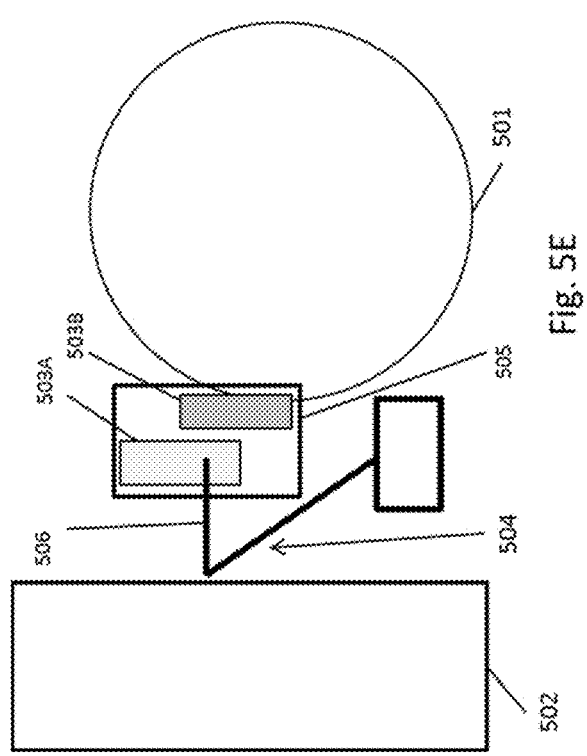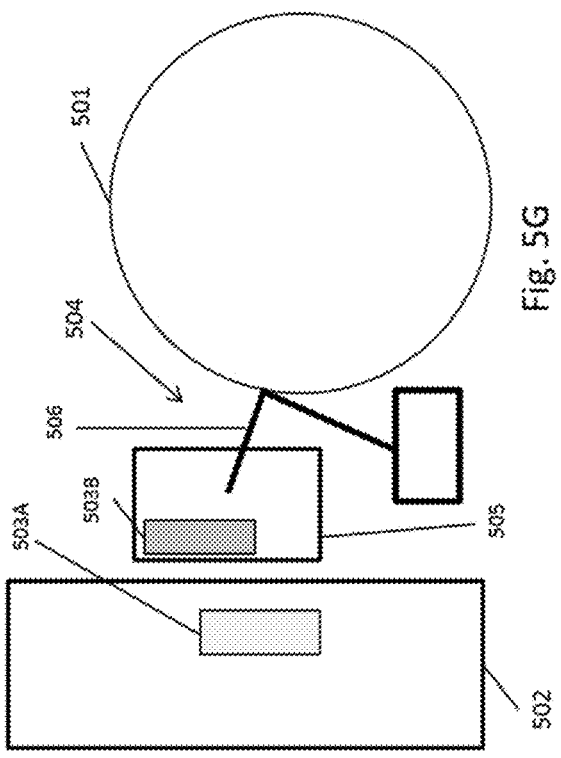

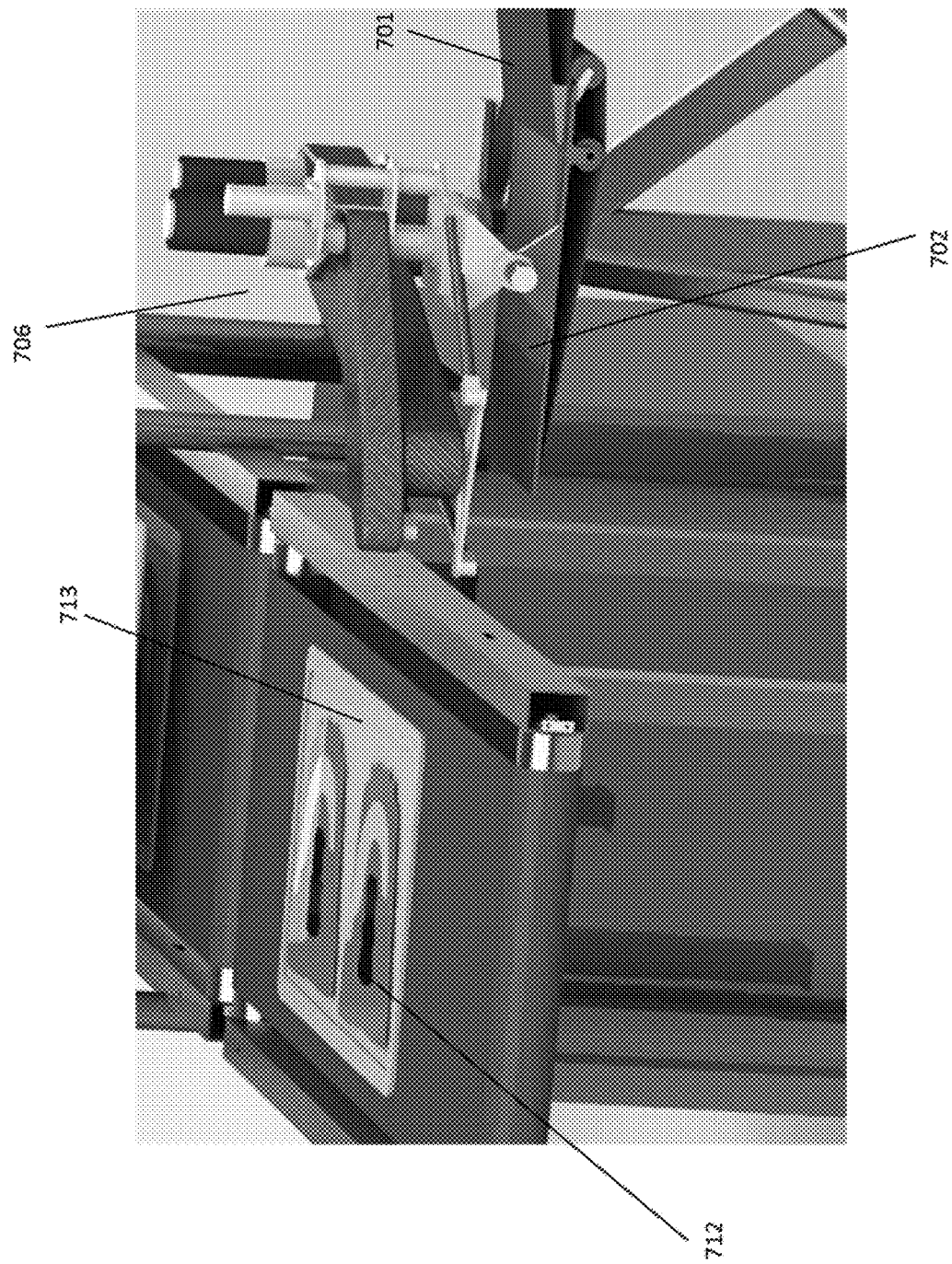

1600

Step 1601: Recognize 1st and 2nd article components
Step 1602: Capture 1st article component with 1st zone and 2nd article component with 2nd zone
       1602A: Activate electroadhesion
Step 1603: Detect capture of 1st article with 1st smart electrode
Step 1604: Detect capture of 2nd article component with 2nd smart electrode
Step 1605: Release 1st article component; retain 2nd article component
       1605A: Extend zone
       1605B: Reverse electrode voltage
Step 1606: Detect release of 1st article component with 1st smart electrode
Step 1607: Detect retention of 2nd article component with 2nd smart electrode
Step 1608: Release 2nd article
Step 1609: Detect release of 2nd article component with 2nd smart electrode
Step 1610: Repeat for multiple article components

Fig. 16

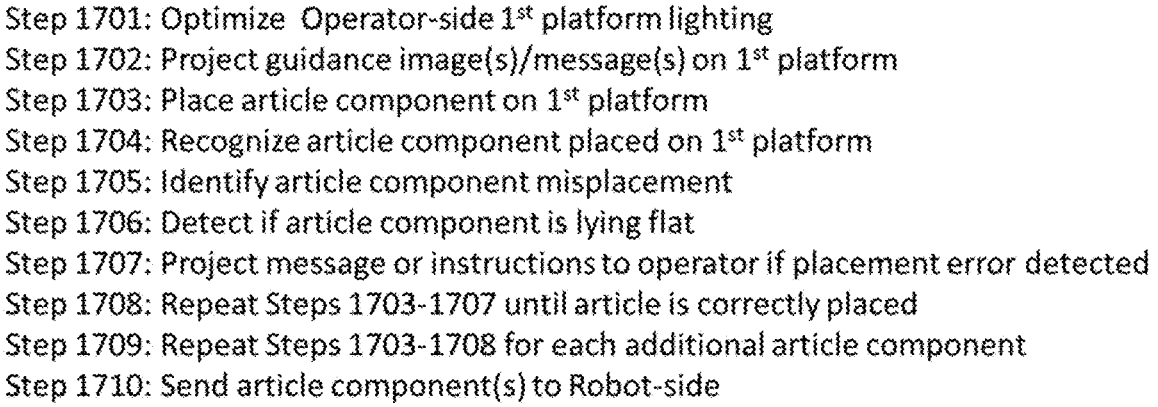

Step 1701: Optimize Operator-side 1st platform lighting
Step 1702: Project guidance image(s)/message(s) on 1st platform
Step 1703: Place article component on 1st platform
Step 1704: Recognize article component placed on 1st platform
Step 1705: Identify article component misplacement
Step 1706: Detect if article component is lying flat
Step 1707: Project message or instructions to operator if placement error detected
Step 1708: Repeat Steps 1703-1707 until article is correctly placed
Step 1709: Repeat Steps 1703-1708 for each additional article component
Step 1710: Send article component(s) to Robot-side

Fig. 17

Step 1801: Receive incoming part information from upstream manufacturing apparatus
Step 1802: Detect presence of 1st article component at 1st platform
Step 1803: Detect presence of 2nd article component at 1st platform
    1803A: Detect presence of all article components
    1803B: Index 1st platform from operator-side to robot-side
Step 1804: Recognize 1st article component on 1st platform
Step 1805: Place capture element over 1st article component
    1805A: Move robot arm
    1805B: Align capture element to 1st pre-determined capture location
Step 1806: Capture 1st article component with 1st zone
    1806A: Activate electroadhesion
Step 1807: Recognize 2nd article component on 1st platform
Step 1808: Place capture element over 2nd article component
    1808A: Move robot arm
    1808B: Align capture element to 2nd pre-determined capture location
Step 1809: Capture 2nd article component with 2nd zone
    1809A: Activate electroadhesion
Step 1810: Move article components over 2nd platform
    1810A: Move robot arm
    1810B: Recognize 1st pre-determined location
    1810C: Align capture element to 1st pre-determined location
Step 1811: Release 1st article component; retain 2nd article component
    1811A: Extend zone
    1811B: Reverse electrode voltage
Step 1812: Release 2nd article component
Step 1813: Repeat for multiple article components
Step 1814: Generate metrics
    1814A: Manufacturing production rates
    1814B: Incoming part acceptance
    1814C: Part capture accuracy
    1814D: Part placement accuracy
Step 1815: Send metrics to remote computing device ("Host")
Step 1816: Send outgoing part information to downstream manufacturing apparatus

Step 1901: Receive article component on 1ˢᵗ platform
Step 1902: Identify article component
Step 1903: Determine position of article component
Step 1904: Communicate identity and position of article component to 2ⁿᵈ platform
Step 1905: Reposition 2ⁿᵈ platform
Step 1906: Convey article component to 2ⁿᵈ platform
Step 1907: Receive article component on 2ⁿᵈ platform
Step 1908: Repeat Steps 1901-1907 for additional article components
Step 1909: Feed article components to further manufacturing apparatus

Fig. 19

METHODS AND SYSTEMS FOR ELECTROADHESION-BASED MANIPULATION IN MANUFACTURING

CROSS-REFERENCE

This application is a continuation of International Application No. PCT/US2017/013262, filed on Jan. 12, 2017, entitled "METHODS AND SYSTEMS FOR ELECTROADHESION-BASED MANIPULATION IN MANUFACTURING", which claims the benefit of U.S. Provisional Application No. 62/277,756, filed Jan. 12, 2016, entitled "Methods and Systems for Electroadhesion-Based Manipulation in Manufacturing", the entire contents of which are herein incorporated by reference.

BACKGROUND OF THE INVENTION

The mass production of products has led to many innovations over the years. Substantial developments have been made in the industrial handling of various materials and items, particularly in the area of robotics. For example, various types of robotics and other automated systems are now used in order to "pick and place" items during many manufacturing and other materials handling processes. Such robotics and other systems can include robot arms that, for example, grip, lift and/or place an item as part of a designated process. Of course, other manipulations and materials handling techniques can also be accomplished by way of such robotics or other automated systems.

SUMMARY OF THE INVENTION

Despite many advances over the years in this field, there are limitations as to what can be handled in such a robotic or automated manner.

Conventional robotic grippers typically use either suction or a combination of large normal and shear forces and fine control with mechanical actuation in order to grip objects. Such techniques have several drawbacks. For example, the use of suction tends to require smooth, clean, dry, non-porous, and generally flat surfaces, which limits the types and conditions of objects that are gripped. Suction also tends to require a lot of power for the pumps and is prone to leaks at any location on a vacuum or low pressure seal, with a resulting loss of suction being potentially catastrophic. The use of mechanical actuation often requires large normal or "crushing" forces against an object, and also tends to limit the ability to robotically grip flexible, deformable, fragile, or delicate objects. Producing large forces also increases the cost of mechanical actuation. Mechanical pumps and conventional mechanical actuation with large crushing forces also often require substantial weight, which is a major disadvantage for some applications, such as the end of a robot arm where added mass must be supported. Furthermore, even when used with sturdy objects, robotic arms, mechanical claws and the like can still leave damaging marks on the surface of the object itself Alternative techniques for handling items and materials also have drawbacks. For example, chemical adhesives can leave residues and tend to attract dust and other debris that reduce effectiveness. Chemical adhesives can also require a significant amount of added force to undo or overcome a grip or attachment to an object once such a chemical adhesive grip or attachment is applied, since the gripping interaction and force is typically not reversible in such instances.

Conventional robotic grippers often do not support gripping of more than one object at a time and thus limit the speed with which operations including a plurality of objects are completed. Conventional systems are also often constrained by a requirement that said objects be fed to the robotic gripper with precise orientations by a human operator for proper "pick and place". Furthermore, conventional systems are typically large and require special fencing to protect operators from the hazards of working near high-speed robots.

Although many systems and techniques for handling materials in an automated fashion for the manufacture of an article have generally worked well in the past, there is a desire to provide alternative and improved ways of handling items. In particular, improved automated systems, devices, and techniques are needed to enable the picking and placing or other handling of a plurality of materials including a broad spectrum of flexible and/or porous materials of various shapes and sizes that cannot be handled reliably using conventional vacuum and mechanical methods. Such materials include but are not limited to woven and knit fabric, as used in athletic footwear and apparel manufacturing, carbon fiber sheets, as used in airframe manufacture, and flexible printed circuit boards. The ability to pick up flexible materials without distorting their shape through sagging, wrinkling, or other deformation, and then place them precisely in such a way that preserves their shape is desired so as to enable automation of a variety of subsequent tasks such as welding, fusing, stitching, bonding, printing, or any other task that requires precise placement of flexible materials.

Typically, high throughput systems involve either high speed robots picking and place items one at a time, or parallel operations with multiple robots doing progressive assembly. In either case, there may be drawbacks in terms of the high cost introduced by high-speed robots and rigid framing, and/or the cost introduced by the need for multiple robots and vision systems. It would therefore be desirable to provide improved automated systems in the footwear, apparel, and soft goods industries with the ability to achieve high throughputs without incurring high equipment costs or occupying large space.

Provided herein are systems, apparatus, and methods of manufacturing an article using electroadhesion technology for the acquisition and release of materials. The systems apparatus, and methods described herein may provide for better material handling for a wide variety of object shapes, sizes and materials. The electroadhesion technology provided herein may be combined with vacuum technology to enable higher performance across more materials. Alternatively or in combination, the electroadhesion technology may be combined with mechanical release to enable accurate placement of objects, including tacky or sticky objects, or objects prone to static electricity based "clinging". In some cases, the electroadhesion technology may be combined with both vacuum and mechanical eject to offer a full breadth of both broad-spectrum picking and accurate placement.

Provided herein are electroadhesion manufacturing systems. An exemplary electroadhesion system comprises a first platform configured to guide the placement of a first article component and a second article component thereon, a second platform having a predetermined location for the first article component and a second predetermined location for the second article component, an electroadhesive capture element configured to capture the first and second article components placed on the first platform, and a robotic actuator coupled to the capture element to move the capture element to capture the first and second article components and to move the capture element to reposition the captured first and second article components over the first and second predetermined locations on the second platform, respectively. The capture element releases the first and second article components onto the first and second predetermined locations, respectively. The capture and/or release of the first and second article may be simultaneous or sequential. The first and second article components placed on the second platform are typically assembled into the article. In many embodiments, at least a portion of the first platform is moveable to reposition the first and second article components from a position closer to the operator to a position closer to the capture element from an initial position closer to a user so that the user can place the first and second article components thereon. In many embodiments the first platform is rotatable, for example a turntable. In some embodiments, the first platform comprises a conveyor. The first platform optionally comprises a first portion configured to guide the placement of an initial set of first and second article components thereon by a user and a second portion configured to guide the placement of a subsequent set of first and second article components thereon by the user. In some embodiments, after the initial set of first and second article components is placed on the first portion, the first platform is moved to position the first portion closer to the capture element. In some embodiments, after the initial set of first and second article components is placed on the first portion, the first platform is moved to position the first portion closer to the capture element while the second portion is positioned closer to the user. The first platform in some embodiments is rotatable to alternatingly position the first or second portion closer to the capture element while the opposite portion is closer to the user. The electroadhesion manufacturing system optionally further comprises an automated visualization system to recognize one or more of the first and second article components on the first platform. In many embodiments, the first platform optionally further comprises at least a portion that is visually transparent, visually translucent, or visually opaque to facilitate one or more of recognition, lighting, and location of the one or more of the first and second article components with the automated visualization system. One or more of the first and second article components optionally comprises a visual pattern to aid in recognition thereof. The automated visualization system is optionally configured to determine one or more of the first and second predetermined locations on the second platform to facilitate release of one or more of the first and second article components precisely onto the first and second predetermined locations, respectively. In some embodiments, one or more of the first and second predetermined locations comprises a visual pattern to aid in aligning of the one or more first and second article component with the first or second predetermined location on the second platform, respectively. In many embodiments, placement accuracy of one or more of the released first and second article components is checked and recorded in relation to a critical-to-quality tolerance. The automated visualization system for example facilitates one or more of recognition and location of the one or more of the first and second article components using one or more of superimposed top or back lighting and display to aid in automated recognition or manually-guided placement of article components. The electroadhesion manufacturing system optionally further comprises one or more image projectors adapted to project one or more guiding images onto the first platform to guide operator placement of the first and second article components. In many embodiments, the first platform optionally further comprises at least a portion that is visually transparent, visually translucent, or visually opaque to facilitate the projection of the one or more guiding images therethrough. The electroadhesion manufacturing system optionally further comprises an automated visualization system configured to use one or more images of the first and second article components on the first platform to determine one or more of the first and second predetermined locations on the second platform to facilitate precise release of the one or more of the first and second article components onto the first and second predetermined locations, respectively, or to verify or transmit one or more of the relative placement location and accuracy of article component placement after the components have been released to the predetermined locations. In many embodiments, the capture element comprises an electroadhesive surface. The electroadhesive surface in some embodiments comprises one or more electroadhesive plates. The electroadhesive surface alternatively or in combination comprises a first zone for capturing the first article component and a second zone for capturing the second article component. In many embodiments, the first and second zones of the electroadhesive surface are optionally separately activated to selectively capture or release one or more of the first and second article components. In some embodiments, one or more of the first and second zones of the electroadhesive surface is configured to detect a presence of one or more of the first and second article components on the first platform, respectively. For example, the presence of one or more of the first and second article components on the first platform is optionally detected by measuring at the first platform one or more of electrode current, voltage, electrode admittance, and electrode impedance and recognizing a signal pattern in one or more of a AC and DC signal components of the measurement. In some embodiments, multiple article components are captured by a single zone, whereby the multiple article components are fixed using a machined plate or other lighting template accompanied with precise manual positioning for locating the relative locations of the parts such that the zone captures only the article components but not the machined plate or underlying base carrier. In an example, pockets are laser machined into an acrylic plate, with the pockets positioned and oriented on the plate so that when the parts or article components are loaded into the pockets, the parts or article components are precisely positioned and oriented with respect to one another. This "layer" of parts is then located by a vision system in the aggregate and placed approximately onto the stack. In this example, the handling of the material is made more effective, particularly where the layers employ many small pieces. In many embodiments, the capture element comprises a first zone for capturing the first article component and a second zone for capturing the second article component. The first and second zones are optionally separately mechanically actuated to selectively capture or release one or more of the first and second article components. Alternatively or in combination, the capture element includes a means for temporarily or permanently joining the article components to one another, for example by using an ultrasonic welding tool. The ultrasonic welding tool is comprised of an ultrasonic stack composed of a converter or piezoelectric transducer, an optional booster and a Sonotrode (US: Horn), a converter that converts an electrical signal into mechanical vibration, a booster that modifies the amplitude of the vibration, a Sonotrode that applies the mechanical vibration to the parts to be welded, an electronic ultrasonic generator (US: Power supply) delivering a high power AC signal with a frequency matching the resonance frequency of the stack, and a controller controlling the movement of the press and the delivery of the ultrasonic energy. In some embodiments, the ultrasonic welding tool is coupled to a mechanical release mechanism such that the welding is accomplished without needing to move the capture element surface to a new location. Alternately or in combination, the capture element optionally includes a tool to initiate another method of attachment of the first article component to the second article component. Such tools for example include one or more of heater elements, UltraViolet (UV) lighting, Infrared (IR) heaters, hot plates, and other such tools. In many embodiments, the robotic actuator is configured to position the capture element to sequentially capture the first and second article components on the first platform. In many embodiments, sequentially capturing the first and second article components on the first platform comprises the steps of positioning the robotic actuator so that the first article component is aligned with a first predetermined capture location on the first platform, capturing the first article component on the first predetermined capture location, repositioning the robotic actuator or the first platform so that the second article component is aligned with a second predetermined capture location on the first platform, and capturing the second article component on the second predetermined capture location. Alternatively or in combination, the robotic actuator is configured to position the capture element to simultaneously capture the first and second article components on the first platform. For instance, the robotic actuator is configured to move the capture element to sequentially position the captured first and second article components over the first and second predetermined locations on the second platform, respectively. In some embodiments, the robotic actuator is configured to move the capture element to simultaneously position the captured first and second article components over the first and second predetermined locations on the second platform, respectively. In some embodiments, the second article component is placed directly above the first article component so as to create a stack. In some embodiments, the second platform is moved relative to the capture element such that the captured article components are released at the predetermined locations on the second platform. The robotic actuator is configured to move the capture element to simultaneously position the captured first and second article components over the first and second predetermined locations on the second platform, respectively. In many embodiments the robotic actuator comprises one or more of a robotic arm, gantry, linear actuator, and other movement mechanism. In many embodiments, the second platform comprises a conveyor or conveyor belt. One or more of the first and second article components comprises a textile piece, a shoe part, an automotive part, a machinery part, or a circuitry part. The article comprises, respectively, at least a portion of an article of clothing, at least a portion of a shoe, at least a portion of a machine, or at least a portion of a circuit. In some embodiments, one or more of the first and second article components includes a rigid machined template plate one or more of holes, slots, or the combination thereof cut out to accommodate a sewing needle in a semi-automated sewing machine. Alternatively or in combination, one or more of the first or second platforms comprises an electroadhesive surface to maintain placement of the one or more of the first and second article components. In many embodiments, the electroadhesion manufacturing system further comprises a controller coupled to one or more of the first platform, the second platform, the capture element, and the robotic actuator. In many embodiments, the controller is configured to generate one or more manufacturing metrics based on one or more of capturing the first and second articles, moving the captured first and second articles, releasing the captured first and second articles, and acquiring one or more images of the first and second article components on the second platform. The manufacturing metric for example optionally comprises one or more of manufacturing production rate, incoming part acceptance, part capture accuracy, and part placement accuracy. In many embodiments, the controller is configured to transmit the one or more manufacturing metrics to a remote computing device, the remote computing device generating one or more manufacturing insights based on the one or more manufacturing metrics. In some embodiments, said manufacturing metrics are sent to a production control system or streamed via a communications link that is part of the manufacturing system. In some embodiments, the raw images of the parts are sent external to the manufacturing system, such that the production metrics are computed elsewhere. In other embodiments, the manufacturing metrics are computed locally using the assembly images or other methods, and then the aggregate post-processed data is communicated to the external source. Alternatively or in combination, the controller is configured to receive incoming part information for the first and second article components from an upstream manufacturing apparatus and cause the first and second article components to be captured based on the received incoming part information. Alternatively or in combination, the controller is configured to generate outgoing part information for the first and second article components and cause the outgoing part information to be transmitted to a downstream manufacturing apparatus. In some embodiments, the outgoing part information comprises at least one of Computer-aided Design (CAD) and Computer-aided Manufacturing (CAM) data defining at least one of the shape of the components, the visual pattern embodied within the component, and critical-to-quality metrics relating to the placement of the article components. In some embodiments, the system communicates with other machines within the same ecosystem, for example to jointly perform a task and/or to receive or transmit information. For example, in some embodiments the system receives information from an upstream manufacturing apparatus, for example a cutting table. In some embodiments, the system passes on several parameters to a downstream manufacturing apparatus, for example a sewing machine, hot or cold press or fusing machine. In such cases, the information passed on for example optionally includes the outline of one or more parts placed relative to other parts placed, the location of the placement and/or orientation of the assembled article, the sewing paths required, RFID or other means of identifying the article, the lot number printed on the material, or any other information useful for the operation either co-operatively or in a standalone format for the successive machines in the overall manufacturing operation. In many embodiments, more than two article components are captured and released. For example, the number of article components may be four, six, eight, or ten. In some embodiments, the capture element is configured to individually activate regions therein such that sequential capture or sequential release is accomplished.

Provided herein are methods of manufacturing an article. An exemplary method comprises the steps of capturing a first article component placed on a first platform via electroadhesion, capturing a second article component placed on the first platform via electroadhesion, moving the captured first and second article components to a position over a second platform, releasing the captured first article component to place the first article component on a first predetermined location of the second platform, and releasing the captured second article component to place the second article component on a second predetermined location of the second platform. The first and second article components placed on the second platform are assembled into at least a portion of the article. In many embodiments, one or more of the steps of capturing the first article component and capturing the second article component comprises a step of recognizing one or more of the first and second article components with an automated visualization system. In some embodiments, the automated visualization system comprises an imaging source positioned at a fixed location relative to the first platform. In many embodiments, one or more of the first and second article components comprises a visual pattern to aid in recognition of the one or more of the first and second article component. For example, in some embodiments an image containing both the first and second article components is taken and the image is analyzed to recognize the article components and determine their positions. In some embodiments, multiple images, each containing the article components, are taken and analyzed. In many embodiments, at least a portion of the first platform is visually at least one of transparent and translucent to facilitate recognition of the one or more of the first or second article components with the automated visualization system. In some embodiments, the at least a portion of the first platform is illuminated from below to create a silhouette image of the first and second article components for processing by the automated visualization system. The step or capturing the one or more of the first and second article components with electroadhesion optionally further comprises a step of placing an electroadhesive surface over the one or more of the first and second article components and activating the electroadhesive surface. In many embodiments, the electroadhesive surface comprises a first zone for capturing the first article component and a second zone for capturing the second article component. Any one or more of the first and second zones of the electroadhesive surface for example is optionally separately activated to capture or release one or more of the first or second article components. In many embodiments, the first and second zones are concurrently activated. In many embodiments, the first and second zones are sequentially activated. One or more of the step of releasing the captured first article component and releasing the second article component comprises a step of selectively releasing one or more of the first and second article components from the electroadhesion. In many embodiments, one or more of the step of releasing the captured first article component and releasing the second article component comprises a step of one or more of electrode voltage reversal and extension of one or more zones of the electroadhesive surface for mechanized release. One or more of the steps of capturing the first article component and capturing the second article component comprises a step of detecting a presence of one or more of the first and second article components on the capture element. The step of detecting the presence of one or more of the first and second article components on the first platform for example optionally comprises a step of measuring at the first platform one or more of electrode current, voltage, electrode admittance, and electrode impedance and recognizing a signal pattern in one or more of a AC and DC signal component of the measurement. One or more of releasing the captured first article component and releasing the second article component comprises aligning one or more of the first and second article component with the first or second predetermined location, respectively, with the aid of an automated visualization system. In some embodiments, the automated visualization system comprises an imaging source positioned at a fixed location relative to the electroadhesive capture element. In some embodiments, one or more of the first and second predetermined locations comprises a visual pattern to aid in aligning of the one or more first and second article component with the first or second predetermined location, respectively. The method optionally comprises the step of checking and recording placement accuracy of one or more of the released first and second article components in relation to a critical-to-quality tolerance with the automated visualization system. One or more of the steps of releasing the captured first article component and releasing the second article component comprises a step of one or more of reversing an electrode voltage in at least a portion of the capture element. In some embodiments, one or more of the steps of capturing the first article component and capturing the second article components comprises a step of moving a robotic actuator to position the capture element. Moving the captured first and second article components for example optionally comprises moving the robotic actuator from over the first platform to over the second platform or moving the second platform to position it relative to the first and second article components. The robotic actuator is optionally moved to capture the first and second article components before moving over to the second platform. In many embodiments, one or more of the steps of releasing the captured first article component to place the first article component on the first predetermined location of the second platform and releasing the captured second article component to place the second article component on a second predetermined location of the second platform comprises a step of positioning the robotic actuator so that one or more of the first article component and the second article component is precisely placed over the first or second predetermined location, respectively. The method of manufacturing an article optionally further comprises a step of precisely repositioning the robotic actuator so that the second article component is precisely placed over the second predetermined location after the first article component has been released. In some embodiments, the step of positioning the robotic actuator comprises a step of recognizing one or more of the first and second predetermined locations with an automated visualization system. For example, in some embodiments an image of the second platform is taken and the image is analyzed to recognize one or more of the first and second predetermined locations. In some embodiments, the image of the second platform includes all or part of the first article after it has been released onto the first predetermined location. In some embodiments, multiple images are taken and analyzed, for example prior to and after release of the first article component at the first predetermined location. In some embodiments, the method further comprises determining one or more of the first and second predetermined locations based on input from one or more of a user interface, the automated visualization system, or a pre-programmed recipe or protocol. In some embodiments, the pre-programmed recipe or protocol minimizes contact between one or more of the first and second article components with one or more of an edge of the first zone and an edge of the second zone. In some embodiments, the pre-programmed recipe or protocol minimizes the number of zones required to capture one or more of the first article component or the second article component. In some embodiments, the pre-programmed recipe or protocol minimizes position re-adjustment of the capture element before release of one or more of the first article component and the second article component. In some embodiments, the pre-programmed recipe or protocol maximizes the density of at least the first and second article components with captured. In many embodiments, the step of capturing the first article component comprises a step of positioning the robotic actuator so that the first article component is aligned with a first predetermined capture location on the first platform and capturing the first article component on the first predetermined capture location. Alternatively or in combination, the step of capturing the second article component comprises a step of repositioning the robotic actuator so that the second article component is aligned with a second predetermined capture location on the first platform and capturing the second article component on the second predetermined capture location. In many embodiments, the robotic actuator comprises a robotic arm. In some embodiments, one or more of the captured first and second article component is released concurrently with an activation of an ultrasonic tack weld of the second article component onto the first article component. The method optionally further comprises pressing the second article component onto a cavity in the first article component after the first and second article components are released, wherein a finger on the capture element presses the second article into the cavity. In some embodiments, the first article component comprises a custom fixture part. In many embodiments, the method of manufacturing an article optionally further comprises steps of capturing at least a third article component placed on the first platform, moving the captured at least the third article component to the position over the second platform, and releasing the captured at least the third article component on at least a third predetermined location of the second platform. The first, second, and at least the third article components placed on the second platform for example is assembled into the article. In many embodiments, one or more of the first and second article components comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit. The method of manufacturing an article optionally further comprises the steps of generating one or more manufacturing metrics based on one or more of capturing the first and second articles, moving the captured first and second articles, releasing the captured first and second articles, or imaging the first and/or second article components at the second platform. The manufacturing metric for example optionally comprises one or more of manufacturing production rate, incoming part acceptance, part capture accuracy, part color checking, part printed pattern checking, part placement accuracy, and images of each article component before and after release relative to the second article component. In many embodiments, the method optionally further comprises steps of transmitting the one or more manufacturing metrics or images to a remote computing device, the remote computing device generating one or more manufacturing insights based on the one or more manufacturing metrics or images. The method optionally further comprises the step of receiving incoming part information for the first and second article components from an upstream manufacturing apparatus. The first and second article components are optionally captured based on the received incoming part information. The method optionally further comprises generating outgoing part information for the released first and second articles on the second platform. In many embodiments the method optionally further comprises a step of transmitting the outgoing part information to a downstream manufacturing apparatus.

Provided herein is an electroadhesive apparatus. An exemplary electroadhesive apparatus comprises an electroadhesive plate having a contact surface for capturing one or more target objects with electroadhesion, the electroadhesive plate comprises a plurality of electroadhesive zones, and a controller configured to individually activate or deactivate electroadhesion in each of the electroadhesive zones. Electroadhesion in each electroadhesive zone is separately activated. In some embodiments, the electroadhesive zones are coplanar. In some embodiments, the electroadhesive zones are not coplanar but instead are arranged in the approximate form of a curved surface or in a disjoint set of planes. In some embodiments, the electroadhesive surface is coupled to an actuator or a passive linear movement mechanism such that the surfaces are sometimes coplanar and other times on parallel but separate planes. In some embodiments, two or more of the electroadhesive zones are coplanar. In some embodiments, two or more of the electroadhesive zones are non-planar. In some embodiments, one or more of the electroadhesive zones is compressible. The controller is optionally configured to individually activate, modulate the magnitude of, and/or deactivate electroadhesion in each of the electroadhesive zones. In some embodiments, the same or a different controller is configured to individually activate, modulate the magnitude of, deactivate or move an ultrasound welding horn or other heating element coupled to each of the electroadhesive zones. For example, the ultrasound welding horn or other heating element is coupled to each of the electroadhesion zones such that they operate on the part or article component captured and in contact with the respective electroadhesive zone. In some embodiments, the electroadhesive apparatus includes a near-focused high-resolution image-capturing system such as a camera to verify placement accuracy after the placement of the parts. The image-capturing system, for example, captures a single image containing all of the parts and determines the positions of the parts to verify placement accuracy. The single image for example is optionally created by "stitching" together two or more images taken by one or more cameras. In many embodiments, the controller is coupled to each of the electroadhesive zones to individually activate electroadhesion in each of the electroadhesive zones. In some embodiments, activation is accomplished via wireless communication between the controller and the zone control electronics. In some embodiments, the power supply connection between the controller and the zone employs a wireless power transfer device. In many embodiments, the controller is configured to detect capture of the one or more target objects in one or more of the electroadhesive zones. The controller for example is configured to detect capture of the one or more target objects in the one or more of the electroadhesive zones by measuring at the one or more of the electroadhesive zones one or more of electrode current, voltage, electrode admittance, pressure change, and electrode impedance and recognizing a signal pattern in one or more of a AC and DC signal component of the measurement. In some embodiments, one or more of the electroadhesive zones is configured to be extended forward from a retracted position to separate the extended electroadhesive zone from a remainder of one or more retracted electroadhesive zones.

Provided herein are methods of capturing and releasing a plurality of target objects. An exemplary method comprises the steps of capturing a first target object with a first electroadhesive zone of an electroadhesive plate, capturing a second target object with a second electroadhesive zone of the electroadhesive plate, the first and second electroadhesive plates being in separate positions, releasing the first target object from the first electroadhesive zone while the second target object remains captured by the second electroadhesive zone, and releasing the second target object from the second electroadhesive zone. In many embodiments, the step of capturing one or more of the first and second target objects comprises a step of detecting capture of the one or more of the first and second target objects. The step of detecting capture for example optionally comprises a step of (i) measuring at the one or more of the electroadhesive zones one or more of electrode current, voltage, electrode admittance, and electrode impedance, and (ii) recognizing a signal pattern in one or more of a AC and DC signal component of the measurement. In some embodiments, the step of releasing the first target object from the first electroadhesive zone comprises a step of extending forward the first electroadhesive zone from a retracted position while the second electroadhesive zone remains retracted. Alternatively or in combination, the step of releasing the second target object from the second electroadhesive zone comprises a step of extending the second electroadhesive zone from a retracted position while the first electroadhesive zone remains retracted.

Provided herein are systems for facilitating the manufacture of an article. An exemplary system comprises a platform for placement of at least one article component thereon and an image projector adapted to project at least one guiding image onto the platform to guide manual placement of the at least one article component thereon. The at least one article component is assembled into at least a portion of a complete article. In many embodiments, the system optionally further comprises an imaging system configured to recognize the at least one article component placed onto the platform. The imaging system for example optionally comprises one or more overhead camera positioned above the platform. In many embodiments, the system for facilitating the manufacture of an article optionally further comprises a controller coupled to the imaging system to identify misplacement of the at least one article component on the platform. In many embodiments, one or more camera signals are combined to create a single image of the one or more article components on the first platform. For example, in some embodiments, one or more camera signals are combined to create a single image of at least two article components on the first platform. In many embodiments, the image projector is adapted to project a structured light onto the at least one article component placed on the platform. In many embodiments, the imaging system is configured to detect whether the at least one article component is placed flat on the platform based on the structured light projected on the at least one article component. Alternatively or in combination, the image projector is further configured to project one or more messages or instructions for the user on the platform. In many embodiments, at least a portion of the platform is visually transparent to facilitate the projection of the at least one guiding image. In many embodiments, the platform is movable. In many embodiments, the system optionally further comprises a controller in operative communication with the platform and image projector. In many embodiments, the image projector is configured to project a plurality of guiding images. In many embodiments, the image projector is configured to project two or more of the guiding images selectively. The image projector for example is configured to project two or more of the guiding images selectively to optimize lighting on the platform. In many embodiments, the at least one article component comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit. In some embodiments, one or more of the first and second article components includes a rigid machined template plate with one or more holes, slots, or the combination thereof cut out to accommodate a sewing needle in a semi-automated sewing machine.

Provided herein are electroadhesion manufacturing systems. An exemplary electroadhesion manufacturing system comprises a first platform configured to receive an article component, a second platform configured to receive the article component from the first platform, an imaging system configured to identify the article component received on the platform and determine a position of the article received on the first platform, and a controller configured to reposition the second platform in response to one or more of the identified article component or the determined position thereof prior to receiving the article component from the first platform. In many embodiments, the second platform is configured to one or more of translate along a first horizontal axis, translate along a second horizontal axis orthogonal to the first horizontal axis, translate along a vertical axis orthogonal to the first and second horizontal axes, rotate about the vertical axis, and tilt about the vertical axis. In many embodiments, the imaging system comprises an overhead camera positioned overhead one or more of the first and second platforms. In many embodiments, the electroadhesion manufacturing system optionally further comprises a robotic actuator coupled to the second platform to move the second platform, the controller being in operative communication with the robotic actuator. The robotic actuator for example optionally comprises a robotic arm. In many embodiments, the first platform is configured to convey the received article component onto the repositioned second platform. In many embodiments, the receiving of the article component by the first platform from the first platform is facilitated by gravity. In many embodiments, one or more of the first and second platforms constitute a conveyer belt. In some embodiments, the conveyer belt is controllable to either advance or retract the article component. The article component for example optionally comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit. In some embodiments, one or more of the first and second article components includes a rigid machined template plate with one or more holes, slots, or the combination thereof cut out to accommodate a sewing needle in a semi-automated sewing machine.

Provided herein are methods of manufacturing an article. An exemplary method comprises the steps of receiving an article component on a first platform, identifying the article component received on the first platform, determining a position of the article component received on the first platform, repositioning a second platform in response to one or more of the identified article component and the determined position thereof, and receiving the article component on the second platform from the first platform. In many embodiments, a plurality of article components received by the second platform is assembled into at least a portion of the article. In many embodiments, the method optionally further comprises repeating steps to generate a stack of article components. In many embodiments, the method of manufacturing an article optionally further comprises a step of feeding the stack of article components onto a further manufacturing apparatus. In many embodiments, the step of repositioning the second platform comprises one or more of the steps of moving the second platform along a first horizontal axis, moving the second platform along a second horizontal axis orthogonal to the first horizontal axis, moving the second platform along a vertical axis orthogonal to the first and second horizontal axes, rotating the second platform about the vertical axis, and tilting the second platform. In many embodiments, one or more of the steps of identifying the article component received on the first platform and determining the position of the article component received on the first platform is performed using an imaging system in operative communication with the second platform. The imaging system for example optionally comprises a camera positioned overhead one or more of the first and second platforms. In many embodiments, the step of repositioning the second platform in response to one or more of the identified article component and the determined position thereof comprises a step of moving a robotic actuator coupled to the second platform. The robotic actuator for example optionally comprises a robotic arm. In many embodiments, the step of receiving the article component on the second platform from the first platform comprises a step of conveying the article component from the first platform onto the repositioned second platform. The article component for example optionally comprises a textile piece, a shoe part, an automotive part, a machinery part, or a circuitry part. The article comprises, respectively, at least a portion of an article of clothing, at least a portion of a shoe, at least a portion of a machine, or at least a portion of a circuit. In some embodiments, one or more of the first and second article components includes a rigid machined template plate with one or more holes, slots, or the combination thereof cut out to accommodate a sewing needle in an semi-automated sewing machine.

Provided herein are methods of manufacturing an article in an automated manner. An exemplary method comprises positioning a first article component at a first manufacturing station, retrieving a second article component from a second manufacturing station, using an electroadhesive article-manufacturing apparatus to transfer the second article component onto the first article component by transferring the second article component from its second orientation to a third orientation relative to the first article component, which is determined based on the first orientation and the first identity of the first article component, and using the electroadhesive article-manufacturing apparatus, which transferred the second article component, to temporarily attach the second article component to the first article component to maintain positioning for downstream processing. An article component recognition system determines a first identity of the first article component and determines a first orientation and first location of the first article component. The article component recognition system determines a second identity of the second article component and determines a second orientation of the second article component. Using the electroadhesive article-manufacturing apparatus to transfer the second article component onto the first article component comprises electroadhesively capturing and releasing the second article component. The article component optionally comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit.

Provided herein are systems for manufacturing an article in an automated manner. An exemplary manufacturing system comprises a first manufacturing station at which a first article component is positioned, a second manufacturing station at which a second article component is positioned, an article component recognition system that uses a processor, which communicates with computer-storage media, to determine a first identity and a first orientation of the first article component and to determine a second identity and a second orientation of the second article component, and an electroadhesive article-manufacturing apparatus that transfers the second article component onto the first article component by transferring the second article component from its second orientation to a third orientation relative to the first article component. The electroadhesive article-recognition system determines the third orientation based on the first identity and the first orientation of the first article component. The electroadhesive article-manufacturing apparatus attaches the second article component onto the first article component. The electroadhesive article-manufacturing apparatus transfers the second article component onto the first article component by electroadhesively capturing and releasing the second article component. The article component optionally comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit.

Provided herein are methods for manufacturing an article in an automated manner. An exemplary method comprises positioning a first article component on a support surface and at a first manufacturing station, using the article component recognition system to determine a second identity of a second article component and a second orientation of the second article component, placing by a first automated part pickup tool the second article component on top of the first article component by transferring the second article component from its second orientation to a third orientation relative to the first article component, using the article component recognition system to determine a third identity and a fourth orientation of the assembly of the first article component and the second article component, using the article component recognition system to determine a fourth identity of a third article component and a fifth orientation of the third article component, moving the assembly of the first article component and the second article component to a second manufacturing station, attaching by a second automated attachment tool the third article component to the assembly of the first article component and the second article component. The first article component is substantially flat on the support surface, and wherein an article component recognition system determines a first identity and a first location of the first article component. Transferring the second article component from its second orientation to a third orientation relative to the first article component comprises electroadhesively capturing and releasing the second article component. A first automated attachment tool attaches the second article component to the first article component, thereby forming an assembly of the first article component and the second article component. A second automated part pickup tool places the third article component on top of the assembly of the first article component and the second article component by transferring the third article component from its fifth orientation to a sixth orientation relative to the assembly of the first article component and the second article component, which is determined based on the third identity and the fourth orientation of the assembly. Transferring the third article component from its fifth orientation to the sixth orientation comprises electroadhesively capturing and releasing the second article component. The article component optionally comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit.

Provided herein are methods for positioning and assembling an article in an automated manner during and article manufacturing process. An exemplary method comprises receiving an image depicting a two-dimensional representation of an attachment article component which is to be attached to a base article component, determining one or more pixel coordinates of the image, converting, by a computer processor, the one or more pixel coordinates of the image to a geometric coordinate of a geometric coordinate system which maps a three-dimensional space within which the attachment article component is positioned and an electroadhesive pick-up tool operates, capturing the attachment article component with the electroadhesive pick-up tool in response to the geometric coordinate, and transferring, by the electroadhesive pick-up tool, the attachment article component to the base article component. In some embodiments, the method further comprises determining another geometric coordinate of the geometric coordinate system by analyzing a different image depicting a two-dimensional representation of the base article component to which the attachment article component will be attached. In some embodiments, transferring the attachment article component comprises transferring, by the electroadhesive pick-up tool, the attachment article component to the other geometric coordinate, thereby moving the attachment article component to a location in the three-dimensional space at which the attachment article component is to be attached to the base article component. The method optionally further comprises analyzing a different image depicting a two-dimensional representation of the base article component attached to the attachment article component to determine placement or attachment accuracy or quality. The attachment article component is optionally transferred in response to the geometric coordinate. One or more of the attachment and base article component optionally comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit.

Provided herein are methods for positioning and joining a plurality of article components utilizing automated identification of the article components and a multi-functional manufacturing tool. An exemplary method comprises receiving an image depicting a two-dimensional representation of an attachment article component which is to be attached to a base article component, determining a geometric coordinate of a geometric coordinate system by analyzing the image, capturing the attachment article component with the electroadhesive pick-up tool in response to the geometric coordinate, transferring, by an electroadhesive gripper of the multi-functional manufacturing tool, the attachment article component to the base article component, and attaching, by the multi-functional manufacturing tool, the attachment article component to the base article component. The geometric coordinate system maps a three-dimensional space within which the attachment article component is positioned and the multi-functional manufacturing tool operates. The method optionally further comprises determining another geometric coordinate of the geometric coordinate system by analyzing a different image depicting a two-dimensional representation of the base article component to which the attachment article component will be attached. Transferring the attachment article component optionally comprises transferring, by an electroadhesive gripper of the multi-functional manufacturing tool, the attachment article component to the other geometric coordinate, thereby moving the attachment article component to a location in the three-dimensional space at which the attachment article component is to be attached to the base article component. In some embodiments, the method further comprises analyzing a different image depicting a two-dimensional representation of the base article component attached to the attachment article component to determine placement or attachment accuracy or quality. In some embodiments, the attachment article component is transferred in response to the geometric coordinate. In many embodiments, one or more of the attachment and base article component comprises a textile piece, a shoe part, an automotive part, a machinery part, or a circuitry part.

Provided herein are systems that positions and attaches an article component in an automated manner during an article manufacturing process. An exemplary system comprises an image recorder that records an image depicting a two-dimensional representation of an attachment article component, which is to be attached to a base article component, and computer storage media having stored thereon computer-executable instructions that, when executed, cause a computing device to: (a) determine pixel coordinates of the image, (b) convert the pixel coordinates of the image to a geometric coordinate in a geometric coordinate system, which maps a three-dimensional space within which the attachment article component is positioned and an electroadhesive manufacturing tool operates, (c) determine another geometric coordinate in the geometric coordinate system by analyzing a different image of the base article component, and (d) instruct the electroadhesive manufacturing tool to transfer the attachment article component to the other geometric coordinate, thereby moving the attachment article component to a location in the three-dimensional space at which the attachment article component is to be attached to the base article component. The electroadhesive manufacturing tool transfers the attachment article component to the other geometric coordinate by electroadhesively capturing the attachment article and subsequently releasing the captured attachment article to the other geometric coordinate. In some embodiments, one or more of the attachment and base article component comprises a textile piece, a shoe part, an automotive part, a machinery part, or a circuitry part.

Provided herein are fabric auto-layering devices. An exemplary device comprises a controller configured to receive one or more computer-aided design files of a part outline, generate (i) user interface part placement, error check part placement, and identify part placement or position and (ii) a layering element to place one or more parts, the layering element being in operative communication with the controller.

Provided herein are fabric auto-layering devices. An exemplary device comprises a fabric auto-layering device configured to transmit information comprising one or more of part placement accuracy information and a raw image of part placement, and a remote computing device in communication with the fabric auto-layering device to receive the transmitted information and compute one or more quality metrics in response.

Provided herein are fabric auto-layering devices. An exemplary device comprises a user interface configured to guide part placement by a user onto a platform, determine whether the part has been properly placed, and confirm proper placement to the user.

Provided herein are fabric auto-layering devices. An exemplary device comprises a plurality of fabric auto-layering devices in communication with one another such that the plurality of fabric auto-layering devices are one or more of coordinated with one another, controlled in relation to one another, and able to communicate operational metrics with one another Provided herein are systems of manufacturing an article with the aid of an electroadhesive capture element. An exemplary system comprises capturing a first article component placed on a platform via electroadhesion, the first article component being from a manufacturing station, moving the captured first article component to a position aligned with a second article component placed on the platform, the second article component being from the manufacturing station, releasing the captured first article component to be placed in alignment with the second article component, attaching the first and second article components to one another to generate an assembled article component, and returning the assembled article component to the manufacturing station.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIGS. 1A-1I show various embodiments of the system of the present disclosure, wherein the first platform is a turntable;

FIGS. 1A-1E show perspective (FIG. 1A), top (FIG. 1B), perspective (FIG. 1C), side (FIG. 1D), and back (FIG. 1E) views of an embodiment of an electroadhesion manufacturing system with operator and first platform;

FIG. 1F shows a top view of an embodiment of a system with protective shield removed to highlight assembly steps from operator to second platform.

FIGS. 1G-1I show perspective (FIG. 1G), top (FIG. 1H), and perspective (FIG. 1I) views of another embodiment of an electroadhesion manufacturing system wherein two appliances or gripper systems loaded by two operators share a single second platform;

FIG. 3A shows an embodiment of a robotic actuator that embodies a multi-zone electroadhesion gripper;

FIG. 3B shows a 180° rotated view of the electroadhesion gripper of FIG. 3A;

FIGS. 5A-5H illustrate an embodiment of an electroadhesion manufacturing system in use;

FIG. 5A shows a schematic of the electroadhesion manufacturing system prior with a first and a second article component on a first platform;

FIGS. 5B-5C show schematics of the electroadhesion gripper picking up a first article component but not yet a second article component (i.e., the electroadhesive gripper picks up the article components or parts sequentially, though the electroadhesive gripper can pick up the article components or parts simultaneously as well);

FIGS. 5D-5E show schematics of the electroadhesion gripper picking up the second article component;

FIG. 5F shows a schematic of the system after the electroadhesion gripper has been moved above the second platform;

FIG. 5G shows a schematic of the release of the first article component onto the second platform while the second article component is retained on the electroadhesion gripper;

FIG. 5H shows a schematic of the release of the second article component;

FIGS. 7A-7D show further embodiments of an electroadhesion manufacturing system wherein article components are assembled by actuation of a second platform by a robotic actuator;

FIGS. 7A-7B illustrate perspective views of an embodiment of an electroadhesion manufacturing system wherein article components are placed on a first platform and conveyed to the second platform;

FIG. 7C shows a magnified view of the robotic actuator of FIGS. 7A-7B and second platform;

FIG. 7D shows a schematic of another embodiment of an electroadhesion manufacturing system wherein multiple article components are fed onto multiple first platforms and conveyed to a moving second platform below;

FIG. 8A shows an embodiment of an electroadhesion gripper with a single electroadhesion zone;

FIG. 8B shows a top view of the embodiment of FIG. 8A;

FIG. 8C shows an exemplary embodiment of an electroadhesion gripper with multiple electroadhesion zones for selective capture and release of article components;

FIG. 12A shows a cross-section of an embodiment of an electroadhesion gripper comprising a mechanical separation mechanism and an ultrasonic welder with mechanical separation mechanism retracted;

FIG. 12B shows a cross-section of an embodiment of an electroadhesion gripper comprising a mechanical separation mechanism and an integrated ultrasonic welder with mechanical separation mechanism extended;

FIG. 16 shows a flowchart of a method capturing and releasing a plurality of target objects;

FIG. 17 shows a flowchart of a method of facilitating the manufacture of an article;

FIG. 18 shows a flowchart of a method of manufacturing an article; and

FIG. 19 shows a flowchart of another method of manufacturing an article.

DETAILED DESCRIPTION OF THE INVENTION

Figure 1A:
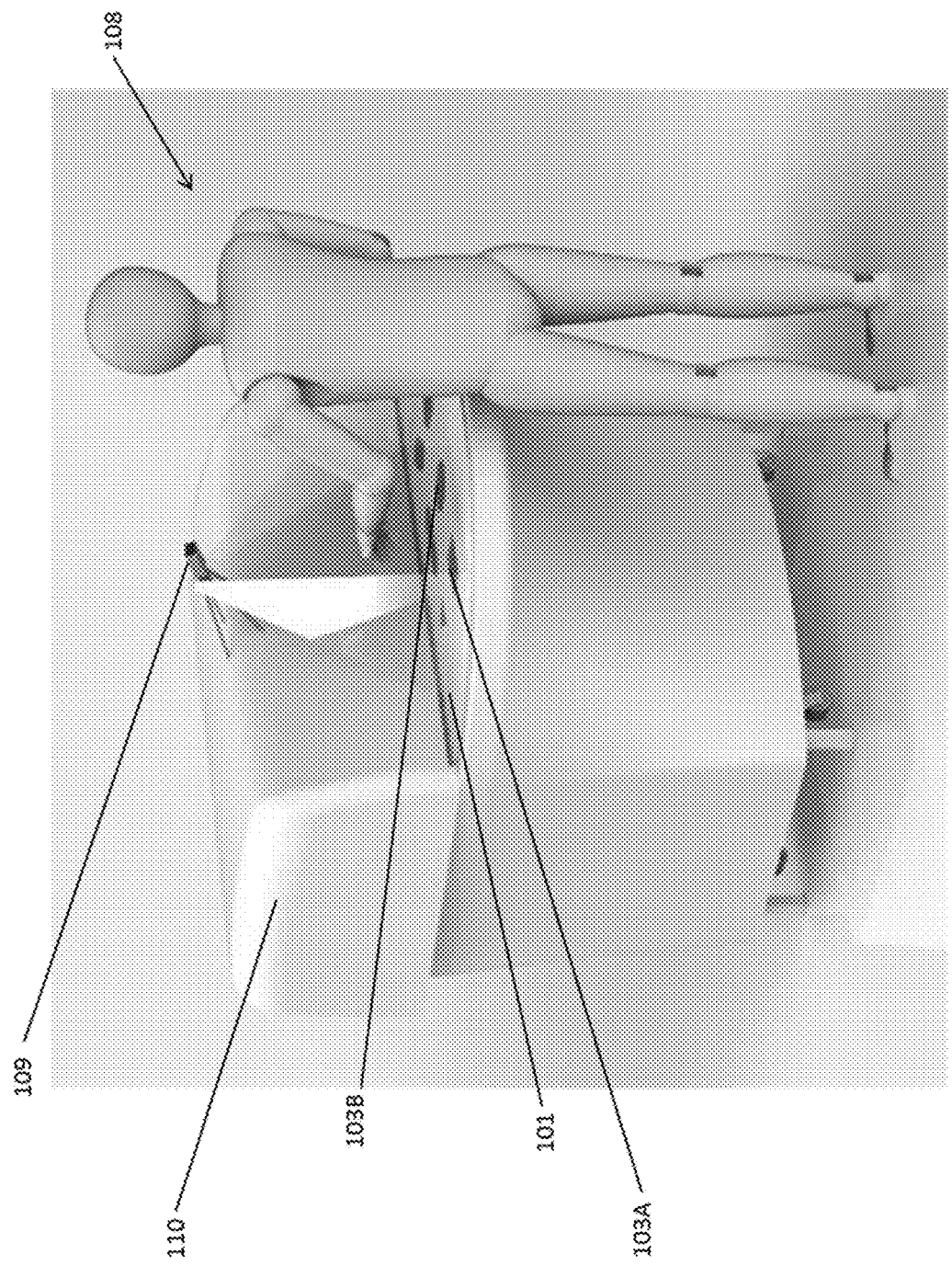

In the following detailed description, reference is made to the accompanying figures, which form a part hereof In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that aspects of the present disclosure, as generally described herein, and illustrated in the figures, can be arranged, substituted, combined, separated, and designed in a wide variety of different configurations, all of which are explicitly contemplated herein.

As the term is used herein, "electroadhesion" refers to the mechanical coupling of two objects using electrostatic forces. Electroadhesion as described herein uses electrical control of these electrostatic forces to permit temporary and detachable attachment between a foreign substrate, for example an article component, and a pick-up surface of an electroadhesion-enabled capture element. This electrostatic adhesion holds the foreign substrate and the pick-up surface together via an electrostatic attraction normal to the surface and increases traction or friction between the foreign substrate and the surface of the capture element due to electrostatic forces created by an applied electric field. The surface of the capture element is placed against or nearby a surface of a foreign substrate. An electrostatic adhesion voltage is then applied to the electrodes using (integrated) control electronics in electrical communication with the electrodes. The electrostatic adhesion voltage comprises unipolar or bipolar operation. In some embodiments, the electrostatic adhesion voltage uses alternating positive or negative charges and ground on neighboring electrodes. In some embodiments, the electrostatic adhesion voltage uses alternating positive and negative charges on neighboring electrodes. In some embodiments, the electrostatic adhesion voltage uses positive and negative charges alternating with ground on neighboring electrodes. As a result of the voltage difference between electrodes, one or more electroadhesive forces are generated, which electroadhesive forces act to hold the surface of the capture element and the foreign substrate against one another. Due to the nature of the forces being applied, it will be readily appreciated that actual contact between the surface of the capture element and the foreign substrate is not necessary. For example, in many embodiments a piece of paper, thin film, netting, or other material or substrate is placed between the pick-up surface of the capture element and the foreign substrate. In many embodiments, there is no other material or substrate between the pick-up surface of the capture element and the foreign substrate. The electrostatic force maintains the current position of the pick-up surface of the capture element relative to the surface of the foreign substrate. The overall electrostatic force is sufficient to overcome the gravitational pull on the foreign substrate, such that the capture element is used to hold the foreign substrate aloft. In some embodiments, the pick-up surface of the capture element and the foreign substrate have a distance of about 0.01 mm to about 2 mm therebetween. In some embodiments, the pick-up surface of the capture element and the foreign substrate contact one another.

The electrostatic adhesion force between the pick-up surface of the capture element and the surface of the foreign substrate diminishes over time (typically 50-100 msec) after the electrode voltage is driven to zero, for example by a high-voltage supply. Thus, the capture element is able to move readily relative to the surface of the foreign substrate. This condition allows the capture element to move before and after an electrostatic adhesion voltage is applied. Well-controlled electrical activation and de-activation enables fast adhesion and detachment. Because the electrode impedance is largely capacitive, the quiescent power supplied to the capture element electrode is small—typically less than 200 mW.

FIGS. 1A-1I show various embodiments of a system for manufacturing an article comprising a first platform 101, a second platform 102, one or more article components 103, and a gripper 104. The gripper 104 for example optionally comprises a capture element 105 and a robotic actuator 106. The capture element 105 for example optionally comprises a pick-up surface, for example an electroadhesion plate. The gripper 104 for example optionally comprises an electroadhesion gripper. The system for manufacturing an article for example optionally comprises an electroadhesion manufacturing system. In many embodiments the first platform 101 is moveable. For example, as shown in FIGS. 1A-1I, the first platform 101 comprises a turntable. The robotic actuator 106 for example optionally comprises a robotic arm, gantry, linear actuator, or other movement mechanism.

FIG. 1A shows a perspective view of an embodiment of an electroadhesion manufacturing system wherein a first article component 103A and a second article component 103B are placed on the operator-side 107 of the first platform or operator station 101 by an operator 108 (also referred to herein as a user). Additional article components 103 are optionally also placed on the first platform 101. Six article components 103 have been shown here by way of example but it will be understood that any number of article components 103 are a part of any of the systems and methods described herein. An article component 103 for example optionally comprises a textile piece, a shoe part, an automotive part, a machinery part, or a circuitry part, such that the article assembled on the second platform comprises, respectively, at least a portion of an article of clothing, at least a portion of a shoe, at least a portion of a machine, or at least a portion of a circuit. The system optionally further comprises an image projector 109, for example an overhead projector, in order to provide illumination and guiding messages to the operator 108 during use. For example, in many embodiments the overhead projector 109 provides guiding lines or written instructions, or a combination of both to the operator 108. In many embodiments the overhead projector 109 is disposed on an appliance cover 110.

In some embodiments, the article comprises multiple article components that are placed into customized pockets embedded in a fixture (a plate for instance). The article aggregates material that is released using a single operation of the gripper. In some embodiments, the article comprises for example a fixture or clamp that is assembled into a stack of other assembled articles at the second platform so as to stabilize the stack when the stack is processed by a downstream manufacturing apparatus, for example a sewing machine, that is connected to or fed by the second platform. In some embodiments, the gripper picks up the article aggregations while leaving the fixture on the first platform. In some embodiments, the gripper picks up the article aggregations along with the fixtures, which enables the pieces to be held while sewing, melding, or bonding the article components.

Figure 1B:
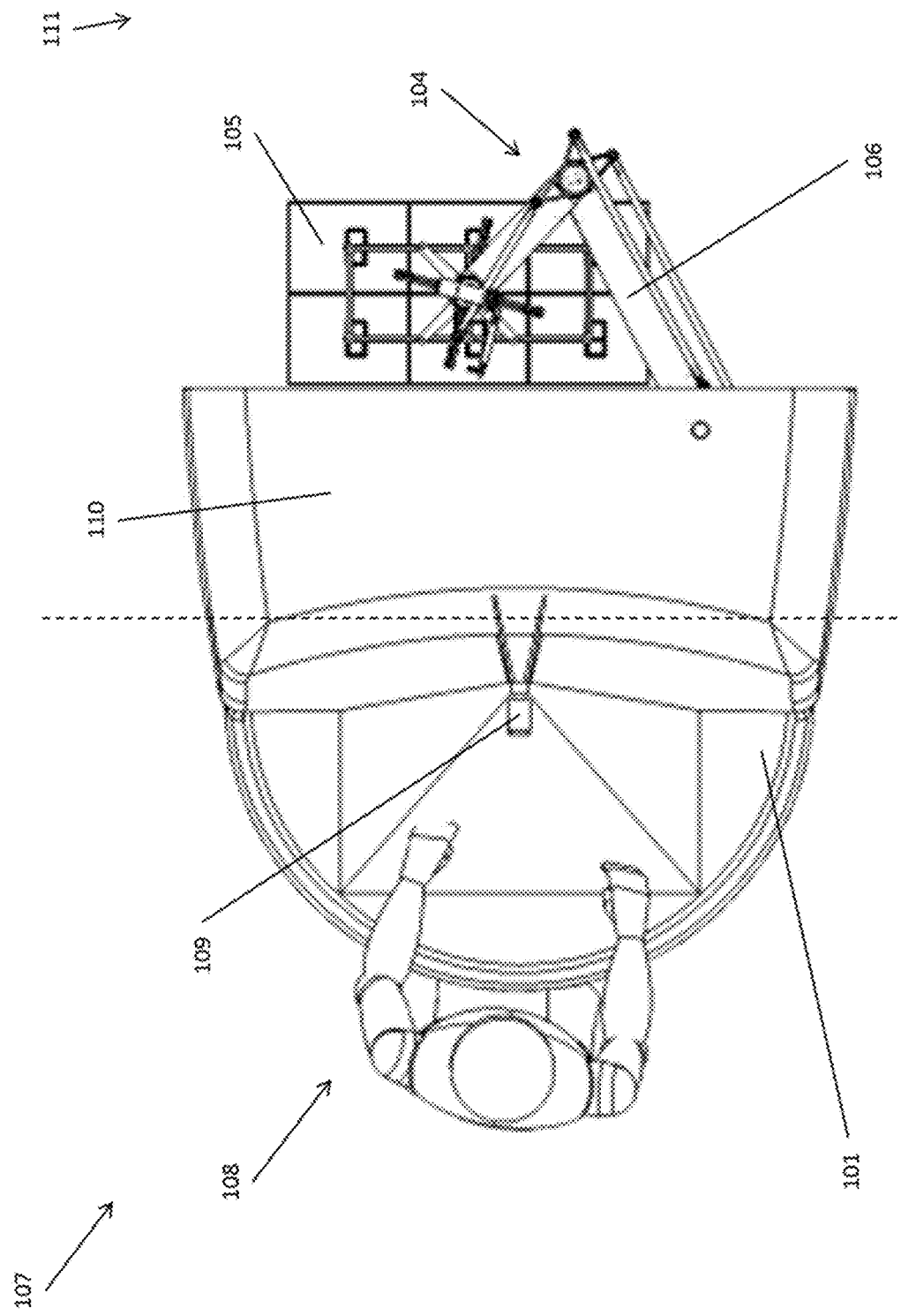
Figure 1C:
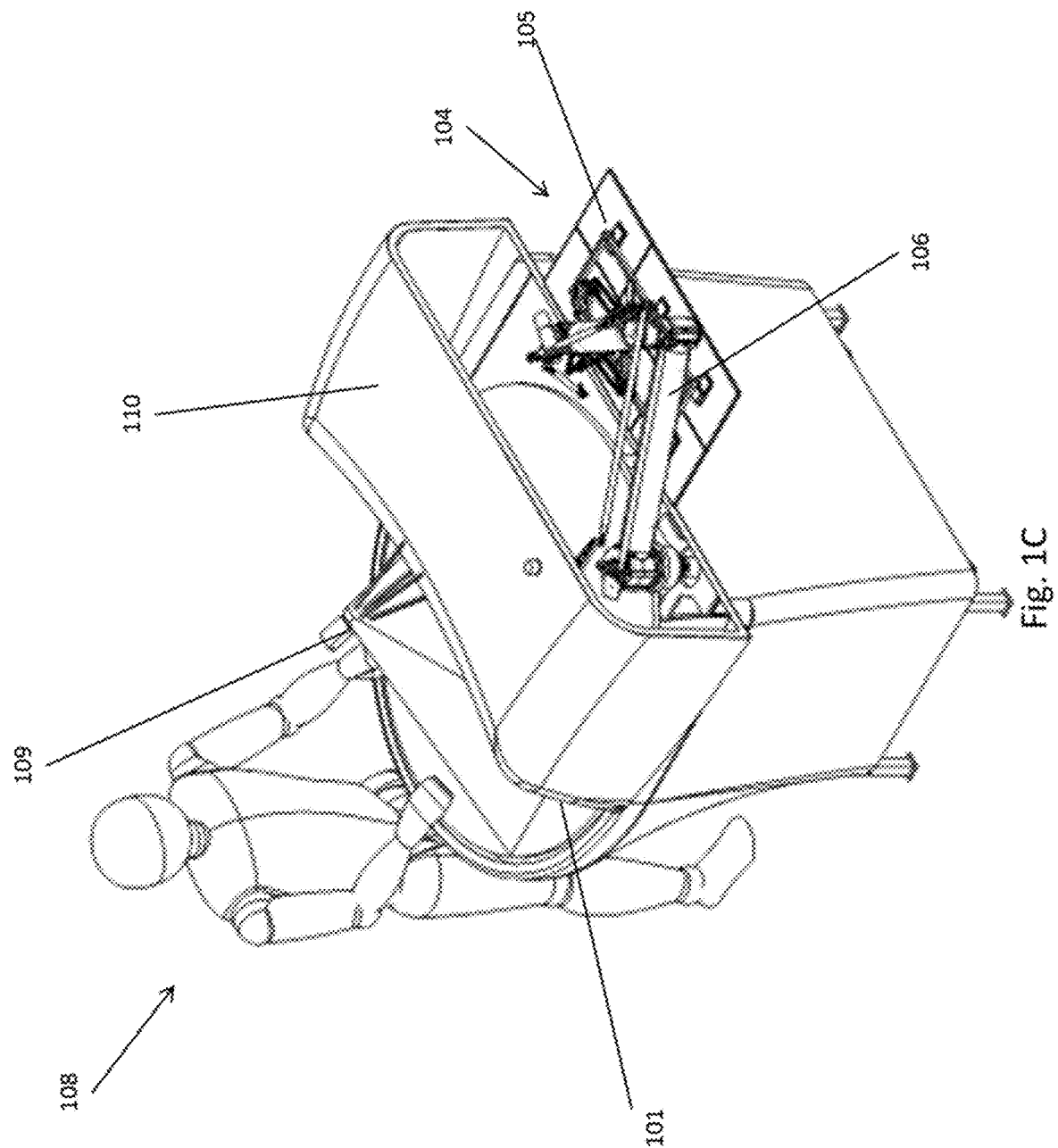
Figure 1D:
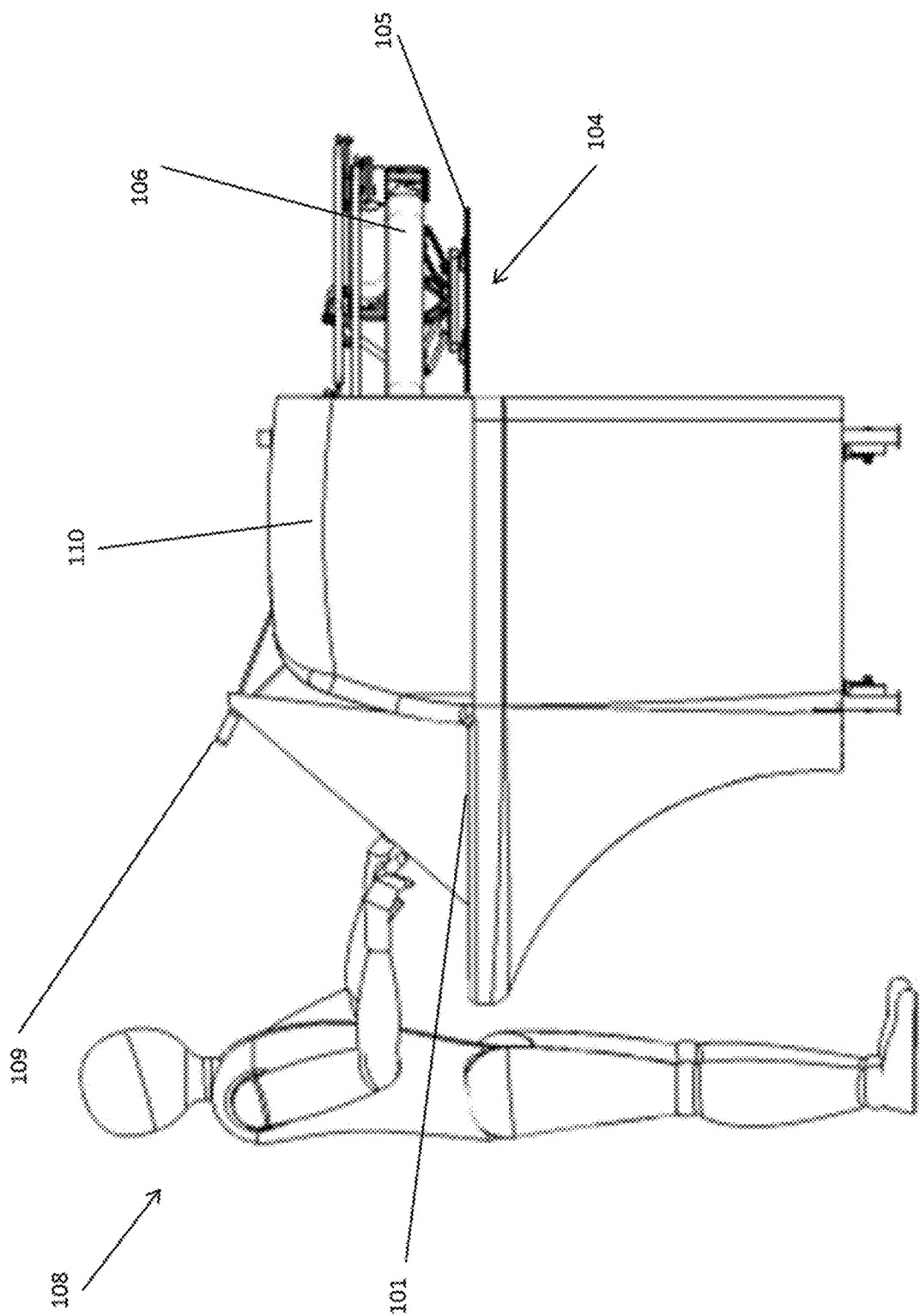

FIG. 1B shows a top view of the electroadhesion manufacturing system of FIG. 1A. The first platform 101 for example optionally comprises a first portion, for example the operator-side 107, which is closer to the operator 108 than the electroadhesion gripper 104. In many embodiments the operator-side of the first platform 107 is isolated from a robot-side of the first platform 111 by the appliance cover 110. In many embodiments the appliance cover 110 is used to isolate the gripper 104 from the operator 108 to protect the operator 108 from the hazards of working near the robotic actuator 106. Alternatively or in combination, in some embodiments the appliance cover 110 isolates the gripper 104 from external environmental factors which affect article component handling For example, the system optionally includes lighting control, temperature control, humidity control, or any combination thereof so as to improve successful article component handling FIG. 1C shows a perspective view, FIG. 1D shows a side view, and FIG. 1E shows a back view of the system for manufacturing an article of FIG. 1A.

Figure 1F:
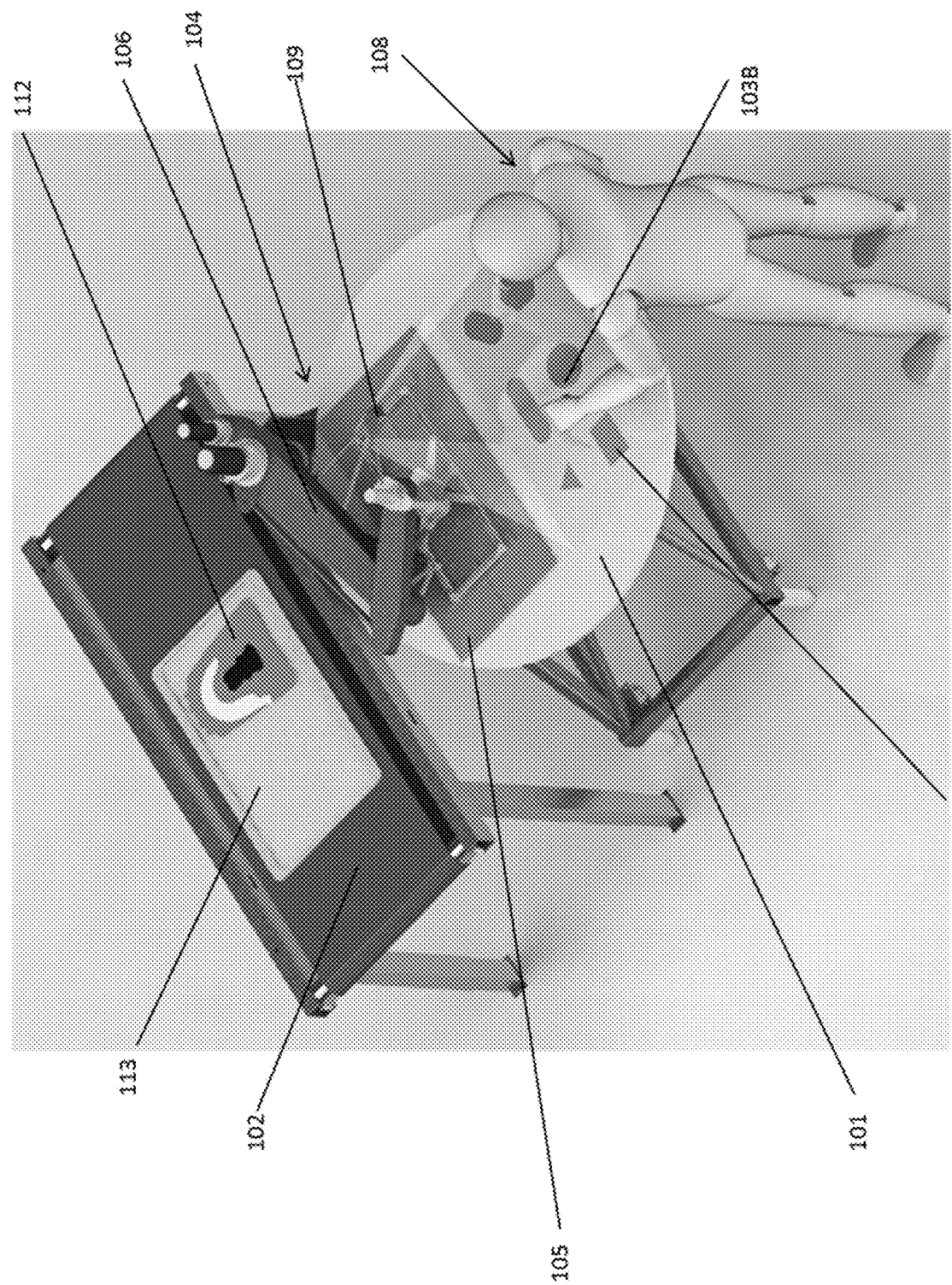

FIG. 1F shows a top view of the embodiment of FIG. 1A with protective cover 110 removed to highlight assembly steps from operator 108 to second platform 102. The operator 108 places the first and second article components 103A, 103B on the operator-side of the first platform 107. The first and second article components 103A, 103B are then transferred to the robot-side of the first platform 111. Rotation of the first platform 101 delivers the article components 103A, 103B to the robot-side 111 while simultaneously delivering an unloaded platform to the operator-side 107, where the operator 108 then begins placing another group of article components 103 while the gripper 104 is in action. The gripper 104 captures the first and second article components 103A, 103B and moves to a position over the second platform 102. The gripper 104 then releases the first article component 103A onto the second platform 102 at a pre-determined location. The gripper 104 then releases the second article component 103B onto the second platform 102 at another pre-determined location, thereby assembling at least a portion of an assembled article 112. The second platform 102 for example is a conveyor. The assembled article 112 for example is released onto a tray 113 residing on the second platform 102 and then conveyed to a downstream manufacturing apparatus 114.

Figure 1G:
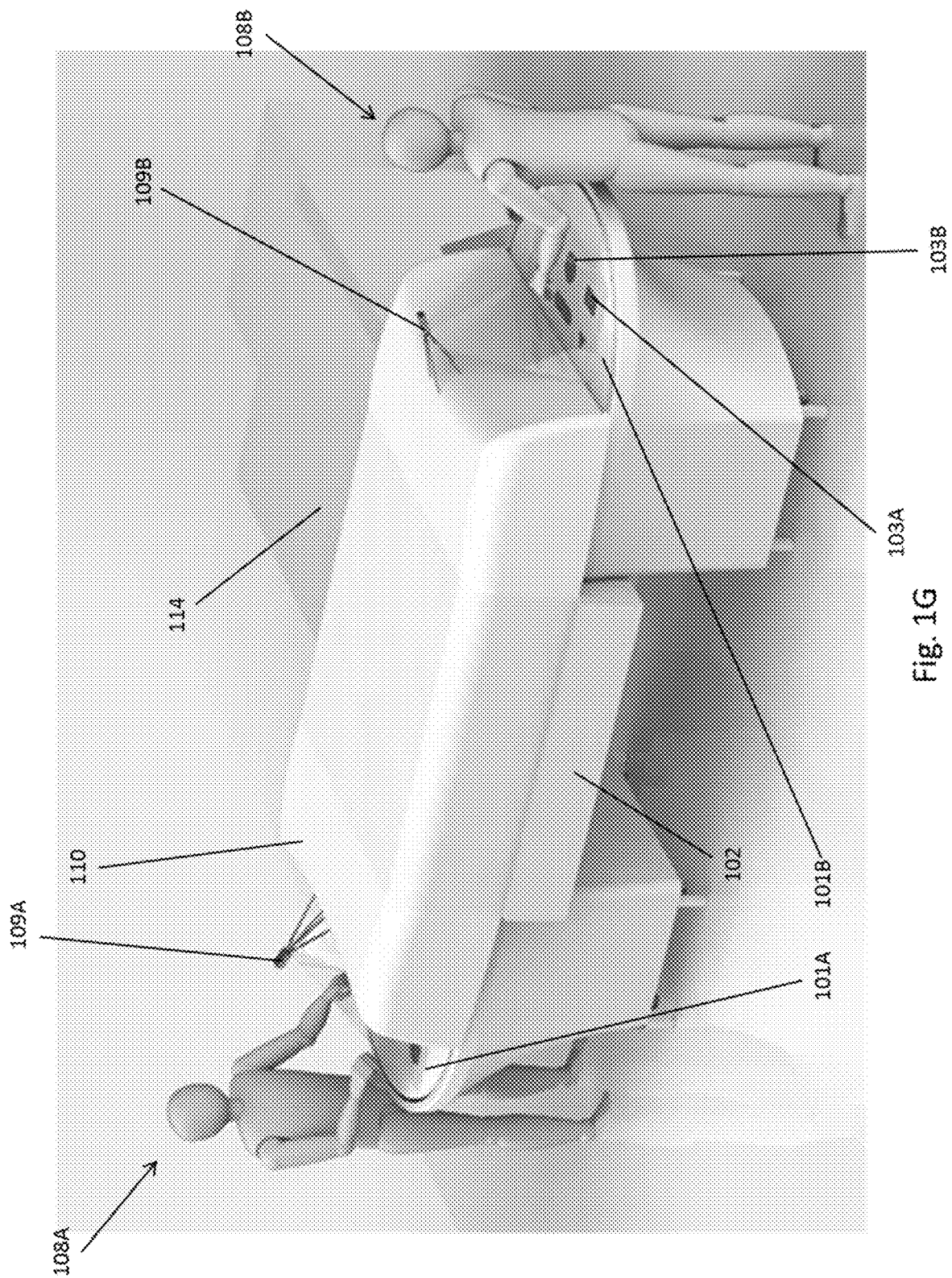
Figure 1H:
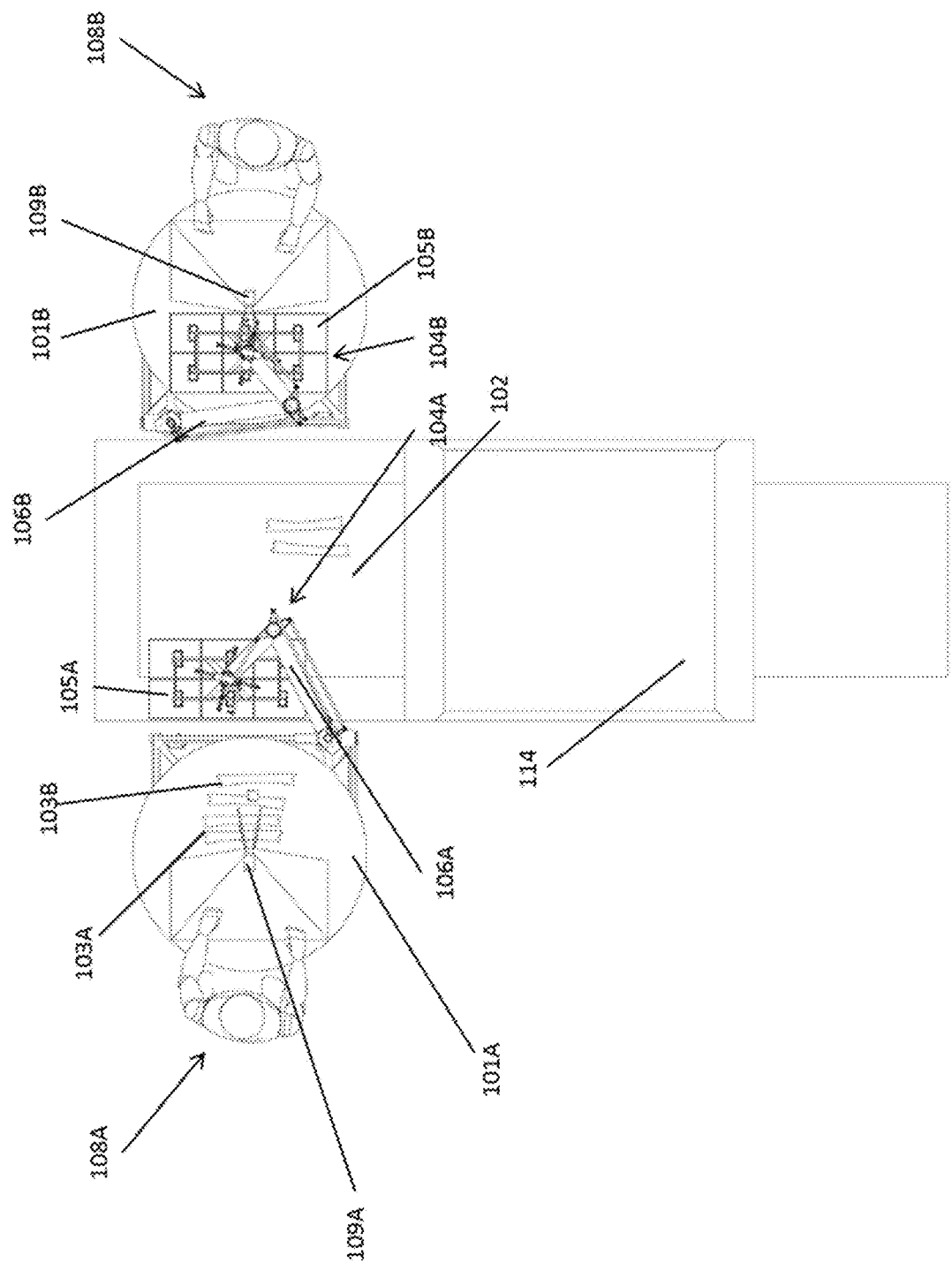

FIGS. 1G-1I show multiple views of another embodiment of an electroadhesion manufacturing system. FIG. 1G shows a perspective view, FIG. 1H shows a top view, and FIG. 1I shows a perspective view. For example, a first operator 108A places article components 103 on a first platform 101A to be delivered to a first gripper 104A for capture and then delivery to and release onto a second platform 102. The first platform 101 for example optionally comprises a turntable. Concurrent with the first operator 108A and gripper 104A work, a second operator 108B places article components 103 on a second turntable 101B to be delivered to a second gripper 104B for capture and then delivery to and release onto the second platform 102. The throughput of completed assemblies (also referred to herein as stacks and assemble articles) onto the second platform 102 is thereby substantially doubled. The first platforms 101A, 101B, grippers 104A, 104B, and second platform 102 are substantially the same as in the previous embodiment. The second platform 102 for example comprises a conveyor as shown which is shared by the two grippers 104A, 104B for article placement as illustrated herein. The assembled article for example is conveyed directly to a downstream manufacturing apparatus 114. The downstream manufacturing apparatus 114 for example comprises an automated sewing head, a heat press, or a fusing machine. The gripper 104 and second platform 102 are optionally isolated from the operators 108A, 108B by an appliance cover 110. An imaging system, for example one or more cameras optionally attached to a projector 109 to provide illumination, article component placement guidance to the operator 108, or the combination thereof as previously described herein. The article component placement guidance ensures that the placed article components are completely within predetermined locations on the gripper 104, for example in one or more predetermined zones of the capture element 105, when the parts 103 are acquired by the gripper 104. The orientation of each article component 103 is further optionally arranged so as to minimize assembly time, for example reducing the movement of the robotic actuator 106 needed to capture each article component 103 by carefully arranging the article components 103 with respect to each other to facilitate capture in one or more rotations of the gripper 104.

Alternatively or in combination, one or more overhead cameras is placed on the operator-side of any of the embodiments described herein in order to determine the position of each article component prior to rotation of the turntable and delivery to the robot-side. Alternatively or in combination, one or more overhead cameras is placed on the robot-side of any of the embodiments described herein in order to determine the position of each article component prior to capture by the gripper. Images captured by the one or more overhead cameras are optionally processed by a dedicated image processing system to locate the parts precisely. In some embodiments, two or more overhead cameras signals are optionally processed and "stitched" to create a single image of the first platform which is then processed by a dedicated image processing system to locate the parts precisely. In some embodiments, two or more overhead camera signals are processed without stitching by a dedicated image processing system to locate the parts precisely. In some embodiments, position information is delivered to the robotic actuator and used to inform the movement of the robotic actuator for precise positioning of the capture element above the article components. Alternatively or in combination, in some embodiments position information is delivered to the robotic actuator and used to inform movement of the robotic actuator for precise positioning of the capture element above the second platform prior to release of the article components onto the second platform. In many embodiments, there are known, calibrated, kinematic relationships between the robotic actuator, first platform, and the one or more overhead cameras. Therefore, position information acquired at the first platform is sufficient to position and align the article components onto the second platform. Images taken by the cameras on the operator-side or robot-side are alternatively or in combination also used to assess article component alignment, identity, critical-to-quality (CTQ) tolerances, or any combination thereof. The images are used to identify errors in placement by the operator, which optionally signals to the first platform to hold its position at the operator-side until the errors have been fixed or return the first platform to the operator-side for error fixing by the operator. Errors in placement optionally further trigger visual or audio cues, or both, to the operator to teach the operator what needs to be done to fix the errors. Said visual cues for example include written instructions in the native language of the operator, article component outlines, guide lines, or any combination thereof.

For example, an embodiment of an electroadhesion manufacturing system comprises a translucent or transparent turntable, a second platform, a gripper comprising a robotic actuator and an electroadhesion plate, an overhead projector, an upward projection system, and one or more overhead cameras. The overhead projector for example projects light-stipes to enable the imaging system to detect "wrinkle" conditions and to prevent material transfer until the wrinkles have been smoothed. The upward projection system optionally projects outlines of one or more article components to guide placement of said article components on the translucent turntable by the operator. The outlines are optionally sized to match or exceed the external shape of one or more article components to guide precise or rough placement, respectively, of said article components on the turntable by the operator. Alternatively or in combination, the upward projection system optionally projects images or outlines of additional parts for future placement on the turntable by the operator (e.g., after the one or more article components have been picked up by the gripper and placed on the second platform) when more than one pick-up motion is needed to assemble the article components. Alternatively or in combination, the upward projection system optionally provides backlighting of the translucent turntable. In many embodiments the backlighting is programmable such that the intensity, color, or the combination is adjustable. For example, in many embodiments one or more overhead cameras acquires two images—one with backlighting applied and one without backlighting. The two images are differenced by an image processing system to deliver a net image that shows a binary image of a silhouette of the article components. Such an image is more easily processed than a typical grey-scale image from a camera and provides a reliable measurement of position even in uneven ambient lighting conditions. In many embodiments, each image shows the position of multiple article components or parts. For example, in many embodiments a single image is used to determine the position of two or more article components. Alternatively or in combination, color images of the article components are acquired with backlighting applied with full spectral control for outline detection. In many embodiments, each image shows the position of multiple article components or parts. For example, in many embodiments a single image is used to determine the position of two or more article components. In many embodiments, two or more images are used to determine the position of two or more article components. The imaging system confirms proper placement and CTQ dimensions. CTQ information generated by the one or more camera for example includes information about alignment placement, the color fading of the article components, the cut quality of the article components, or the like. The turntable then advances the article components to the robot-side where the electroadhesion gripper captures the articles based on the position information generated on the operator-side.

The system for example optionally comprises two overhead cameras. In some embodiments the first camera acquires an image without backlighting and the second camera acquires an image with backlighting applied for processing as previously described. In some embodiments, the first camera acquires an image of a first portion (e.g., half) of the first platform pickup zone and the second camera acquires an image of a second portion (e.g., half) of the first platform. The two images are then used independent of one another to drive the gripper to determine where to capture and/or place the article components identified in the images as described herein. In some embodiments, in situations where an article component is not fully contained within the field-of-view of either camera, the signals or images from the two cameras are for example "stitched" together by the image processing system. In some embodiments, transferring two or more article components from the first platform to the second platform comprises moving the robotic actuator from over the first platform after capture to over the second platform after release more than once. In such cases, the same or different image(s) can be used by the image processing system to inform each pass of capture, movement and release by the robotic actuator. The image processing system determines one or more of the position, orientation, and surface pattern of the article component that spans across the field of view of the two cameras.

Although a single user is shown in FIG. 1, it will be understood by one of ordinary skill in the art that any number of users desired may place the article components on the operator-side of the first platform. For example, two or three operators may place the article components on the first platform. Alternatively or in combination, additional personnel are optionally used to prepare materials for the first operator to place. In some embodiments, an automated loading system is used in place of or in addition to the operator to place the article components on the first platform. The systems described herein may feed assembled articles (or portions of article components) to one or more, for example two or more, downstream manufacturing apparatus.

Figure 2A:
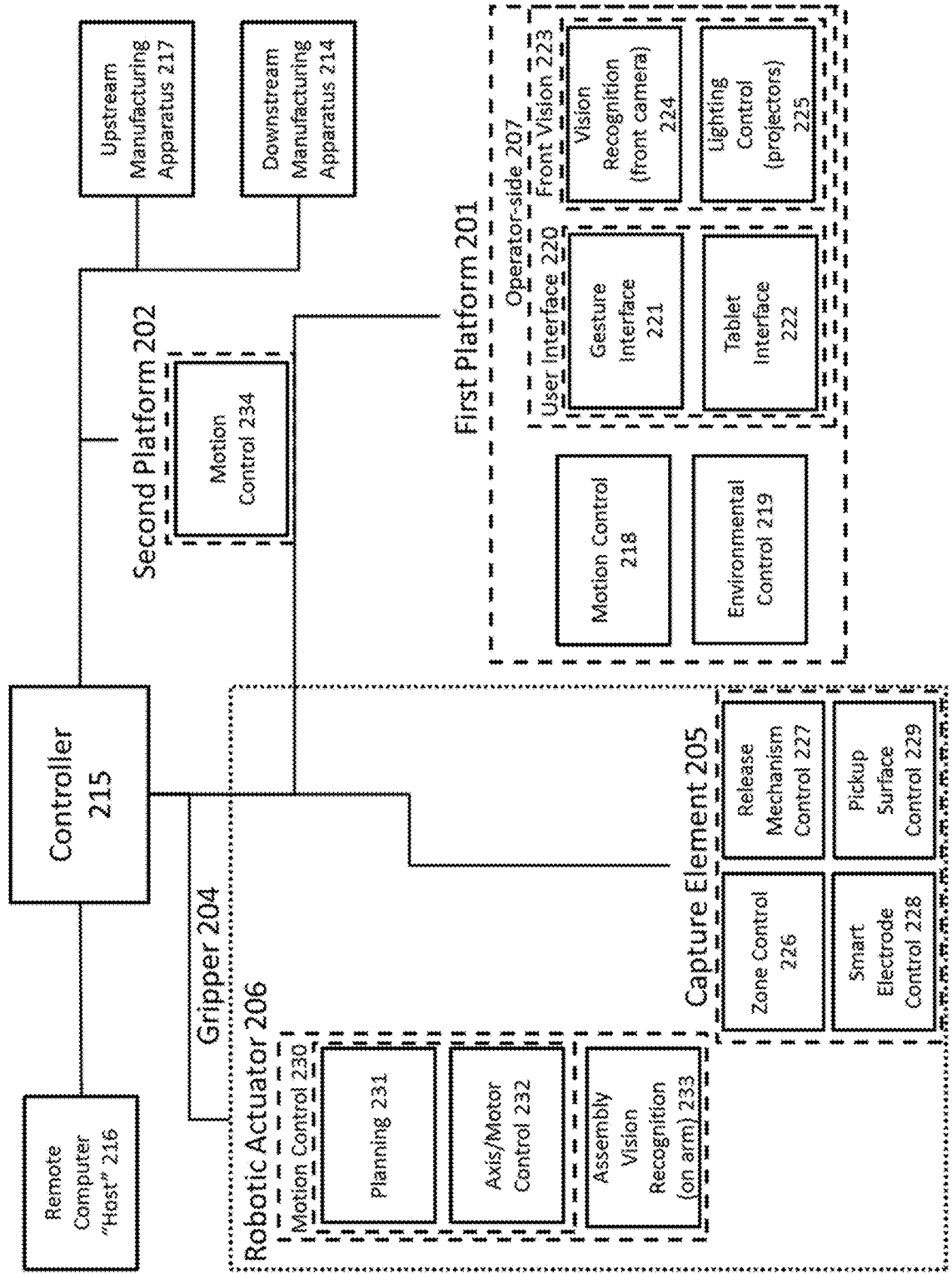
FIG. 2A illustrates a schematic diagram of an embodiment of an electroadhesion manufacturing system.

FIG. 2A illustrates a box diagram of an exemplary embodiment of an electroadhesion manufacturing system. The electroadhesion manufacturing system comprises a first platform 201, a second platform 202, and gripper 204 comprising a robotic actuator 206 and a capture element 205, which are substantially the same as in the previous embodiments. The gripper system optionally further comprises a controller 215 in communication with each of the first platform 201, second platform 202, robotic actuator 206, and capture element 205. The controller 215 in some embodiments is in communication with one or more of a remote computer host 216, an upstream manufacturing apparatus 217, a downstream manufacturing apparatus 214, or any combination thereof.

The controller 215 acts as a master controller for one or more of the parts of the system and provides communication between the various components of the system.

For example, the controller 215 is in communication with one or more of the various components comprising the first platform 201. The controller 215 for example is in communication with systems on the operator-side of the first platform 207, as well as the motion control 218 of the first platform 201 and the environmental control systems 219. The motion control 218 for example is used to move the first platform 201, for example a turntable.

In many embodiments, the operator-side 207 is comprised of a user interface 220, comprising a gesture interface 221 and a tablet interface 222, and a front vision system 223, comprising a vision recognition system 224 and lighting control 225. The vision recognition system 224 is for example an overhead camera. The lighting control system 225 for example optionally comprises one or more projectors, for example an overhead projector and an upward facing projector mounted below the first platform. In some embodiments, placement of parts by the operator onto the first platform 201 is guided by approximate part outline silhouettes projected on the surface of the first platform 201 using the one or more projectors. In some embodiments, the silhouettes are designed to interact with the user through one or more of simulated vibration of the surface, messages guiding the correction of the placed parts into the right zones, and other forms of visual and/or auditory communication to the user. In some embodiments, the silhouette is designed to offer confirmation to the user that the placement is accurate enough by methods such as one or more of a change of color, increased or decreased intensity, pulsation, confirmatory messages and/or images appearing against a correctly placed object, and any other means communicated through the projector 225 or through auditory means. The gesture interface 221 and tablet interface 222 provide the operator with a way to interface with the system. For example, the gesture interface system 221 is configured to recognize that the operator has removed their hands from the system, thus indicating to the controller 215 that the article components have been placed and are ready for capture by the gripper 204. In many embodiments, the gesture interface 221 is used to detect the placement of the hand, for example on soft buttons that designate choices presented by one or more of the projectors 225. In some embodiments, the sensor that captures the hand positions automatically determines when certain placement of parts has been accomplished by the position of the human hands within its field of view.

Alternatively or in combination, the controller 215 is in communication with the various components of the capture element 205. The controller 215 in some embodiments communicates with one or more of a zone control system 226, a release mechanism control system 227, a smart electrode control system 228, and a pick-up surface control system 229. Alternatively or in combination, in some embodiments the controller 215 communicates with one or more of an ultrasonic tack welder and a gripper-mounted imaging system 233, for example a camera.

Alternatively or in combination, the controller 215 is in communication with various subsystems of the robotic actuator 206. The controller 215 communicates with the motion control system 230 of the robotic actuator 206 which comprises planning 231 and axis/motor control 232 systems.

For example, information regarding the alignment of the article components on the robot-side of the first platform 201 is used to plan and execute a set of motions to capture and precisely release the article components to the second platform 202. The controller 215 is optionally further in communication with an assembly vision recognition system 233, for example a camera located on the robotic actuator 206. The assembly vision recognition system 233 is used to image the article components following release onto the second platform 202 to determine if the article components have been placed correctly such that the assembled article is within placement tolerances. The camera 233 acquires images of the article components on the robot-side to inform whether CTQ placement tolerances have been achieved. In many embodiments, the camera 233 acquires an image containing two or more article components and uses said image to determine the placement of the two or more article components. The images are optionally stored as CTQ records by the remote computer host 216 for example. Alternatively or in combination, images taken by the gripper-mounted camera 233 are used to identify the placement accuracy of the first article component on the second platform 202 at the first predetermined location and thereby enable subsequent article component placement at the second platform 202 to account for variation in the placement of the first article component and compensate for said variation in the placement of additional article components at the second platform 202 in order to reduce the total placement variation. The controller 215 is optionally further in communication with the motion control system 234 of the second platform 202, for example a conveyor, such that the completion of article assembly steps alerts the second platform 202 to convey the assembled article to a downstream manufacturing apparatus 214.

In many embodiments, the controller 215 is configured to operate in either a production mode. a training mode, or a production planning mode. In the training mode, the controller 215 is taught by a user new article assembly designs and instructions. For example, an operator lays a plurality of article components together to determine the layering of an assembled article. The remote computer host 216 for example optionally includes a history and pattern database which keeps a record of article component assembly patterns as well as assembled article recognition information. Production mode is used during automated assembly of an article after the controller 215 has been trained to recognize where the plurality of article components must be captured, released, or a combination thereof. The tablet interface 222 allows for communication between the operator and the controller 215 and has significant use during training of the system. In production mode, the controller 215 reports out live production metrics and optionally provides a "plan" for production as described herein. In production planning mode, the controller 215 is optionally configured to generate a production plan for a specific time period, for example a plan covering a day of operation. For example, a new assembly can be imported in CAD using the input system described herein. The controller is optionally configured to set up all of the parameters required for a speedy introduction to production. Alternatively or in combination, production planning is done by a remote computing device and the controller is configured to receive the production plan from the remote computing device.

The controller 215 and system components are in wired communication, wireless communication, or any combination thereof with each other. For example, the controller 215 optionally communicates with the robotic motion 230, capture element 205, and robotic actuator vision systems 233 wirelessly while being in wired communication with the cameras 224 and lighting systems 225. The wireless communication for example occurs by Bluetooth, WiFi, RFID, near-field communication (NFC), or other similar means, or any combination thereof. The wired communication is by USB, HDMI, CSI, PWM, GPIO, Ethernet cable, or the like, or any combination thereof.

In many embodiments, the controller is configured to generate one or more manufacturing metrics based on one or more of capturing the first and second articles, moving the captured first and second articles, and releasing the captured first and second articles. The manufacturing metric for example optionally comprises one or more of manufacturing production rate, incoming part acceptance, part capture accuracy, part placement accuracy, performance metrics (e.g., rate, placement accuracy) per user, and performance metrics per article assembly pattern or article part(s). In many embodiments, the controller is configured to transmit the one or more manufacturing metrics to a remote computing device, the remote computing device generating one or more manufacturing insights based on the one or more manufacturing metrics. In some embodiments, said manufacturing metrics are sent to a production control system or streamed via a communications link that is part of the manufacturing system. In some embodiments, the raw images of the parts are sent external to the manufacturing system, such that the production metrics are computed elsewhere. In other embodiments, the manufacturing metrics are computed locally using the assembly images or other methods, and then the aggregate post-processed data is communicated to the external source. Alternatively or in combination, the controller is configured to receive incoming part information for the first and second article components from an upstream manufacturing apparatus and cause the first and second article components to be captured based on the received incoming part information. Alternatively or in combination, the controller is configured to generate outgoing part information for the first and second article components and cause the outgoing part information to be transmitted to a downstream manufacturing apparatus. In some embodiments, the outgoing part information comprises at least one of Computer-aided Design (CAD) and Computer-aided Manufacturing (CAM) data defining at least one of the shape of the components, the visual pattern embodied within the component, and critical-to-quality metrics relating to the placement of the article components. In some embodiments, the system communicates with other machines within the same ecosystem, for example to jointly perform a task and/or to receive or transmit information. For example, in some embodiments the system receives information from an upstream manufacturing apparatus, for example a cutting table. In some embodiments, the system passes on several parameters to a downstream manufacturing apparatus, for example a sewing machine, hot or cold press or fusing machine. In such cases, the information passed on for example optionally includes the outline of one or more parts placed relative to other parts placed, the location of the placement and/or orientation of the assembled article, the sewing paths required, RFID or other means of identifying the article, the lot number printed on the material, or any other information useful for the operation either co-operatively or in a standalone format for the successive machines in the overall manufacturing operation.

The systems described herein are re-programmable prior to use for the specific article components required for each assembly job. For example, the system is taught to recognize specific article component shapes or fabric patterns or a combination thereof for article components which are assembled into at least a portion of an article of clothing. In some embodiments, the system is taught by someone other than the operating user, for example a managing user, by using an external device such as tablet or computer. Such a teaching routine for example optionally includes placing the article components on the first platform one at a time, receiving confirmation from the automated system that the part is capable of being grasped and recognized. In some embodiments, the system is taught by demonstrating the correct placement of one part on another, for example to be verified by the camera placed on the system. In addition to or as an alternative to physical teaching, the system for example optionally receives Computer Aided Design (CAD) or Computer Aided Manufacturing (CAM) inputs of each of the parts as well as the assembled article and uses that information to augment or instead of the teach-by-showing functionality. The system for example comprises an input system which allows the user, managing user, or other entity (for example an external user or system) to input the CAD or CAM files. The CAD or CAM inputs optionally comprise metadata embedded therein such that a "recipe" for part placement and release is generated automatically from the CAD or CAM inputs. A managing user selects a desired CAD or CAM file comprising CAD or CAM inputs and the "recipe" (or protocol) is automatically generated to teach the system. The system is later re-deployed and taught to recognize specific article component shapes or fabric patterns or a combination thereof for article components which are then assembled into at least a portion of a circuit, for example.

The recipe generated from the inputs is optionally configured to improve the efficiency of the robot motions, the operator motions, or the combination thereof. Increased efficiency in the motion of the robotic actuator can reduce or minimize the time to assemble the article. Increased efficiency of the operator motions can load balance the number of article components placed on the platform per motion of the operator, such as picking up and/or placement motions. The recipe optionally determines the pre-determined capture location, pre-determined release location, location on the gripper, or any combination thereof. In some instances, the recipe determines the location of one or more article components within each zone of the gripper and optionally optimizes such locations based on parameters, for example regions of low friction on the gripper or article material properties, to enable rapid release of the article components. In some instances, the recipe maximizes the density of article components on the gripper by maximizing the density of the locations of the article components on the gripper. In some instances, the recipe ensures that one or more edge of an article component does not rest at or correspond to an edge of an electroadhesion zone or an edge of the gripper. In some cases, the edge of an electroadhesion has a "dead spot" in the electroadhesion pattern where the electroadhesive forces are weaker and may not be sufficient to hold an edge of the article component to the gripper. In some instances, the recipe minimizes the number of zones used to capture an article component. For example, if an article component is smaller than a single zone, the recipe ensures that the entire article component is located within one zone on the gripper when captured instead of occupying more than one zone. In some instances, the recipe minimizes the amount of movement of the gripper necessary to capture the desired article components from their predetermined capture locations. In some instances, the recipe minimizes the amount of movement of the gripper necessary to release the article components in their predetermined release locations. In some instances, the recipe positions the article components on the gripper so as to leave a portion of the article component exposed from the gripper. For example, the gripper may capture an article component such that a specific corner or other feature of the article component is exposed when the gripper places the article component on the second platform (and before the gripper moves away from article component on the second platform). This may allow for a sewing machine or other downstream manufacturing apparatus to access the article (or portion of an article) while the gripper is still in contact with the article component stack. The gripper may for example stabilize the stack while a sewing machine places a few stiches in the stack before the gripper moves away.

Figure 2B:
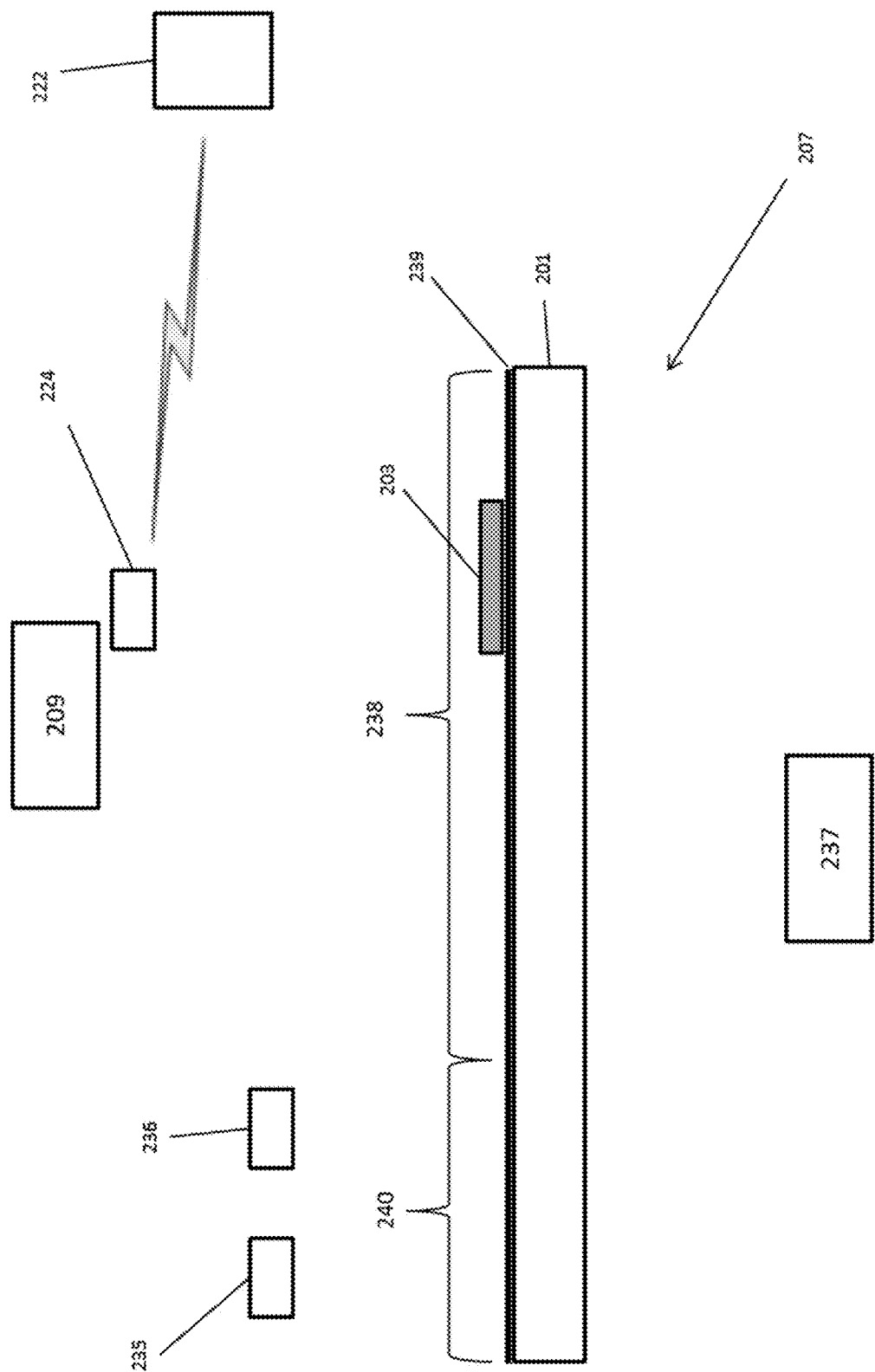
FIG. 2B shows a schematic of a portion of an electroadhesion manufacturing system comprising the operator-side of the first platform.

FIG. 2B shows an embodiment of the operator-side 207 of an electroadhesion manufacturing system. The operator-side 207 comprises a portion of the first platform 201, an optional audio output 235, an optional gesture recognition sensor 236, an optional overhead projector 209, an upward facing projector 237, an overhead camera 224, and a wireless-connected (or alternatively wired) tablet interface 222. The first platform 201 for example optionally comprises a transparent or translucent turntable such that the upward projection system 237 provides backlighting to allow the overhead camera 224 to detect the article component 203 and determine its position accurately. The turntable 201 for example is made of a translucent material such as polycarbonate or Lexan. The upward projection system 237 alternatively or in combination provides guiding messages to the operator during use, for example one or more guiding lines, one or more article component outlines, written instructions, videos, or any combination thereof. The first platform 201 for example comprises an article placement area 238 onto which guiding messages are projected. For example, the upward projection system 237 projects an outline for each article component 203 to provide guidance on part placement to the operator. The operator is shown approximately where to place the article component 203 by the "augmented reality" projection system. The article component 203 is guided based on one or more of the order of placement, the number of pick-up zones (described in detail in subsequent figures) of the electroadhesion capture element, and the orientation of the parts 203 as pre-computed by the controller 215 to minimize the time taken for assembly. The article component 203 is optionally guided for recipe optimization purposes as described herein.

The surface 239 of the turntable 201 for example is optionally frosted so as to create a pictorial message area 240 to aid in viewing the guiding messages projected thereon by the upward facing projector 237. One or more article component 203 is placed upon the frosted surface 239 of the turntable 201. An overhead projector 237 is optionally used to provide illumination of the surface of the article component 203 which aids in accurate detection of CTQ information. CTQ information for example includes information about the state of the article component 203, for example if the article component 203 is damaged, faded, or fraying. The upward facing projector 237 optionally provides backlighting which will allow the vision system 224, for example a camera, to detect the article components 203 and determine the accuracy of placement. Illumination provided by both the overhead projector 209 and the upward facing projector 237 further serves as part of an augmented reality user interface, allowing users to interact directly with the turntable 201 workspace in order to operate the appliance. For example, the user interface includes a gesture interface 236 which detects gestures by the operator. The gesture interface 236 for example is set up to recognize that the operator has finished placing the article components 203 on the turntable 201 and cue the vision recognition system 224 to confirm placement and activate motion of the turntable 201. Alternatively or in combination, the audio output 235 optionally sends audio cues or instructions operator to aid in placement or system operation.

The projectors 209, 237 for example are configured to project a calibration grid for the overhead camera 224. This enables the camera 224 to be calibrated periodically and optionally eliminates or reduces the need for costly calibration fixtures that are often used in vision-guided robotic systems.

The upward facing projector 237 of this or any embodiment described herein is optionally a flat panel television screen (e.g., Liquid Crystal Display (LCD) or Light Emitting Diode (LED)) or other light-emitting device which can project light onto the first platform 201 as described herein. The first platform 201 for example comprises a transparent or translucent turntable or conveyor.

Alternatively or in combination, the surface of the turntable 239 is embedded with electroadhesion electrodes to maintain article component 203 placement on the turntable 201 during turntable 201 rotation and article component 203 transfer to the robot-side. The electroadhesion electrodes for example optionally comprise transparent electroadhesion electrodes. Transparent electroadhesion electrodes enable the backlighting to pass through the transparent turntable 201 with minimal insertion loss. By using electroadhesion electrodes to hold onto the article components 203 during turntable 201 rotation, the turntable 201 is able to transfer at higher speeds, for example 2 to 3 times faster than without electrodes. The turntable 201 optionally rotates an unlimited number of times and power is wirelessly transferred to a current-limited high-voltage supply mounted underneath the turntable 201. The turntable 201 for example optionally comprises multiple zones of electroadhesion on its surface 239. Each zone is independently actuated and controlled. Wireless communication between the electroadhesion surface 239 and the high-voltage supply occurs via NFC or other RFID communications for example. In some instances, communication between the electroadhesion surface 239 and the high-voltage supply alternatively or in combination occurs by wired or sprin-loaded pin contact. The operator and appliance cover are not shown for clarity.

Figure 2C:
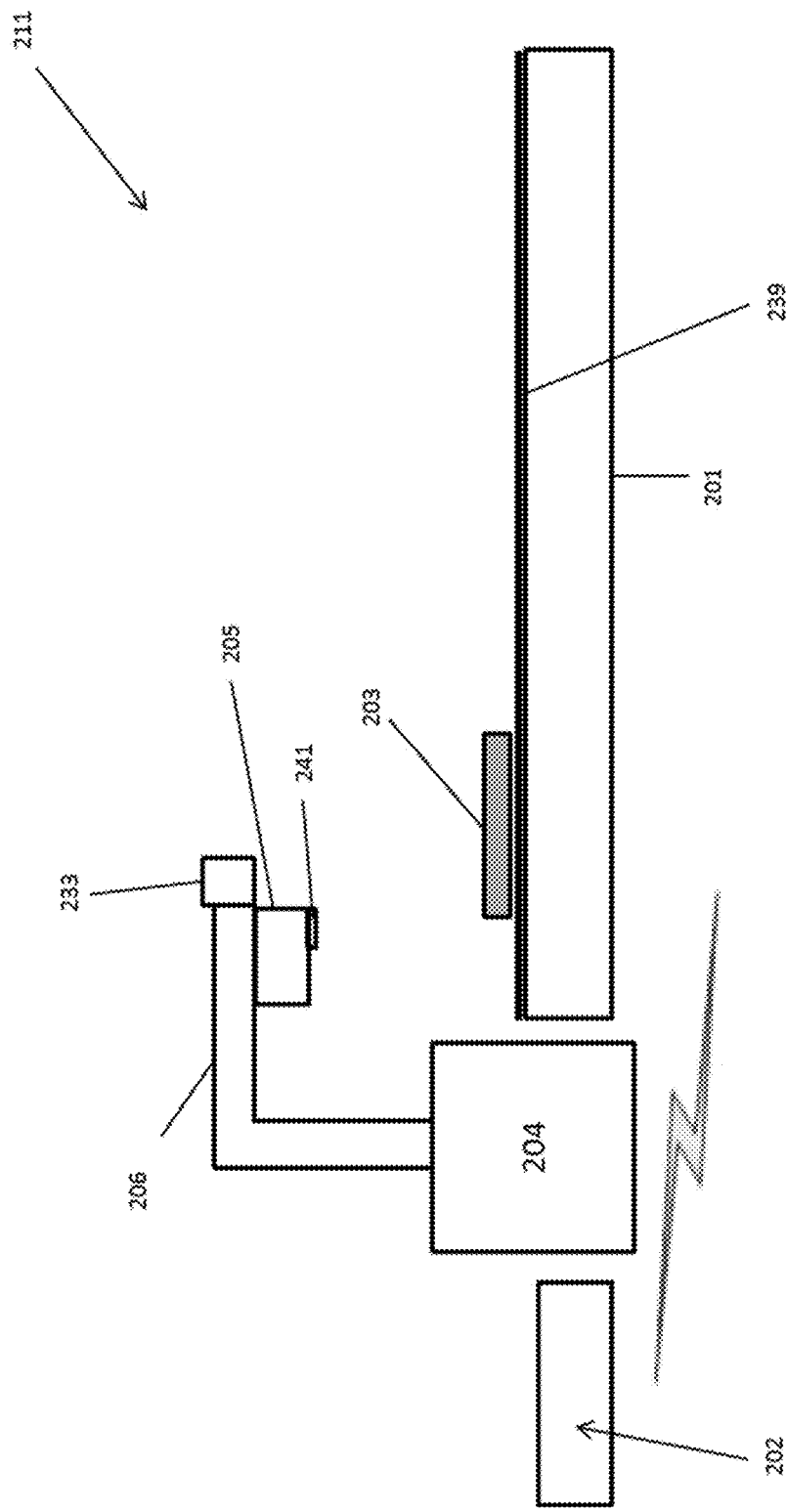
FIG. 2C shows a schematic of a portion of an electroadhesion manufacturing system comprising the robot-side of the first platform, robotic actuator, and second platform.

FIG. 2C shows an embodiment of the robot-side 211 of an electroadhesion manufacturing system comprising a first platform 201, a robotic actuator 206 coupled to a capture element 205, and a second platform 202. The first platform 201 for example optionally comprises a transparent or translucent turntable. The surface 239 of the turntable 201 for example is frosted. An electroadhesion gripper 204 comprising a robotic actuator 206 and a capture element 205 is disposed between the first platform 201 and the second platform 202. The second platform 202 for example is a conveyor. The robotic actuator 206 for example optionally comprises a robotic arm. The capture element 205 for example optionally comprises an electroadhesion surface or plate. A downward facing camera 233 is disposed on the robotic arm 206. Said downward facing camera 233 is used to take an image of the final assembled article to determine if the assembled article is within placement tolerances. In some embodiments, the gripper 204 for example includes article presence sensing. The gripper 204 optionally further comprises an ultrasonic welder 241 attached to the robotic arm 206. The system components are wirelessly connected to the controller 215 for example.

Figure 2D:
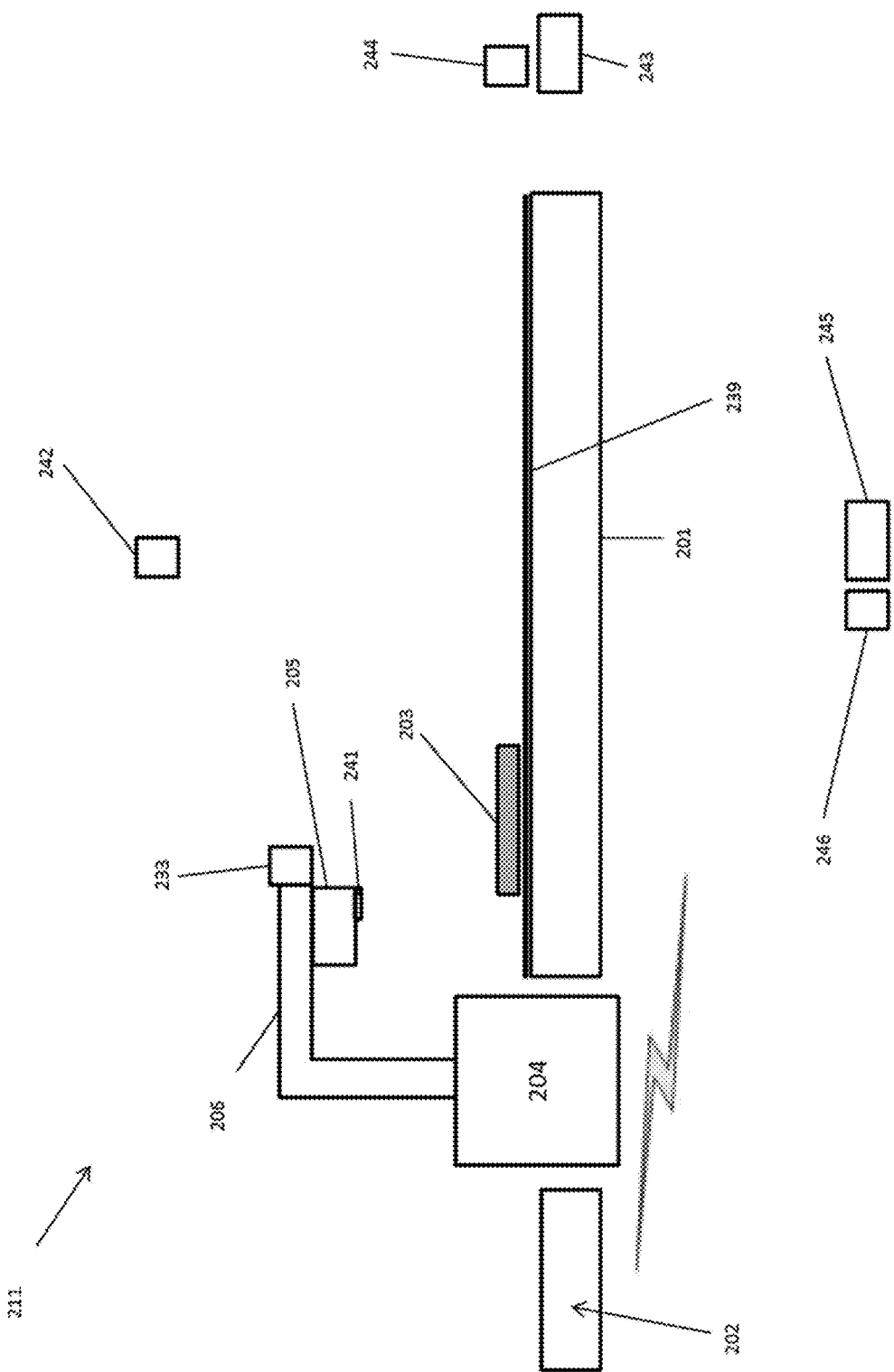
FIG. 2D shows a schematic of another embodiment of a portion of an electroadhesion manufacturing system comprising the robot-side of the first platform, robotic actuator, and second platform.

FIG. 2D shows another embodiment of the robot-side 211 of an electroadhesion manufacturing system comprising a first platform 201, a robotic actuator 206 coupled to a capture element 205, and a second platform 202. The first platform 201 for example optionally comprises a transparent or translucent turntable. The surface 239 of the turntable 201 for example is frosted. An electroadhesion gripper 204 comprising a robotic actuator 206 and a capture element 205 is disposed between the first platform 201 and the second platform 202. The second platform 202 for example is a conveyor. The robotic actuator 206 for example optionally comprises a robotic arm. The capture element 205 for example optionally comprises an electroadhesion surface or plate. A downward facing camera 233 is disposed on the robotic arm 206. Said downward facing camera 233 is used to take an image of the final assembled article to determine if the assembled article is within placement tolerances. In some embodiments, the gripper 204 for example includes article presence sensing. The gripper 204 optionally further comprises an ultrasonic welder 241 attached to the robotic arm 206. In some embodiments, the robot-side 211 is for example comprised of one or more of an alignment recognition system, a material quality recognition system, and an assembly vision lighting control 242, for example an overhead bulb. The material quality recognition system for example comprises a camera 243 located beside the first platform 201 on the robot-side 211, and a lighting control system 244, for example a bulb. In some embodiments, the material quality recognition system is used to image one or more article components 203 and assess the quality of the one or more article components 203 for CTQ information. For example, the camera beside the first platform 243 is optionally able to determine if an article component 203 has been placed upside-down. The CTQ information is optionally communicated back to the controller 215. The controller 215 may for example use the generated CTQ information to halt the manufacturing process if the CTQ information is outside of pre-programmed acceptable limits and return the article components 203 to the operator for removal and placement of new article components 203. The alignment recognition system for example comprises a camera 245 placed below the first platform 201 on the robot-side 211, and a lighting control 246, for example a bulb. The alignment recognition system is optionally used to determine the placement of the article components 203 following transfer to the robot-side 211. In some embodiments, backlighting of the turntable 201 by the overhead light source 242 allows the camera 245 to capture crisp images of the article component 203 for precise location determinations. The system components are wirelessly connected to the controller 215 for example.

Figure 3A:
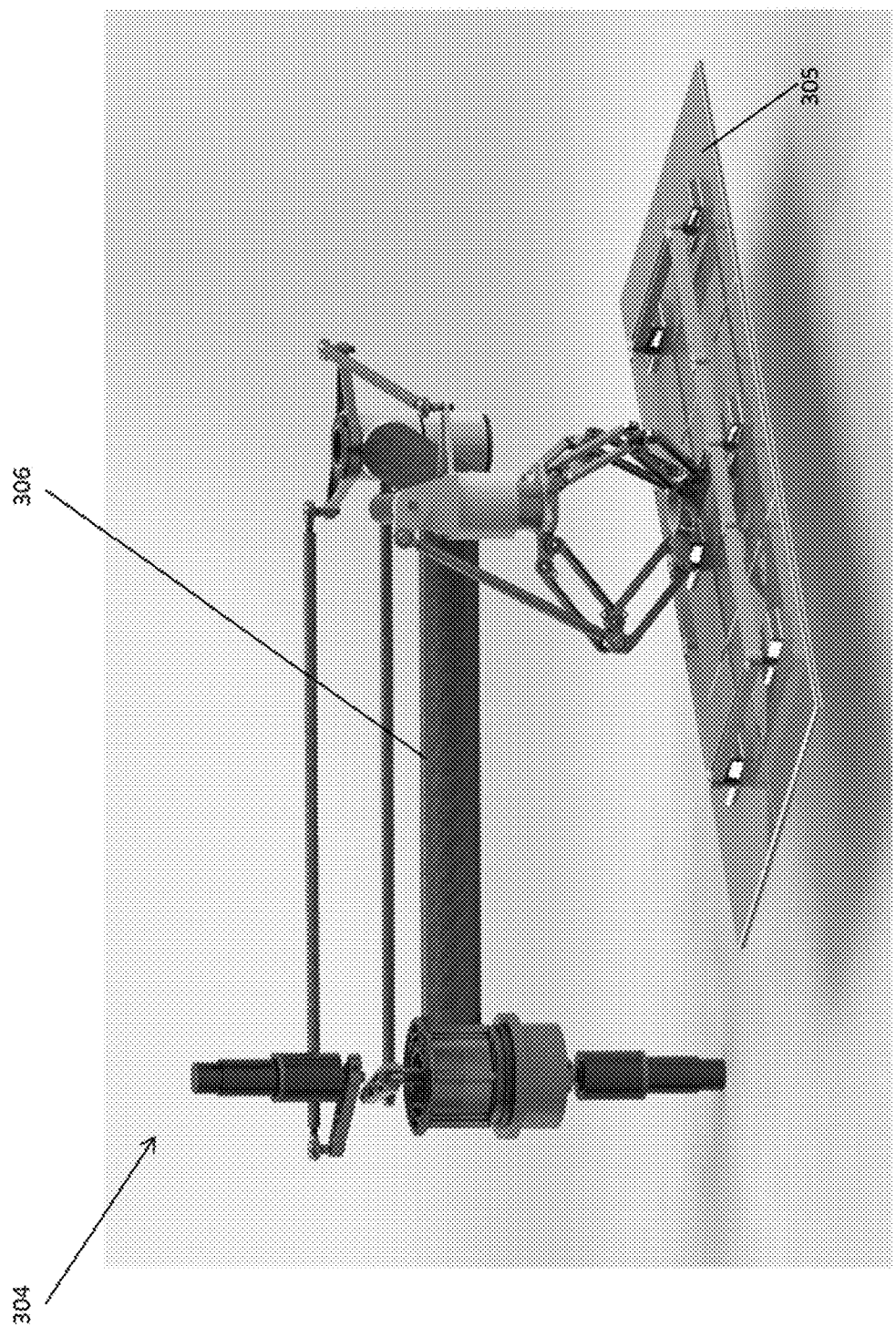
FIGS. 3A-3B illustrate perspective views of the front (FIG. 3A) and back (FIG. 3B) of an embodiment of an electroadhesion gripper comprising a robotic actuator and an electroadhesion capture element.
Figure 3B:
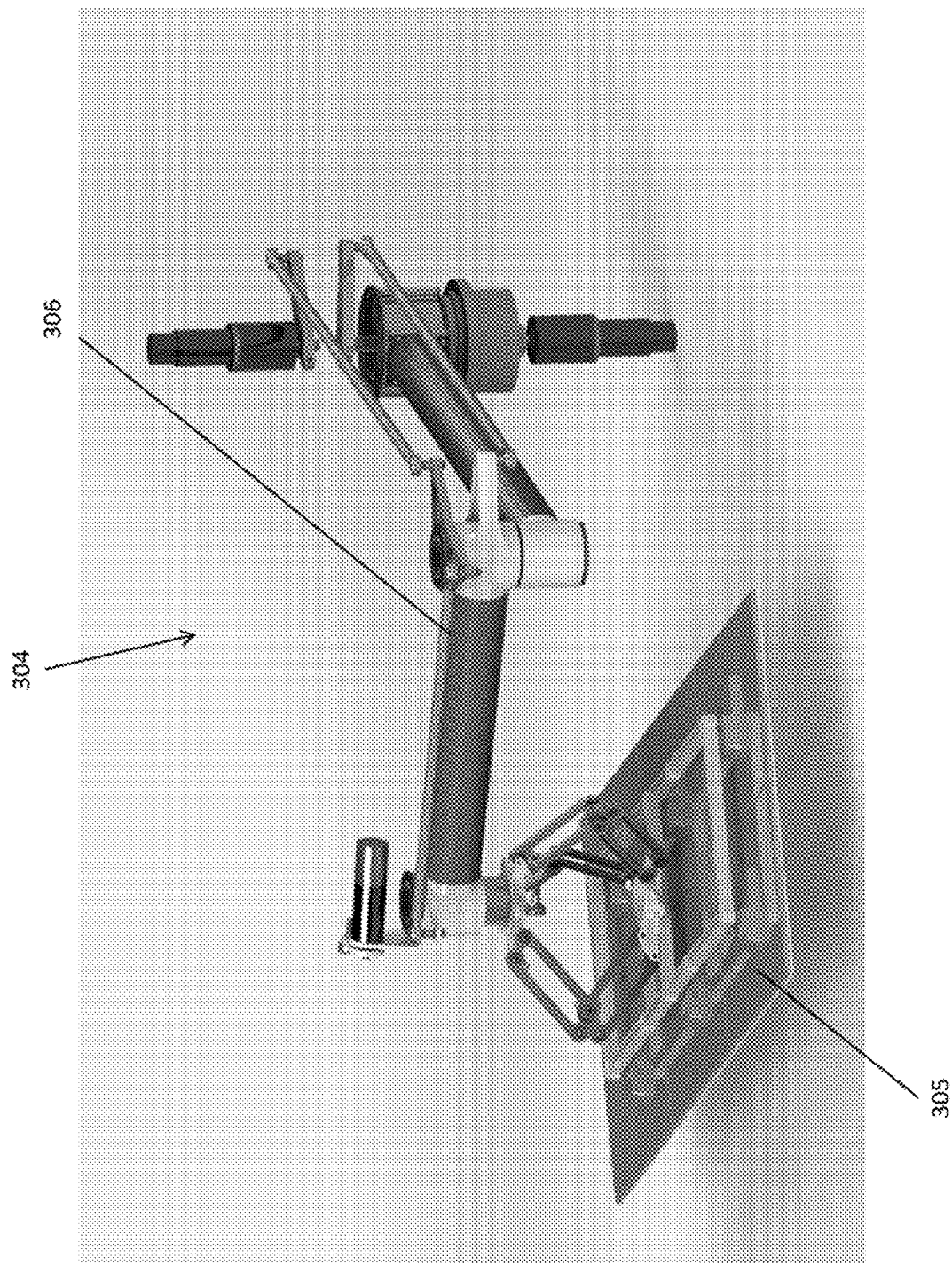

FIGS. 3A-3B illustrate 180° rotated views of an embodiment of an electroadhesion gripper 304 comprising a robotic actuator 306 and an electroadhesion capture element 305. The robotic actuator 306 for example optionally comprises a robotic arm operatively coupled to the capture element 305 such that movement of the robotic arm 306 moves the capture element 305. The capture element 305 comprises an electroadhesion surface or plate. In some embodiments, the robotic arm 306 comprises high-stiffness, light-weight, carbon fiber construction to achieve high-throughput in the assembly process without vibration which could cause article placement variation during assembly. For example, the robotic arm 306 has structural resonances that are in excess of 40-50 Hz as otherwise the movement control system has difficulty in achieving short moves without overshot and ringing that would otherwise cause placement errors. In some embodiments, other types of robotic arms 306, including commercial off-the-shelf robots, robots with lower structural resonances, or combination of actuated movement are also contemplated in the current disclosure.

Figure 4:
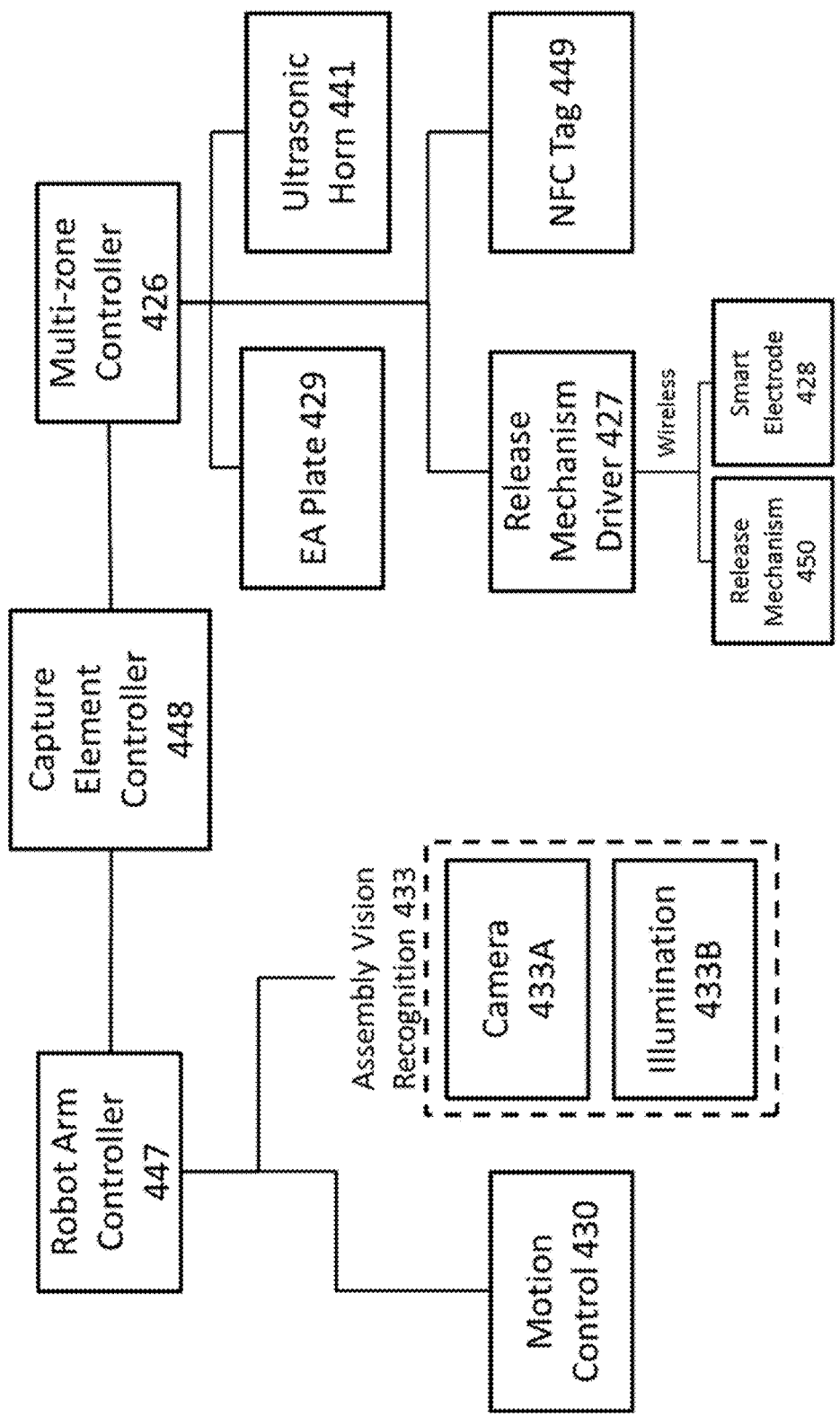
FIG. 4 shows a schematic diagram of an embodiment of an electroadhesion gripper.

FIG. 4 shows a box diagram of an embodiment of an electroadhesion gripper apparatus. The electroadhesion gripper comprises a robotic actuator and a capture element, for example an electroadhesion surface or plate. The electroadhesion plate optionally further comprises one or more individually controllable zones of the electroadhesion. The electroadhesion plate for example comprises a single electroadhesion zone. Alternatively, the electroadhesion plate comprises two electroadhesion zones. It will be understood by one skilled in the art that the electroadhesion plate comprises as many electroadhesion zones as required for the manufacture of an article from a plurality of article components. In some embodiments, the electroadhesion zones are separable from one another such that the electroadhesion plate has replaceable segments or zones.

The electroadhesion gripper comprises a capture element controller 448 in communication with the robotic actuator controller 447 comprising systems for motion control 430 and assembly vision recognition 433 as previously described herein. The assembly vision recognition system 433 for example optionally comprises a camera. The assembly vision recognition system 433 for example optionally comprises a camera 433A and a source of illumination 433B. The capture element controller 448 is optionally in communication with the multi-zone controller system 426. The multi-zone controller system 426 individually controls the actuation of the electroadhesion zones in some embodiments, for example by Near-field or other RFID communication (NFC) 449 with a smart electrode 428 incorporated into the zone-specific electrode. The multi-zone controller 426 is further in communication with one or more of an ultrasonic horn 441 on the robotic arm and a release driver mechanism 427 operatively connected to a release mechanism 450 to facilitate linear actuation of the ultrasonic horn 441 as shown in FIGS. 11-14.

FIGS. 5A-5H illustrate an embodiment of an electroadhesion manufacturing system in action. The electroadhesion system comprises a first platform 501, an electroadhesion gripper 504 comprising a robotic actuator 506 coupled to a capture element 505, and a second platform 502. The first platform 501 for example is a turntable. The second platform 502 for example is a conveyor. The robotic actuator 506 for example optionally comprises a robotic arm. The capture element 505 for example optionally comprises an electroadhesion surface or plate. The electroadhesion surface 505 optionally further comprises one or more individually actuating electroadhesion zones, for example a first electroadhesion zone and a second electroadhesion zone. The system is substantially similar to any of the embodiments described herein.

Figure 5A:
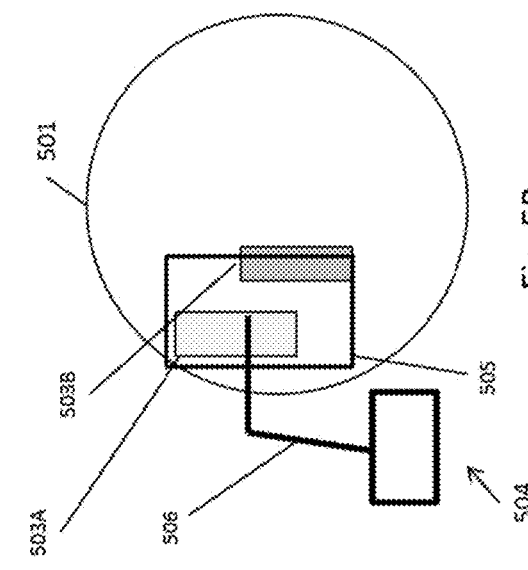
Figure 5B:
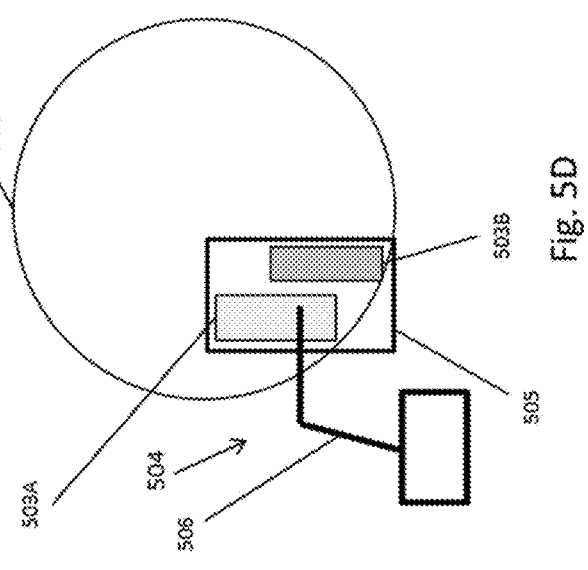
Figure 5C:
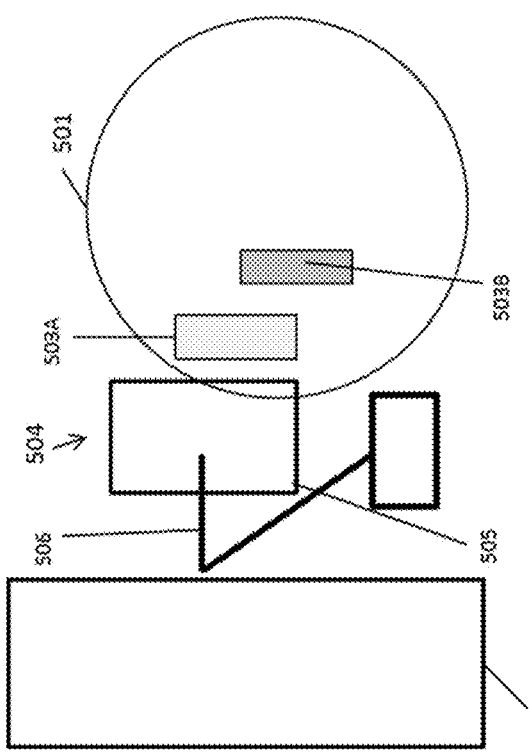
Figure 5D:
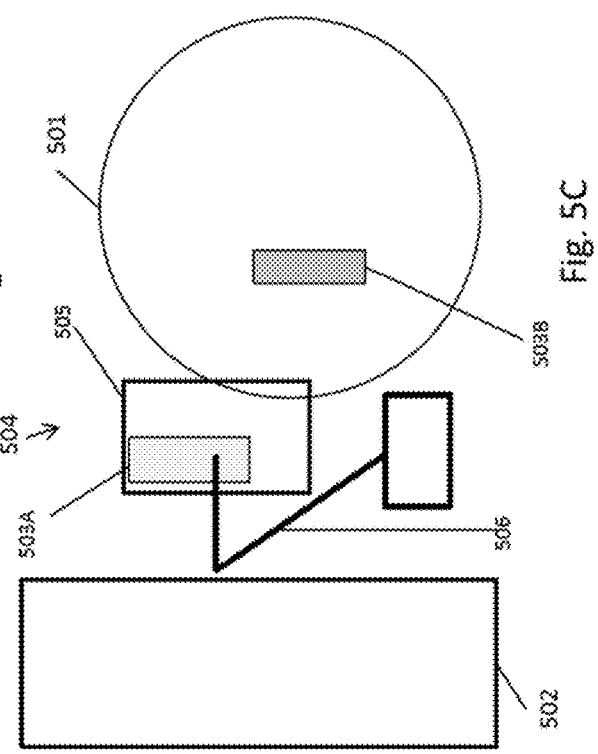

FIG. 5A shows the electroadhesion manufacturing system after a first 503A and a second article component 503B on a first platform 501 have been delivered to the robot-side. FIG. 5B shows the electroadhesion gripper 504 moving to capture the first article component 503A. In some embodiments, the system for example recognizes the first and the second article components 503A, 503B with an automated visualization system. In some embodiments, the system for example recognizes one or more of the orientation and location of the first and the second article components 503A, 503B. Alternatively or in combination, the system for example recognizes a first and a second predetermined capture location on the first platform 501 using an automated visualization system and precisely positions the gripper 504 so as to capture the first article component 503A from the first predetermined capture location. Capture of the first article component 503A optionally further comprises activating the first electroadhesion zone but not the second electroadhesion zone. FIG. 5C shows the electroadhesion gripper 504 selectively picking up the first article component 503A but not the second article component 503B. FIG. 5D shows the electroadhesion gripper 504 moving to capture the second article component 503B. The system for example precisely positions the gripper 504 so as to capture the second article component 503B from the second predetermined capture location. Capture of the second article component 503B optionally further comprises activating the second electroadhesion zone while maintaining activation of the first electroadhesion zone so as to have both the first and the second article components 503A, 503B captured by the gripper 504 simultaneously as shown in FIG. 5E. FIG. 5F shows the system after the electroadhesion gripper 504 has moved the first and second article components 503A, 503B to a position above the second platform 502. The system for example optionally recognizes a first and a second predetermined location on the second platform 502 using an automated visualization system and positions the robotic actuator 506 so that the first article component 503A is precisely placed over the first predetermined location. The gripper 504 releases the first article component 503A by deactivating the first electroadhesion zone while maintaining activation of the second electroadhesion zone so as to selectively release the first article component 503A but not the second article component 503B. FIG. 5G shows the release of the first article component 503A onto the second platform 502 while the second article component 503B is retained on the electroadhesion gripper 504. FIG. 5H shows the release of the second article component 503B onto the second platform 502. The system for example positions the robotic actuator 506 so that the second article component 503B is precisely placed over the second predetermined location. The system for example uses the position information acquired by one or more cameras on the operator-side. Alternatively or in combination, the system determines the placement of the first article component 503A at the second platform 502 using a gripper-mounted camera and adjusts the position of the robotic actuator 506 such that the second article component 503B is precisely placed at the second predetermined location relative to determined placement of the first article component 503A. The gripper 504 optionally releases the second article component 503B by deactivating the second electroadhesion zone to form at least a portion of an assembled article. In many embodiments, the system further detects the presence of one or more of the first or second article components 503A, 503B with a "smart" electrode as described further herein.

In many embodiments, the first and second article components 503A, 503B are placed at the first and second predetermined capture locations such that the gripper 504 simultaneously captures the first and the second article components 503A, 503B by simultaneously activating both of the first and the second electroadhesion zones.

In some embodiments, the capture element is configured to individually activate regions therein such that sequential capture or sequential release is accomplished. When electroadhesion is combined with other pick-up modalities such as application of negative pressure or mechanical release or ejection, the capture element is configurable to individually activate each modalities (and/or each modality within a region) such that sequential capture or sequential release is accomplished. In instances where the gripper 504 simultaneously captures and then sequentially releases the first and second article components 503A, 503B the number of time-consuming steps, which include one or more of large robotic actuator motions and information acquisition by the vision recognition system, are shared across many components of the electroadhesion manufacturing system. In instances where the gripper 504 sequentially captures and then simultaneously releases the first and second article components 503A, 503B the number of time-consuming steps, which include one or more of large robotic actuator motions and information acquisition by the vision recognition system, are shared across many components of the electroadhesion manufacturing system. In these cases, high-throughput is enabled by using fewer robotic actuators (in many cases one as described herein) and/or fewer vision recognition components (for example one camera as described herein) than conventional systems. High-throughput is thus achievable at lower cost, without high-speed robotic actuators, and/or without multiple robotic actuators working in parallel to assemble a single article (or a portion or a single article).

Figure 6:
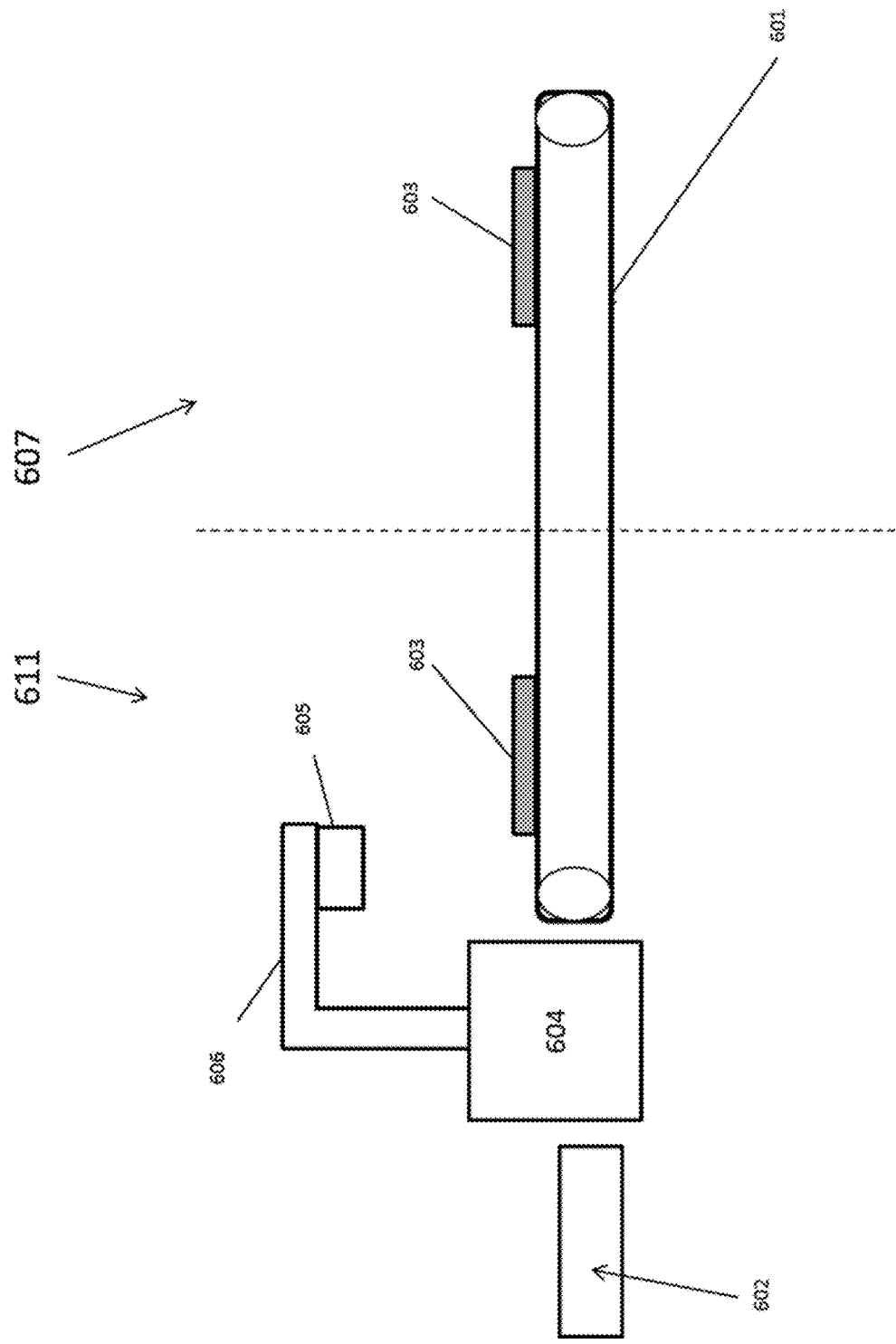
FIG. 6 shows a schematic of yet another embodiment of an electroadhesion manufacturing system wherein the first platform comprises a conveyor.

FIG. 6 shows yet another embodiment of an electroadhesion manufacturing system wherein the first platform 601 comprises a conveyor. The system for example is substantially similar to any of the embodiments described herein but for the first platform 601 comprising a conveyor. One or more article component 603 is placed by a user on the operator-side 607 with guidance from the system as previously described herein. Upon confirmation of proper placement, the conveyor 601 is activated so as to convey the one or more article component 603 to the robot-side 611 for capture by the electroadhesion gripper 604 and release at the second platform 602 as previously described herein.

In many embodiments, visual alignment is accomplished on the operator-side 607 of the first platform 601. No additional visual alignment is needed in many embodiments because the kinematic coordinate transformation between the visual alignment coordinate system (via the one or more cameras) and the gripper 604 are calibrated. These embodiments reduce article assembly time as no visual alignment steps are required at the robot-side 611 between the time of article component 603 acquisition from the first platform 601 and placement at the second platform 602.

In many embodiments, visual alignment of a second article component onto a first article component is accomplished by locating the first article component based on information derived from at least one of an outline of a part, intra-part holes or mesh patterns, and a visual pattern applied to the surface of a part. The visual pattern for example includes a fiducial deliberately applied to the part or a decorative pattern, for example plaid, checkered, and other patterns.

The various elements of the electroadhesion manufacturing systems and apparatus described herein are optionally interconnected and integrated with one another to provide improved manufacturing workflow and efficiency. The input system can take information directly from a CAD or CAM file and use that information to plan how the article should be assembled from the article components. The plan is then optionally converted into a series of pick and place steps, a user-placement location map is generated to guide the user, and the user-placement locations are optionally projected to the user to guide article component placement. The user-placement locations are the same as the capture locations described herein. The imaging system can additionally use such information about the placement locations to determine if an article component has been placed correctly (or approximately correctly) but the user. The gripper zones can then "know", based on the pick and place steps determined from the input, which article component should be in which pre-determined capture location and which article component should be placed in which predetermined location on the second platform. The systems and apparatus optionally further comprise pre-set levels of electroadhesion (and/or vacuum, mechanical ejection, etc.) based on the article component. It will be understood by one of ordinary skill in the art that properties of the article, for example the material, shape, size, or other parameters, may be used to determine how much voltage to apply to the electrodes, how much force to apply with the robotic actuator, how much negative pressure to apply (in the case where the systems described herein is combined with a vacuum system), etc. The systems and apparatus optionally further comprise part placement tolerance levels (for example CTQ information) and pre-set One or more of the controllers described can monitor, plan the pick-up and placement locations of parts from the CAD files or other input, plan the pick-up and placement steps to be performed by the gripper (for example plan which article for the user to place where, which article to pick up from the first platform when, which article for the gripper to place on the second platform where, and which article to place on the second platform when), and the timing of each step in the process.

In some applications common in shoe and apparel manufacturing, for example when the article comprises one or more article components laid into customized pockets in a fixture, for example a plate, the visual alignment system locates the fixture and confirms that the fixture has been fully loaded with article components by the operator. If, for example, the fixture is too heavy to be acquired by electroadhesion, only the parts are acquired when electroadhesion is activated. Given the fixture tolerance, the geometric relationship between the article components is precisely defined; therefore the captured article components are placed in one movement of the robotic actuator at a location predetermined by the visual alignment system measurement of fixture placement on the operator-side.

In some applications common in shoe and apparel manufacturing, for example those that incorporate sewing processes, where the article comprises article components integrated into fixtures or where the article is itself a fixture or template, the fixture or template is designed so that it can be acquired by electroadhesion. The fixture or template and the article components are placed on the first platform together by the operator, for example side-by-side or overlaid onto one another. The fixture is used to hold down parts that lay below it so that said parts aren't disturbed by sewing force disturbances. In some embodiments, when article components are placed onto a pocketed fixture in a stacking operation, the robotic gripper is arranged to employ a finger actuator to push the parts into the fixture pockets.

In some applications common in shoe and apparel manufacturing, for example those that incorporate hot melt fusing for instance, the gripper for example comprises one or more of a plurality of ultrasonic weld actuator components. In some embodiments, a heating element or Infra-red element is used in place of an ultrasonic welder. Activation of the ultrasonic welder following release of the second article component onto the first article component temporarily fuses the article components together if one or more of the article components are impregnated with a hot-melt or other adhesive. In some embodiments, the ultrasonic welder is activated prior to release of the second article component onto the first article component. In some embodiments, the ultrasonic welder is activated before the capture element is moved away from the first and second article components. Said tack weld is used for example to prevent dislodging of the article components when transferred to or at a downstream manufacturing apparatus, for example when traveling through hot rollers or when in transit from one manufacturing apparatus to another. In some embodiments, an ultrasonic welder is optionally embedded in each of the electroadhesion zones such that the tack weld is accomplished without additional motion of the robotic actuator following release of the article components on the second platform. In some embodiments, one or more ultrasonic welder is for example mounted on the gripper and is used selectively by moving the gripper-attached welder to a pre-defined tack weld location.

In some embodiments, the second platform is embedded with complementary electroadhesion or passive fixture onto which the parts are placed. This fixture is moved by process equipment to accomplish specific assembly operations. For example, the fixture is optionally employed to stabilize the article components above it on the second platform or to ensure that the article components above it on the second platform lay flat during the subsequent processes.

FIGS. 7A-7D show further embodiments of an electroadhesion manufacturing system wherein article components 703 are assembled by actuation of a second platform 702 by a robotic actuator 706. The electroadhesion manufacturing system comprises one or more of a first platform 701 to receive an article component 703, a second platform 702 configured to receive the article component 703 from the first platform 701, an imaging system 724 configured to identify the article component 703 received on the second platform 702 and determine a position of the article component 703 received on the second platform 702, and a controller configured to reposition the second platform 702 in response to one or more of the identified article component and the determined position thereof prior to receiving the article component 703 from the first platform 701. The second platform 702 for example is a mechanized conveyor.

Figure 7A:
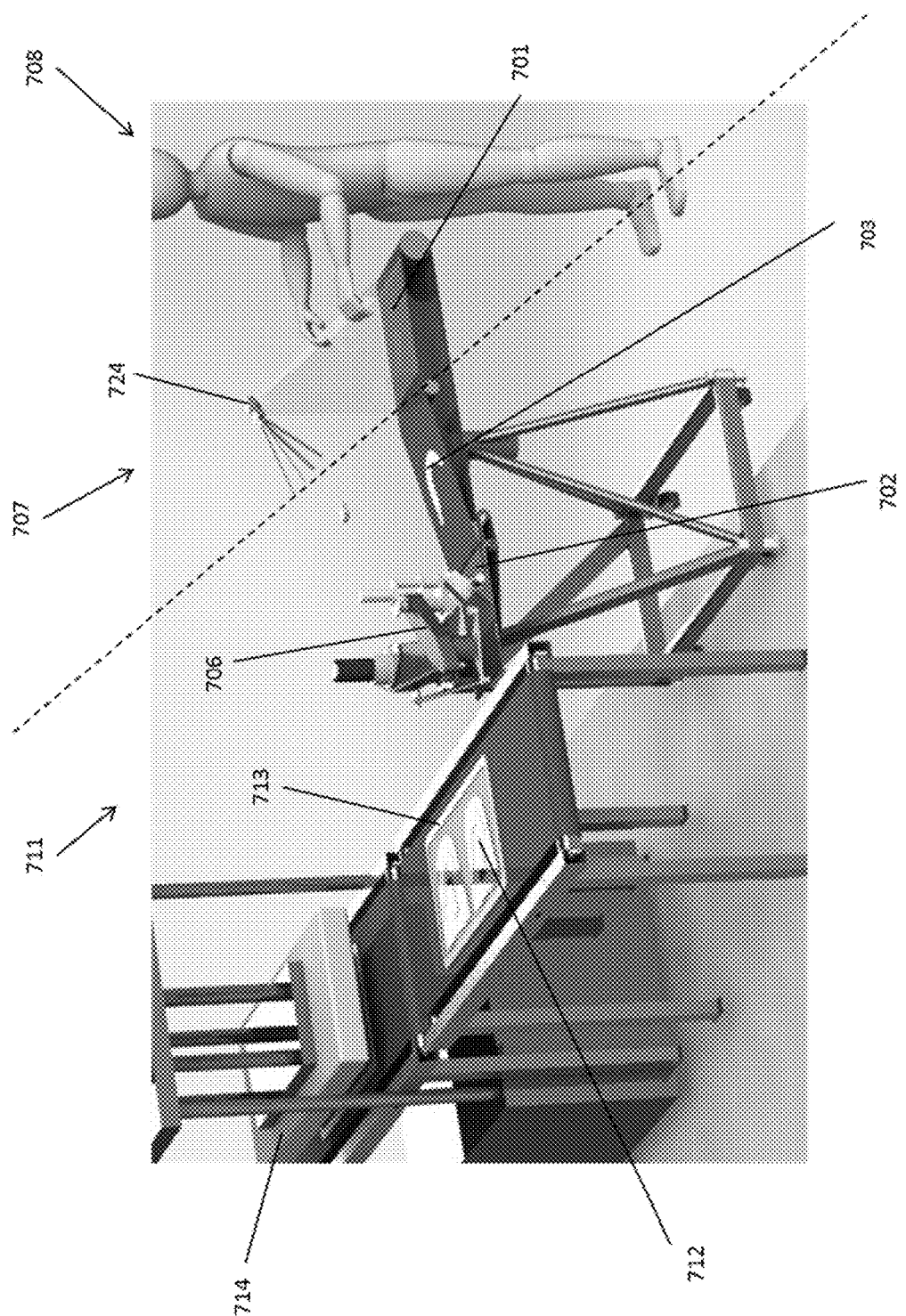
Figure 7B:
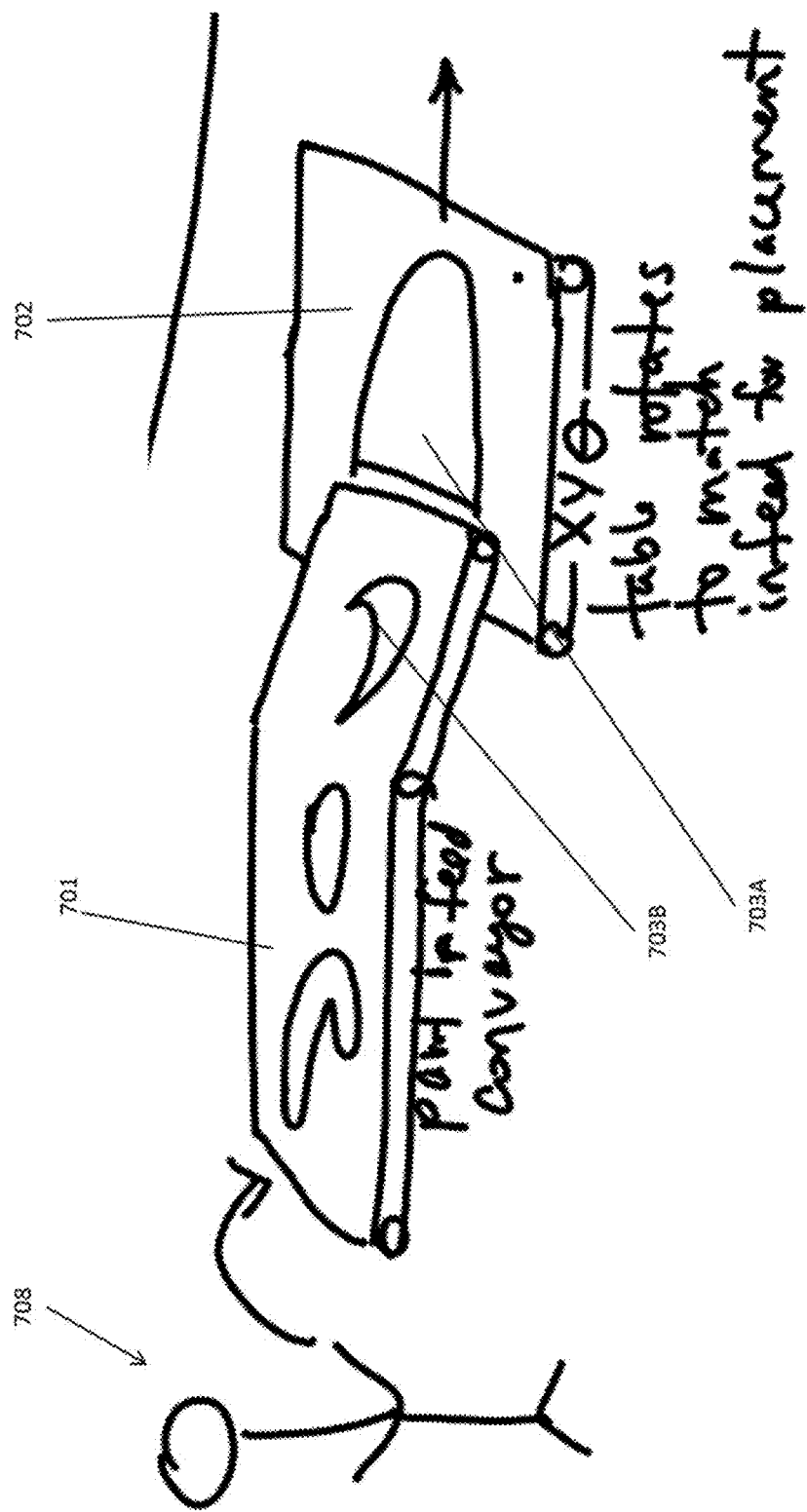

FIGS. 7A-7B illustrate an embodiment of a manufacturing system wherein article components 703 are placed on the first platform 701 and conveyed to the second platform 702. An operator 708 places an article component 703 on the first platform 701. The first platform 701 for example is a conveyor. The conveyor 701 for example comprises a thin edge or sharp corner that makes the conveyor 701 extremely close to the second platform 702, thus allowing for higher placement accuracy. The imaging system 724 identifies the article component 703 received on the first platform 701 and determines the position of said article component 703 on the first platform 701. The imaging system 724 for example optionally comprises an overhead camera positioned overhead one or more of the first and second platform 701, 702. The second platform 702 is repositioned in response to one or more of the identified article component and the determined position thereof in order to receive the article component 703 from the first platform 701 onto a predetermined location on the second platform 702. Repositioning the second platform 702 for example optionally comprises one or more of moving the second platform 702 along a first horizontal axis, moving the second platform 702 along a second horizontal axis orthogonal to the first horizontal axis, moving the second platform 702 along a vertical axis orthogonal to the first and second horizontal axes, rotating the second platform 702 about the vertical axis, and tilting the second platform 702. Repositioning the second platform 702 in response to one or more of the identified article component and the determined position thereof comprises moving a robotic actuator 706, for example a robotic arm, in operative communication with the controller and coupled to the second platform 702.

These steps are repeatable for any number of article components 703 in order to generate a stack of article components 712. The stack of article components 712 for example optionally comprises at least a portion of an article. The assembled stack of article components 712 is further fed onto a downstream manufacturing apparatus 714, for example a fusion press as depicted herein. The article component 703 for example optionally comprises a textile piece, a shoe part, an automotive part, a machinery part, or a circuitry part. The assembled article 712 comprises, respectively, at least a portion of an article of clothing, at least a portion of a shoe, at least a portion of a machine, or at least a portion of a circuit. In some embodiments, one or more of a first and second article components 703A, 703B include a rigid machined template plate with holes or slots cut out to accommodate a sewing needle in an semi-automated sewing machine.

FIG. 7C shows a blown up view of the robotic actuator 706 and second platform 702. The assembled article 712 for example is fed from the second platform 702 onto a tray 713 for conveyance to a downstream manufacturing apparatus 714.

In some embodiments, one or more of the first and second platforms 701, 702 comprises an electroadhesion surface. For example, in some embodiments one or more of the first and second platforms 701, 702 is embedded with electroadhesion electrodes. Activation of electroadhesion at one or more of the first and second platforms 701, 702 enables high acceleration and/or high-speed transfer of article components 703 from the first platform 701 to the second platform 702 without dislodging the article components 703 by slipping or flying off.

Figure 7D:
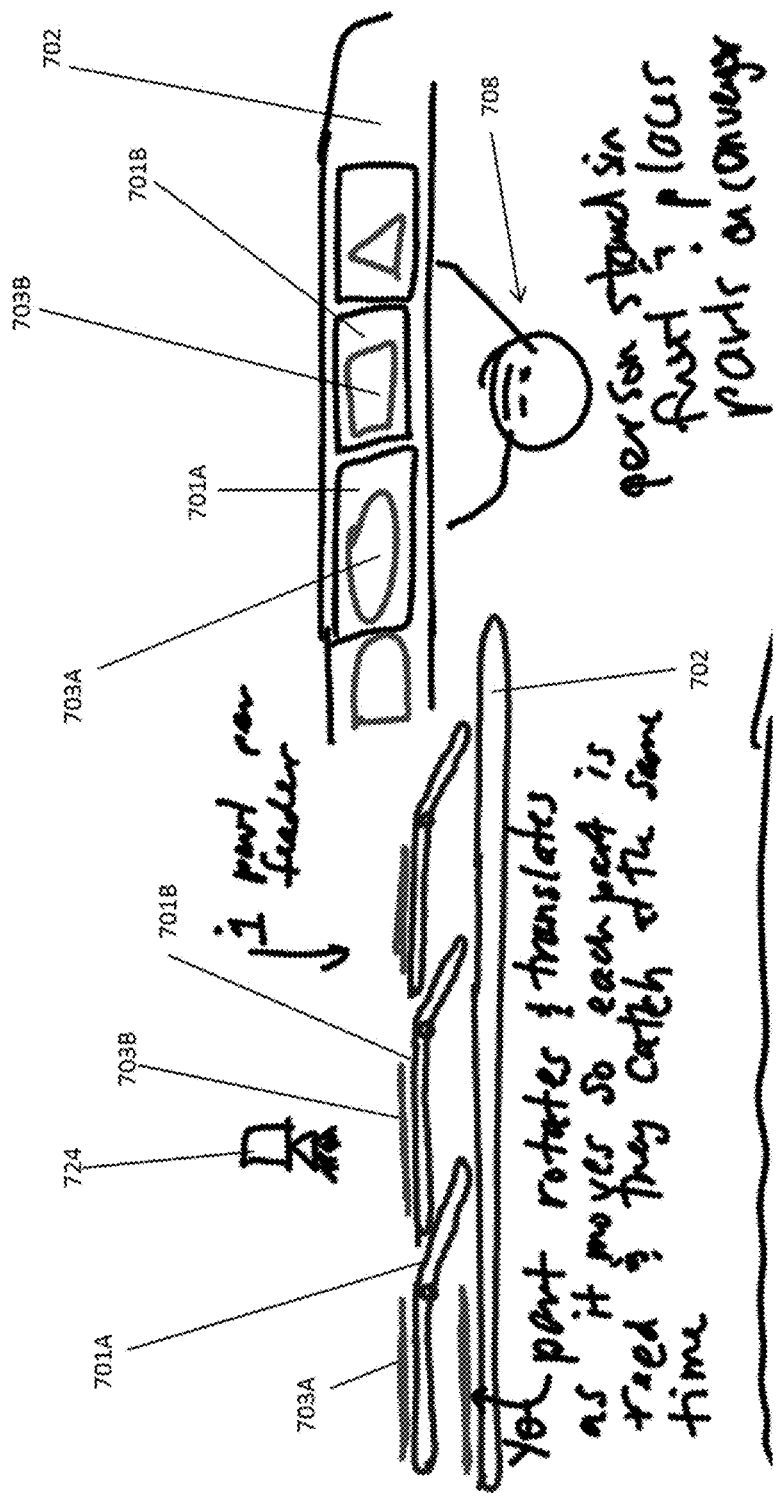

FIG. 7D shows another embodiment of an electroadhesion manufacturing system wherein multiple article components 703 are fed onto multiple first platforms 701 and conveyed to a moving second platform 702 below. One or more of a first platform 701 is configured so as to receive one or more of an article component 703 from an operator 708. The first platform 701 for example optionally comprises a conveyor. The first platform 701 for example has a sharp edge above the second platform 702 such that the two are very close together. In some embodiments, the system comprises a first conveyor 701A and a second conveyor 701B situated above a second platform 702. The second platform 702 comprises a conveyor. The first conveyor 701A and the second conveyor 701B are for example aligned in the direction of travel of the second platform 702 located below. The second platform 702 has continuous or intermittent motion to facilitate receiving of the one or more article components 703 from the first and second conveyors 701A, 701B. The imaging system 724 identifies a first article component 703A received on the first conveyor 701A and determines the position of said article component 703A on the first conveyor 701A. The imaging system 724 for example optionally comprises a camera positioned overhead one or more of the one or more first platform 701 and the second platform 702. The second platform 702 is positioned in response to one or more of the identified article component and the determined position thereof in order to receive the first article component 703A from the first conveyor 701A. Repositioning the second platform 702 for example optionally comprise one or more of moving the second platform 702 along a first horizontal axis, moving the second platform 702 along a second horizontal axis orthogonal to the first horizontal axis, moving the second platform 702 along a vertical axis orthogonal to the first and second horizontal axes, rotating the second platform 702 about the vertical axis, and tilting the second platform 702. Repositioning the second platform 702 in response to one or more of the identified first article component and the determining position thereof comprises moving a robotic actuator 706, for example a robotic arm, in operative communication with the controller and coupled to the second platform 702.

These steps are repeatable for any number of article components 703 in order to generate a stack of article components. For example, the imaging system identifies a second article component 703B received on the second conveyor 701B and determines the position of said article component 703B on the second conveyor 701B. The second platform 702 is repositioned in response to one or more of the identified second article component and the determined position thereof in order to receive the second article component 703B from the second conveyor 701B. The stack of article components 712 for example optionally comprises at least a portion of an article. The assembled stack of article components 712 is further fed onto a downstream manufacturing apparatus 714, for example a fusion press as depicted herein. The article component 703 for example comprises a textile piece, a shoe part, an automotive part, a machinery part, or a circuitry part. The article 712 for example comprises, respectively, at least a portion of an article of clothing, at least a portion of a shoe, at least a portion of a machine, or at least a portion of a circuit.

Figure 8A:
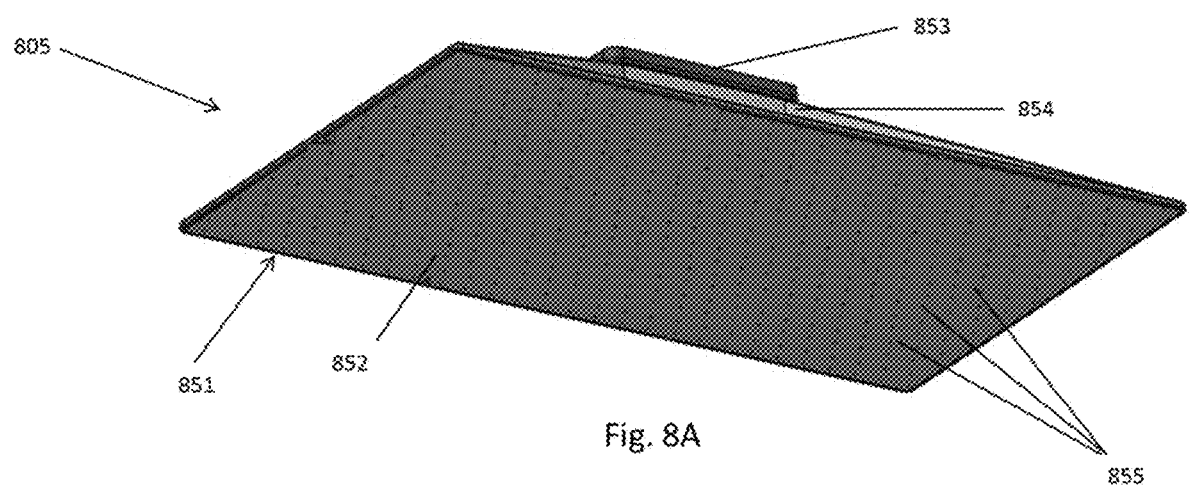
FIGS. 8A-8C illustrate perspective views of various embodiments of an electroadhesion gripper.
Figure 8B:
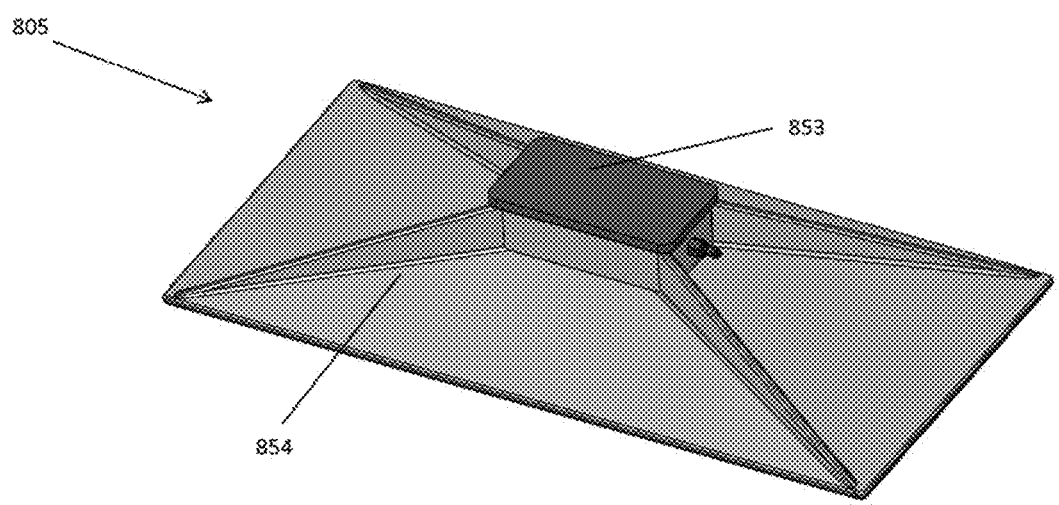
Figure 8C:
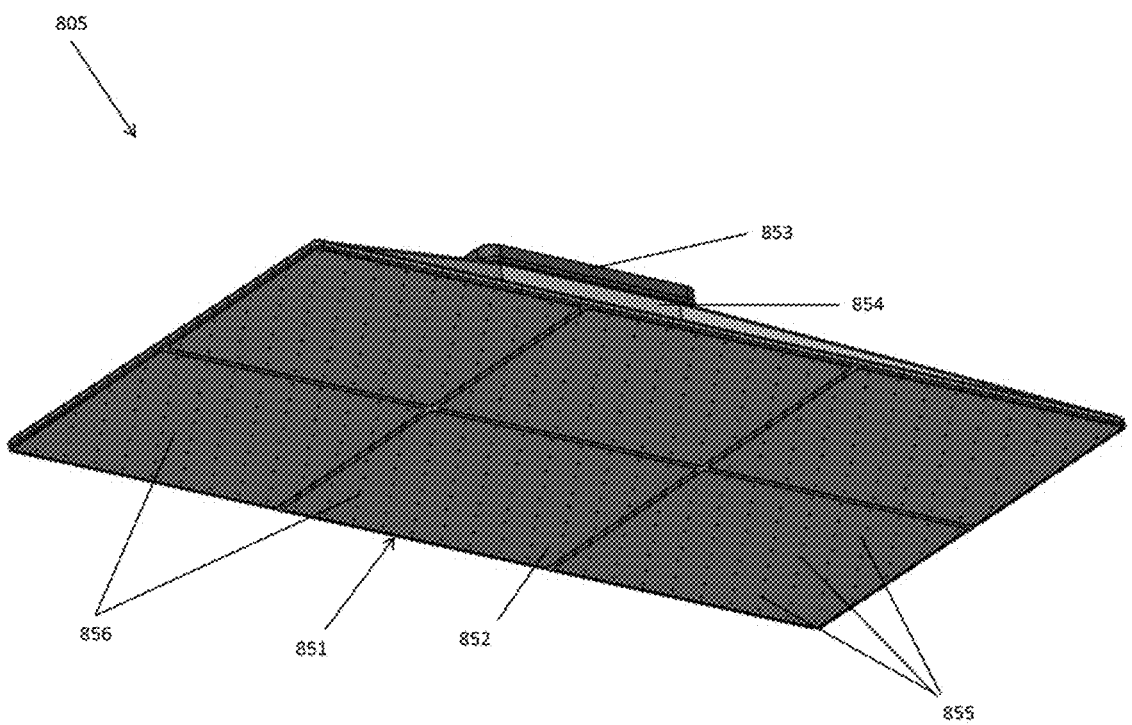

FIGS. 8A-8C illustrate various embodiments of an electroadhesion gripper. The electroadhesion gripper apparatus 805 comprises an electroadhesive plate 851 having a contact surface 852 for capturing one or more target objects (also referred to herein as article components) with electroadhesion, the electroadhesive plate 851 comprising a one or more electroadhesive zones 856, wherein electroadhesion in each electroadhesive zone 856 is separately activated and a controller (as described further herein) configured to individually activate or deactivate electroadhesion in each of the electroadhesive zones 856. FIG. 8A shows an embodiment of an electroadhesion gripper with a single electroadhesion zone 856. The electroadhesion plate 851 comprises a plurality of electrodes 855 and is operatively attached to the robotic actuator. FIG. 8B shows a top view of the embodiment of FIG. 8A highlighting the housing 854 and connection to the robotic actuator 853. FIG. 8C shows an exemplary embodiment of an electroadhesion gripper with multiple electroadhesion zones 856 for selective capture and release of multiple article components. In many embodiments, this multi-zone implementation enables a single-pick of a plurality of article components off of the first platform followed by multiple individuated placements of each article component onto the second platform. The multi-zone implementation thereby reduces the number of motion segments needed to complete the assembled article when compared to accomplishing the assembly with a single-zone gripper. For example, the electroadhesion plate 851 comprises six (6) electroadhesion zones 856 as depicted herein. It will be understood however that the capture element 805 comprises any number of electroadhesion zones 856 depending on the manufacturing requirements of the article assembly.

Figure 9:
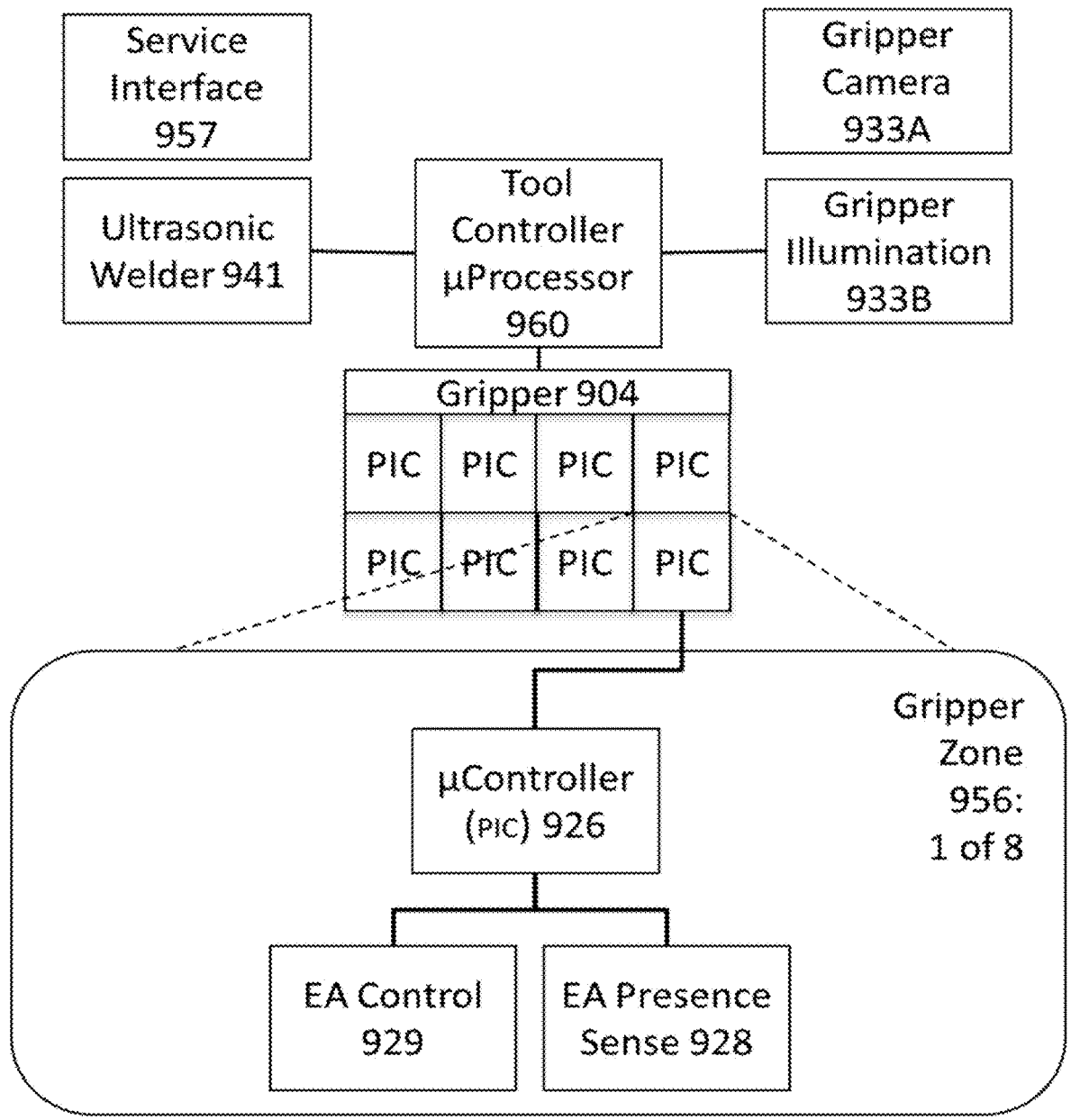
FIG. 9 shows a schematic diagram of an embodiment of an electroadhesion gripper with multiple electroadhesion zones with "smart" electrodes.

FIG. 9 shows a schematic diagram of an embodiment of an electroadhesion gripper 904 with multiple electroadhesion zones 956 with "smart" electrodes. A tool controller microprocessor 960 (also referred to herein as a Tool Controller), for example a multi-zone controller, is in communication with the master controller 215 as previously described herein, for example one or more of a service interface 957, an ultrasonic weld 941, a gripper camera 933A, and a gripper illumination system 933B. The camera 933A is attached to the gripper 904 but able to wirelessly transfer data to the supervisory controller (for example the Controller 215 in FIG. 2A) processor. A service interface 957 on the Controller 215 wirelessly receives data from the Tool Controller 960. The Tool Controller 960 is further in communication with the various components of each electroadhesion zone 956 on the electroadhesion gripper 904. The electroadhesion gripper 904 for example comprises a 2x4 rectangular array of eight (8) electroadhesion zones 956. Each electroadhesion zone 956 is further controlled by a dedicated microcontroller 926 in communication with one or more of the electroadhesion actuation control 929 and smart electrode 928 for electroadhesion article component presence sensing. Detecting the presence of an article component for example optionally comprises measuring at the one or more of the electroadhesive zones 956 one or more of electrode current, voltage, electrode admittance, and electrode impedance and recognizing a signal pattern in one or more of a AC and DC signal component of the measurement. The communication between the microcontroller 926 and the tool controller 960 for example is wireless.

The Tool Controller 960 is configured to communicate with the master system controller 215 in order to detect capture of one or more target objects in one or more electroadhesive zones 956 by a smart electrode 928. The smart electrode 928 for example optionally comprises a consumable cartridge that snaps into the multi-zone tool controller receptacle. The cartridge is considered consumable due to expected wear during repeated use due to high-voltage breakdown mechanisms. While a typical cartridge has two electrodes, in some embodiments the smart electrode cartridge comprises more than two electrodes in order yield a programmable electrode with a range of spatial frequencies. Each electrode has proprietary, low-cost, high-voltage supply which is surface-mounted onto the back side of the cartridge. In some embodiments power transfer from the tool controller 960 to the smart electrode 928 is achieved via inductive coupling. A microcontroller 926, for example a PIC microcontroller from Microchip, in each zone 956 controls the electrode voltage and monitors the presence sensing in each electrode, for example by monitoring the electrode current to detect capture and release of an article component. The tool controller 960 communicates to the zone's microcontroller 926 via NFC or other RFID standard. In this way, power, voltage commands and electrode current feedback are transmitted without galvanic connection, thereby eliminating the possibility of dangerous leakage currents from the high-voltage supply on each zone 956. In some embodiments, an NFC tag is embedded in the cartridge that carries with it the encryption key to talk to the smart electrode microcontrollers 926 on a cartridge.

Figure 10A:
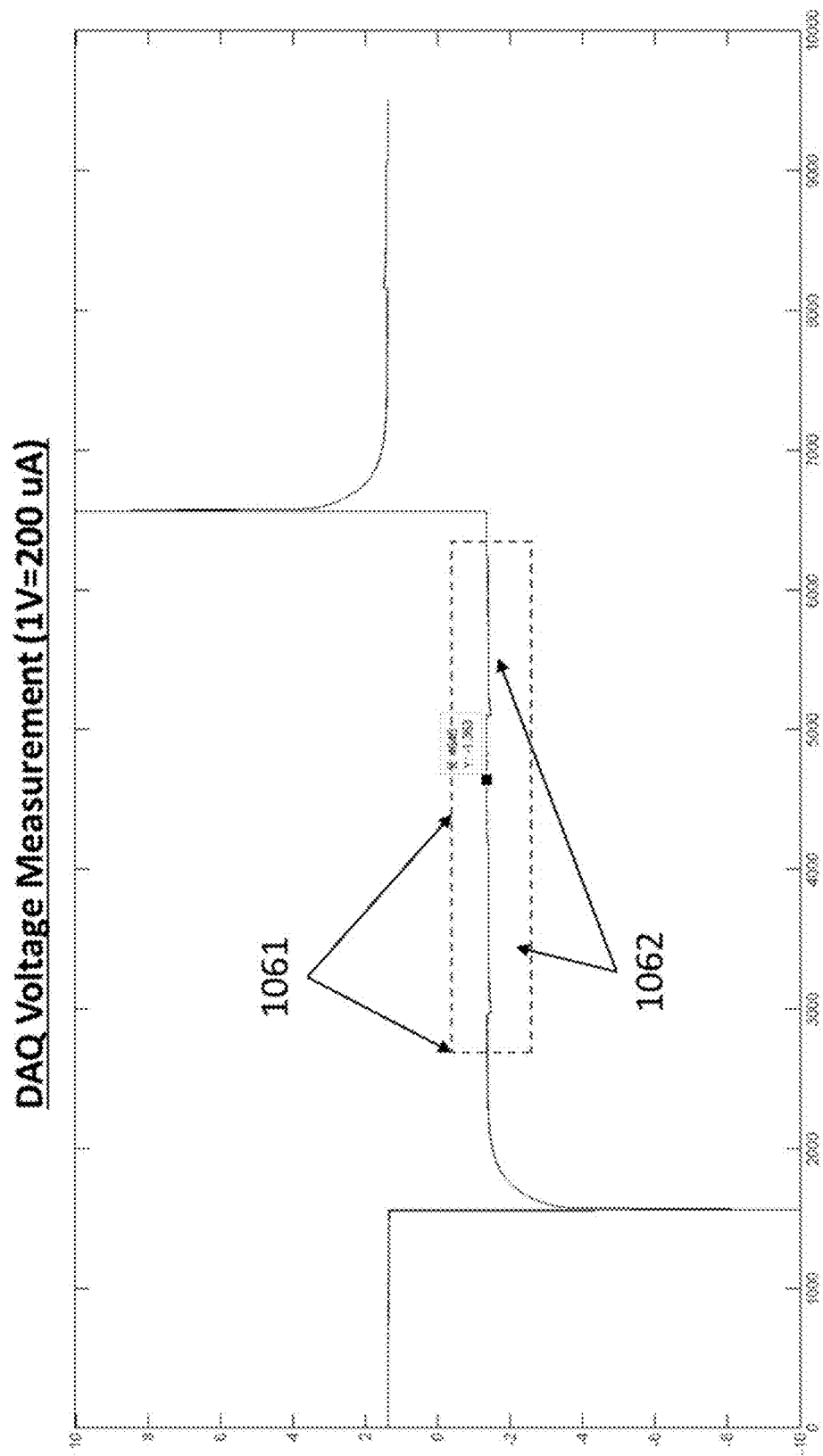
FIGS. 10A-10B show graphs of an exemplary application of a smart electrode for detection of capture and release of an article component.
Figure 10B:
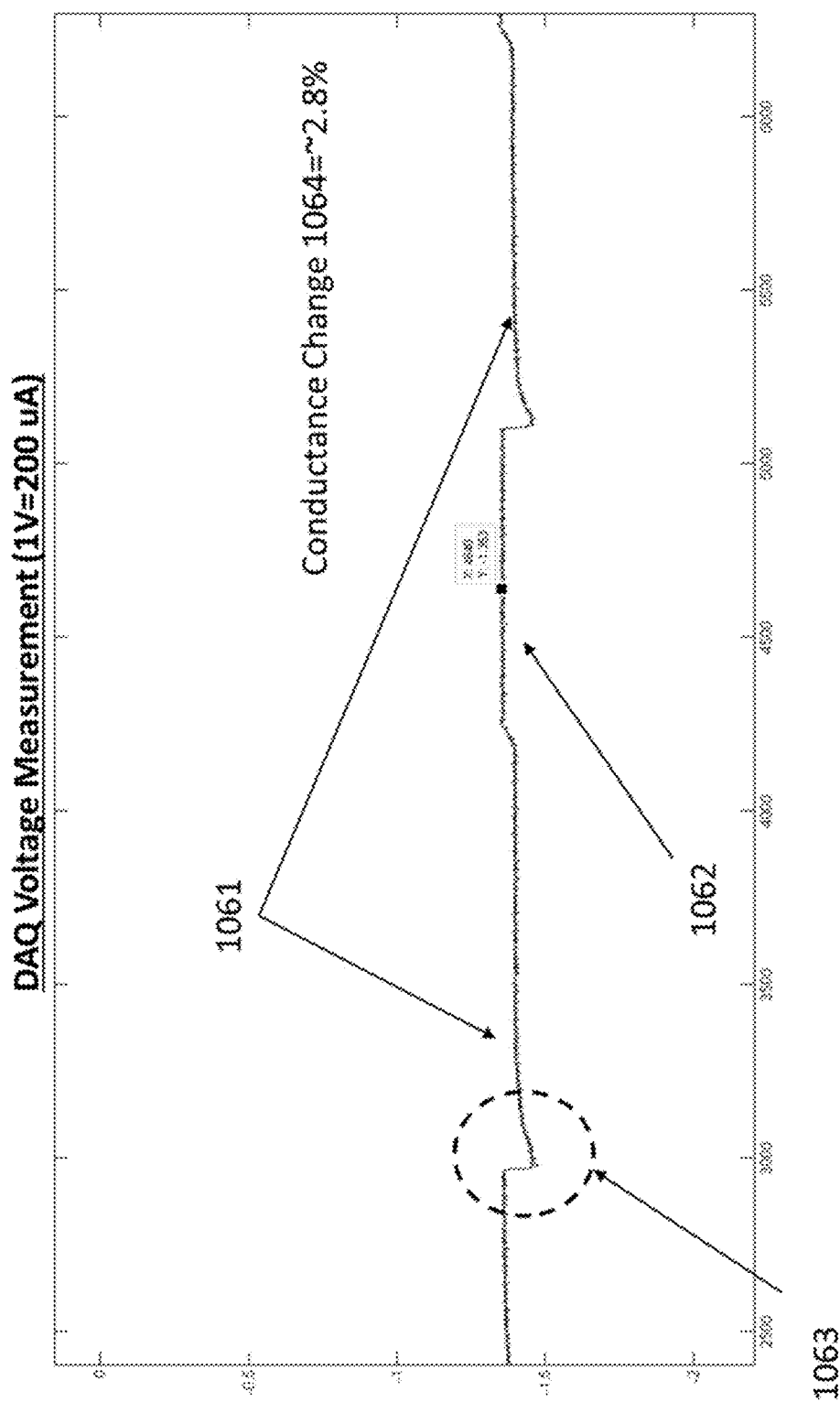

FIGS. 10A-10B show an exemplary application of a "smart" electrode for detection of capture and release of an article component. The smart electrode for example acts as a transducer to both capture an article component and sense the capture and release of the article component. The controller is configured to detect the capture of one or more target object, for example an article component, in the one or more electroadhesive zones by measuring at the one or more of the electroadhesive zones one or more of electrode current voltage, electrode admittance, and electrode impedance and recognize a signal pattern in one or more of an AC and DC signal component of the measurement. For example, a smart electrode is used to detect changes in voltage of an electroadhesive zone upon placement 1061 or removal 1062 of a pair of jeans on the contact surface of the smart electrode as shown in FIG. 10A. FIG. 10B shows an enlargement of the region indicated by dashed lines in FIG. 10A. There was both a detectable capacitance change 1063 and a conductivity change 1064—which together made a detectable change in electrode impedance—when the jeans were placed 1061 on the electroadhesive plate and well as a detectable change with the jeans were removed 1062 from the plate.

Figure 11:
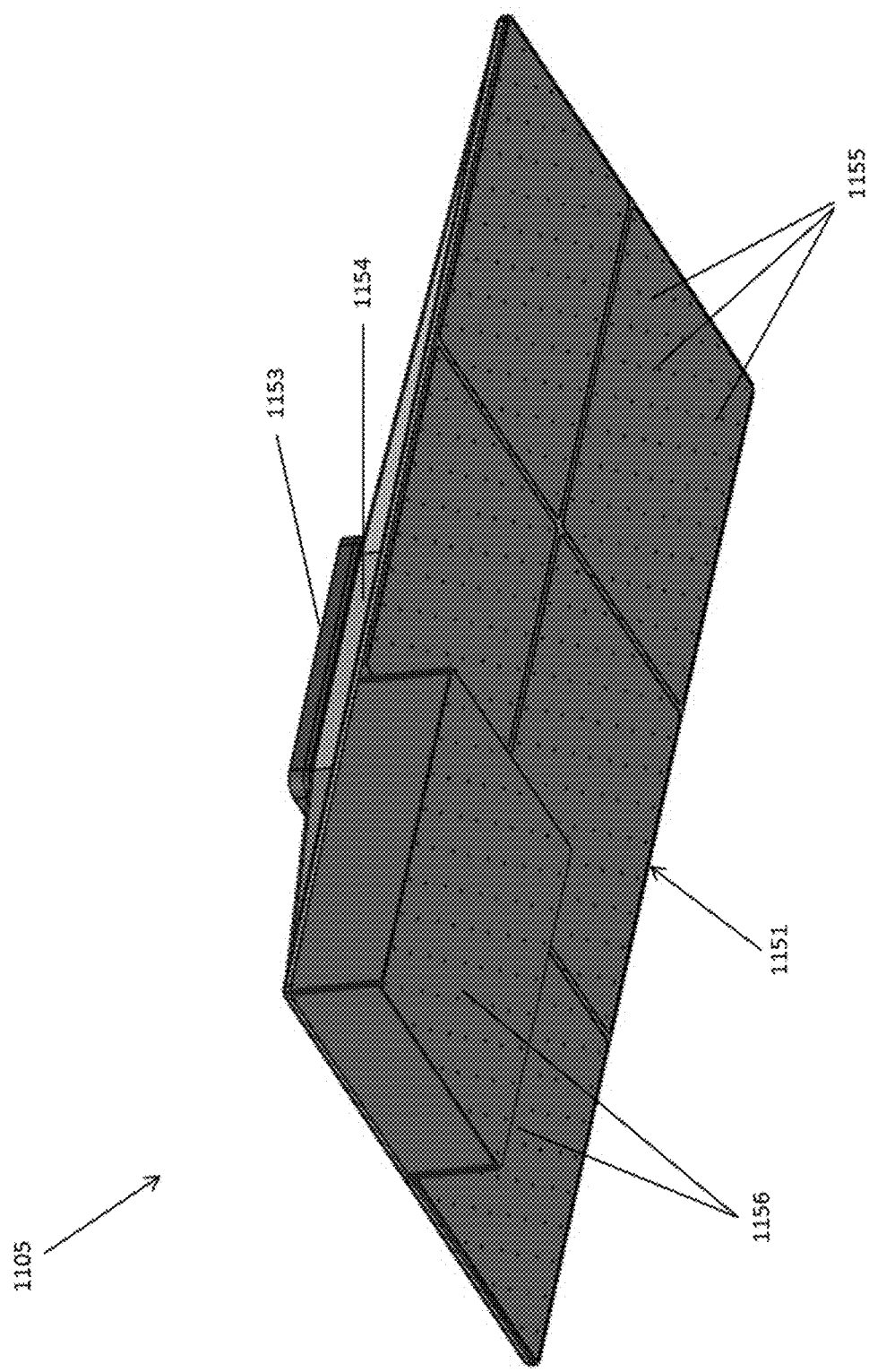
FIG. 11 shows a perspective view of an embodiment of an electroadhesion gripper with multiple electroadhesion zones wherein each zone has independent vertical activation.
Figure 12:
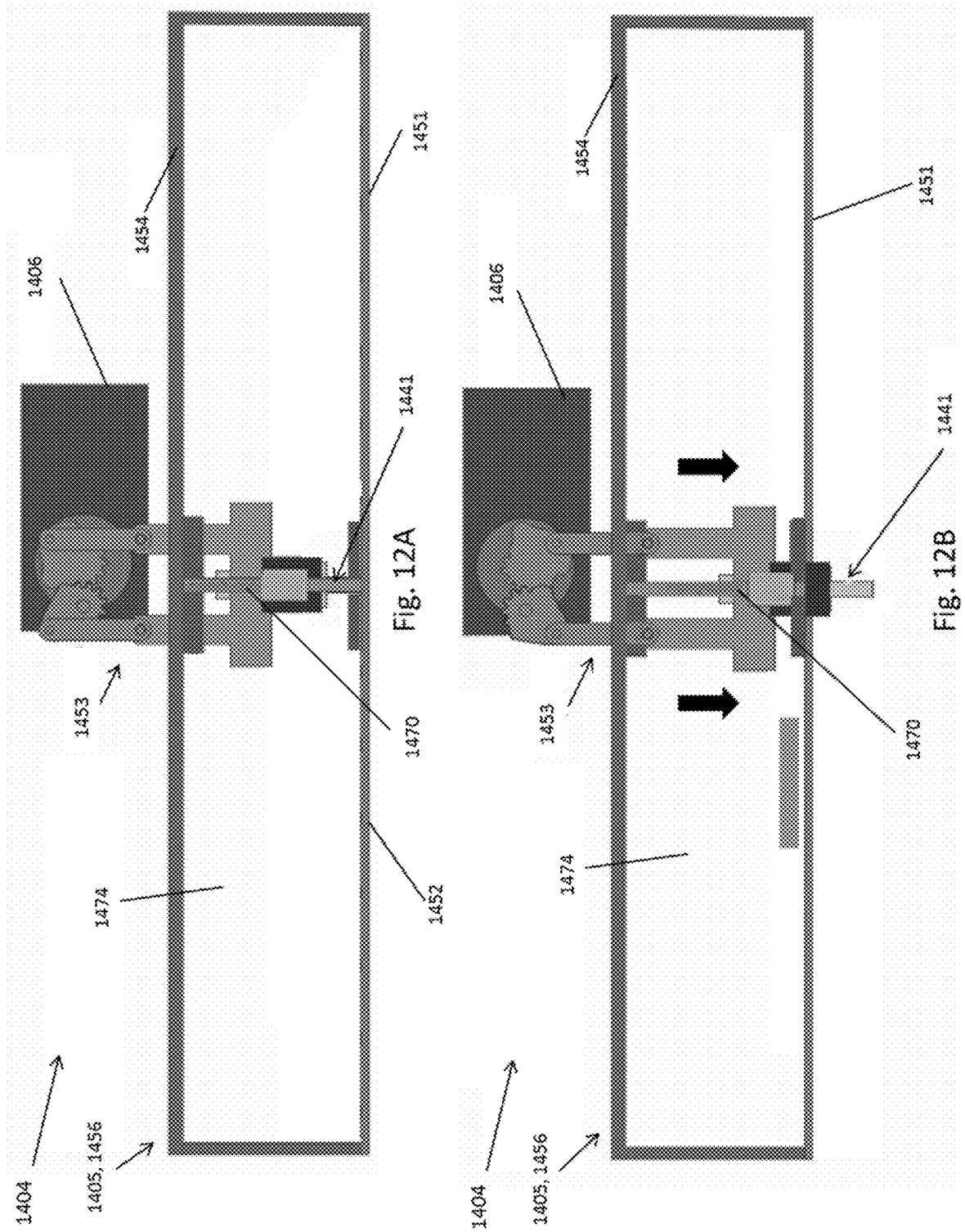
FIGS. 12A-12B show schematics of an embodiment of an electroadhesion gripper comprising a mechanical separation mechanism and an ultrasonic welder to facilitate capture and release of an article component.

FIG. 11 shows an embodiment of an electroadhesion gripper capture element 1105 with multiple electroadhesion zones 1156 wherein each zone 1156 has independent vertical activation. The electroadhesion gripper apparatus 1105 comprises an electroadhesive plate 1151 having a contact surface 1152 for capturing one or more target objects with electroadhesion, the electroadhesive plate 1151 comprising a one or more electroadhesive zones 1156, wherein electroadhesion in each electroadhesive zone 1156 is separately activated and a controller configured to individually activate or deactivate electroadhesion in each of the electroadhesive zones 1156. The electroadhesion plate 1151 for example comprises a plurality of electrodes 1155 and is operatively attached to the robotic actuator via a housing 1154 and linkage system 1153. One or more of the electroadhesive zones 1156 is extended forward from a retracted position to separate the extended electroadhesive zone 1156 from the remainder of the one or more retracted electroadhesive zones 1156. The multiple electroadhesion zones 1156 are substantially similar to other embodiments of an electroadhesion zone described herein.

FIGS. 12A-12B show schematics of an embodiment of an electroadhesion gripper 1404 comprising an electroadhesion plate 1451 with an ultrasonic welder 1441 to facilitate capture and release of an article component. The electroadhesion plate 1451 may be substantially similar to other embodiments described herein. The ultrasonic welder or horn 1441 is for example an integral part of the capture element 1405. The ultrasonic welder 1441 is optionally integrated into a mechanical separation mechanism 1470 of the electroadhesion capture element 1405. In some embodiments, the ultrasonic welder 1441 is optionally mounted so as to actuate when placing an article component on the second platform.

FIG. 12A shows a cross-section of an embodiment of an electroadhesion gripper 1404 comprising a mechanical separation mechanism 1470 and an ultrasonic welder 1441 with mechanical separation mechanism 1470 comprising the ultrasonic welder 1441 retracted. The electroadhesion gripper 1404 comprises a capture element 1405, for example an electroadhesive plate 1451 and a housing 1454. The housing 1454 for example extends from the electroadhesive plate 1451 to the connection 1471 to the robotic actuator and forms a plenum 1474 therebetween. The housing 1454 for example is optionally cuboid shaped, with contact between the electroadhesive plate 1451 and the housing 1454 forming one or more of a right angle and an obtuse angle. The housing 1454 for example is curved and/or forms a right angle where the housing 1454 contacts the connection 1471. The housing 1454 is for example optionally prismatic. As illustrated, in some embodiments the ultrasonic welder 1441 is integral with the mechanical separation mechanism 1470. When retracted as shown here, the mechanical separation mechanism 1470 is housed in a plenum 1474 formed between the electroadhesion plate 1451 and the housing 1454 of the capture element 1405. The capture element 1405 is connected to the robotic actuator 1406 via a linkage system 1453.

FIG. 12B shows a cross-section of an embodiment of an electroadhesion gripper 1404 comprising a mechanical separation mechanism 1470 and an integrated ultrasonic welder 1441 with mechanical separation mechanism 1470 extended. Extension of mechanical separation mechanism 1470 projects the ultrasonic welder 1441 into contact with the article components where it is activated to temporarily fuse the article components together. For example activation of the ultrasonic welder 1441 following release of a second article component onto a first article component temporarily fuses the article components together if one or more of the article components are impregnated with a hot-melt or other adhesive. In some embodiments, the ultrasonic welder 1441 is activated prior to release of the second article component onto the first article component. In some embodiments, the ultrasonic welder 1441 is activated without extension of the mechanical separation mechanism 1470. In some embodiments, the ultrasonic welder 1441 is activated before the capture element 1405 is moved away from the first and second article components. Said tack weld is used for example to prevent dislodging of the article components when transferred to or at a downstream manufacturing apparatus, for example when traveling through hot rollers or when in transit from one manufacturing apparatus to another.

Figure 13:
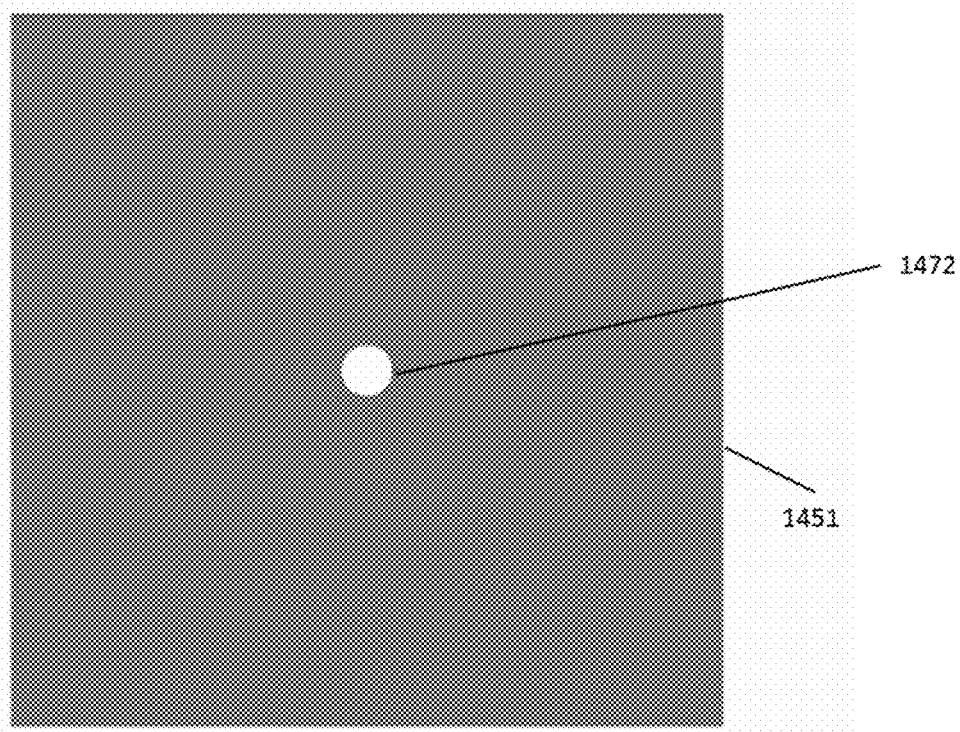
FIG. 13 shows a top view of an embodiment of an electroadhesion plate.

FIG. 13 shows a top view of the electroadhesion plate 1451. In some embodiments, the electroadhesion plate 1451 comprises a central orifice 1472 through which the ultrasonic welder 1441 may be projected towards an article component or a plurality of article components.

Figure 14:
FIG. 14 shows a perspective view of an embodiment of a mechanical separation mechanism with integrated ultrasonic welder.

FIG. 14 shows a perspective view of an embodiment of a mechanical separation mechanism 1470 with integrated ultrasonic welder 1441 as used in FIG. 12A-12B. The ultrasonic welder 1441 is integrally located at the center of the mechanical separation mechanism 1470 in a location corresponding to the orifice 1472 of the electroadhesion plate 1451 as illustrated in FIG. 13.

In many embodiments, the electroadhesion gripper 1404 comprises an electroadhesion plate 1451 with a plurality of electroadhesion zones 1456 as previously described herein. Each electroadhesion zone 1456 for example comprises a mechanical separation mechanism 1470 and an ultrasonic welder 1441, such that each zone 1456 is individuated and actuatable independent of every other zone 1456. In some embodiments, each zone 1456 is individuated in such a way that the capture and release modalities of each electroadhesion zone 1456 of the capture element 1405 are activated independently from every other zone 1456. Each zone 1456 for example has an integral ultrasonic welder 1441. The ultrasonic welder 1441 is optionally integrated into the mechanical separation mechanism 1470 of the electroadhesion zone 1456 as shown in FIGS. 11-14. In some embodiments, an ultrasonic welder 1441 is optionally embedded in each of the electroadhesion zones 1456 such that the tack weld is accomplished without additional motion of the robotic actuator following release of the article components on the second platform.

In some embodiments, each electroadhesion zone 1456 is separable from each other zone 1456 such that the electroadhesion plate 1451 has replaceable segments or zones 1456. In some embodiments, each replaceable segment 1456 of the electroadhesion plate 1451 comprises an electroadhesion zone 1456 and a housing 1454 with connection to the gripper 1404, such that the housing 1454 and electroadhesion zone 1456 are a detachable unit.

In many embodiments, the contact surface 1452 of the electroadhesion plate 1451 is non-planar. In many embodiments, the contact surface 1452 of the electroadhesion plate 1451 is compressible, for example being made of a compressible material. In some embodiments the contact surface 1452 of the electroadhesion plate 1451 is a compressible planar surface. In some embodiments, the contact surface 1452 of the electroadhesion plate 1451 is a compressible non-planar surface. In some embodiments, the contact surface 1452 of the electroadhesion plate 1451 is a non-compressible non-planar surface.

In many embodiments, the contact surface 1451 of one or more of an electroadhesion zone 1456 is non-planar. In many embodiments, the contact surface 1451 of the electroadhesion zone 1456 is compressible, for example being made of a compressible material, having a compressible coating, and/or being mounted via a compressible interface. In some embodiments, the contact surface 1452 of the electroadhesion zone 1456 is a compressible planar surface. In some embodiments, the contact surface 1452 of the electroadhesion zone 1456 is a compressible non-planar surface. In some embodiments, the contact surface 1452 of the electroadhesion zone 1456 is a non-compressible non-planar surface. In some embodiments the plurality of electroadhesion zones 1456 in the gripper are arranged so as to be coplanar. In some embodiments the plurality of electroadhesion zones 1456 in the gripper are arranged so as to be not coplanar—for example specifically arranged so as to improve gripping force and article flatness following release onto the second platform. In some embodiments, the electroadhesive surface 1452 of each zone 1456 is coupled to an actuator or a passive linear movement mechanism such that the surfaces of the zones 1456 are at times coplanar and at other times on parallel but separate planes.

Figure 15B:
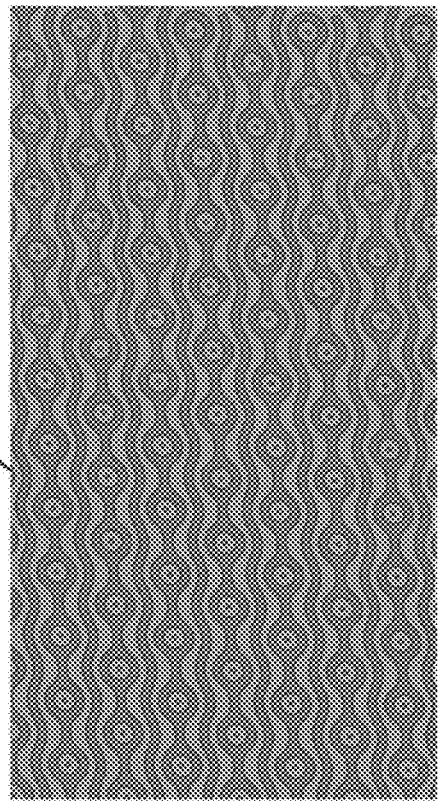
FIGS. 15A-15C show magnified views of the electrodes in exemplary embodiments of an electroadhesion gripper plate with various patterns for electrodes.
Figure 15A:
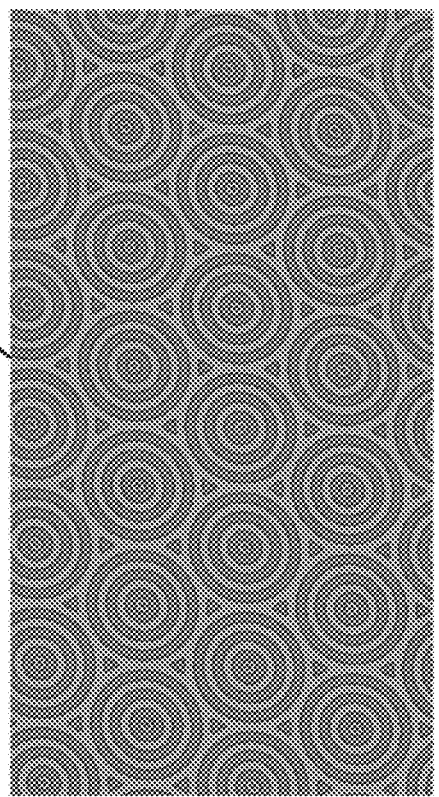
Figure 15C:
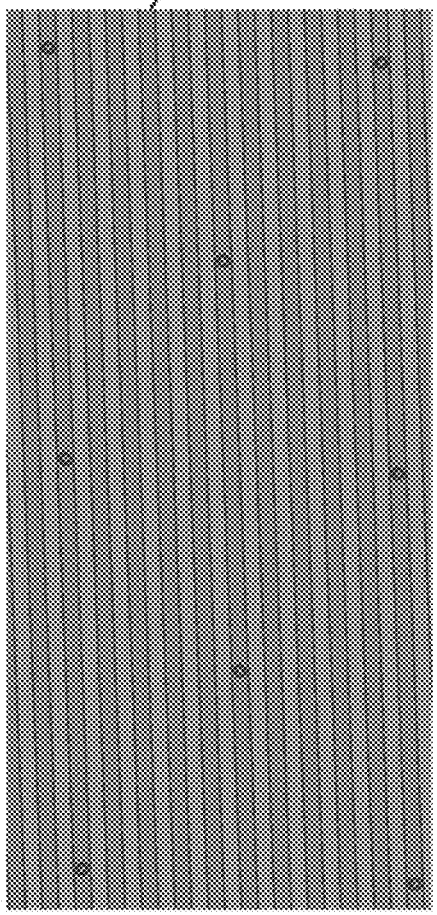

FIGS. 15A-15C show exemplary embodiments of an electroadhesion gripper plate 1551 with various patterns for electrodes. FIG. 15A shows an embodiment of an electroadhesion plate 1551 or electroadhesion zone 1556 wherein the electroadhesion electrodes form concentric rings. FIG. 15B shows an embodiment of an electroadhesion plate 1551 or electroadhesion zone 1556 wherein the electroadhesion electrodes form chains of donuts and squiggles. FIG. 15C shows an embodiment of an electroadhesion plate 1551 or electroadhesion zone 1556 wherein the electroadhesion electrodes are more traditionally patterned, for example with parallel lines, in a comb pattern, or interdigitated. It is contemplated that the electrodes are in the conductive traces or in the space between traces.

FIG. 16 shows a method 1600 of capturing and releasing a plurality of target objects using an electroadhesion manufacturing system comprising an electroadhesion gripper as described previously herein. The method may use one or more of the systems and apparatus described herein.

At step 1601, a first article component and a second article component on a first platform are recognized, for example using an image taken by a camera above the first platform.

At step 1602, the first article component is captured by a first electroadhesion zone and the second article component is capture by a second electroadhesion zone. Capture of the first article component for example comprises activation of electroadhesion within the first electroadhesion zone (step 1602A). Capture of the second article component for example comprises activation of electroadhesion within the second electroadhesion zone (step 1602A). Capture of the first and second article components occurs simultaneously.

At step 1603, the capture of the first article component is detected by a first smart electrode embedded in the first electroadhesion zone.

At step 1604, the capture of the second article component is detected by a second smart electrode embedded in the second electroadhesion zone.

At step 1605, the first article component is released from the first electroadhesion zone while the second article component is retained at the second electroadhesion zone. Release of the first article component from the first electroadhesion zone for example comprises one or more of extension of the first electroadhesion zone (step 1605A) and reversal of the electrode voltage of the first electroadhesion zone (step 1605B).

At step 1606, release of the first article component is detected by the first smart electrode.

At step 1607, retention of the second article component is detected by the second smart electrode.

At step 1608, the second article component is released from the second electroadhesion zone. Release of the second article component from the second electroadhesion zone for example comprises any of the release mechanisms described previously herein.

At step 1609, release of the second article component is detected by the second smart electrode.

At step 1610, the previous steps are repeated for multiple article components.

Although the steps above show a method 1600 of capturing and releasing a plurality of target objects using an electroadhesion manufacturing system comprising an electroadhesion gripper in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as necessary to assemble at least a part of an article.

For example, in some embodiments Step 1601 may occur in multiple steps such that the first and second article components are detected at different times. Alternatively or in combination, Step 1602 optionally occurs such that the first and second article components are captured at different times. In many embodiments, additional article components are for example detected and captured simultaneously with the detection and capture of the first and second article components, respectively.

Although the steps above show a method 1600 of capturing and releasing objects in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as beneficial.

In many embodiments, one or more of the steps of the method 1600 are performed with circuitry of the various components described herein. In some embodiments, the circuitry is programmed to provide one or more of the steps of the method 1600, and the program comprises program instructions stored on a computer readable memory or programmed steps of the logic in the circuitry.

FIG. 17 shows a method 1700 of facilitating the manufacture of an article as described previously herein. The method may use one or more of the systems and apparatus described herein.

At step 1701, lighting at the operator-side of the first platform is optimized At step 1702, one or more guidance images and messages are projected onto the first platform.

At step 1703, a first article component is placed on the first platform.

At step 1704, the first article component is recognized

At step 1705, misplacement of the first article component is identified.

At step 1706, whether or not the first article component is lying flat on the first platform is detected.

At step 1707, one or more messages and instructions are projected to the operator if a placement error is detected at one or more of steps 1705 and 1706.

At step 1708, steps 1703-1707 are repeated until the first article component is identified as correctly placed.

At step 1709, steps 1703-1708 are repeated for each additional article component.

At step 1710, the article component(s) is sent to the robot-side of the first platform.

Although the steps above show a method of facilitating the manufacture of an article in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as necessary ensure correct placement of one or more article component on the operator-side of the first platform.

For example, in many embodiments two or more article components are placed on the first platform in Step 1703 such that recognition of each of the two or more article components (Step 1704) occurs simultaneously with recognition of each of the other of the two or more article components. Steps 1705-1708 are then performed in parallel for each article component to reduce time spent correcting placement errors.

Although the steps above show a method 1700 of facilitating manufacturing in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as beneficial.

In many embodiments, one or more of the steps of the method 1700 are performed with circuitry of the various components described herein. In some embodiments, the circuitry is programmed to provide one or more of the steps of the method 1700, and the program comprises program instructions stored on a computer readable memory or programmed steps of the logic in the circuitry.

FIG. 18 shows a method 1800 of manufacturing an article using an electroadhesion manufacturing system comprising an electroadhesion gripper as described previously herein. The method may use one or more of the systems and apparatus described herein.

At step 1801, incoming part information is received from an upstream manufacturing apparatus.

At step 1802, the presence of a first article component at the first platform is detected. In some embodiments, the presence of the first article component is for example detected by any combination of an overhead camera, gesture-controlled sensors, or other means described previously herein.

At step 1803, the presence of a second article component at the first platform is detected. The system further recognizes that all article components have been placed on the first platform (Step 1803A). For example, one or more of the shape, color, orientation, and number of article components placed on the first platform is assessed by imaging the first platform and compared to expected shapes, colors, orientation, and/or numbers as previously taught to the system as previously described herein. Upon recognition that all expected article components have been placed on the operator-side of the first platform, the article components are indexed to the robot-side of the first platform (Step 1803B), for example by rotation of a first platform comprising a turntable.

At step 1804, the first article component on the first platform is recognized At step 1805, the capture element is placed over the first article component. Placement of the capture element for example comprises one or more of moving a robotic arm (step 1805A) and aligning the capture element to a first predetermined capture location (step 1805B).

At step 1806, the first article component is captured by the first electroadhesion zone. Capture for example comprises activation of electroadhesion within the first electroadhesion zone (step 1806A).

At step 1807, the second article component on the first platform is recognized.

At step 1808, the capture element is placed over the second article component. Placement of the capture element for example comprises one or more of moving the robotic arm (step 1808A) and aligning the capture element to a second predetermined capture location (step 1808B).

At step 1809, the second article component is captured by the second electroadhesion zone. Capture for example comprises activation of electroadhesion within the second electroadhesion zone (step 1809A).

At step 1810, the article components are moved to a position over the second platform. Movement of the article components for example comprises one or more of moving the robotic arm (step 1810A), recognizing a first predetermined location on the second platform (step 1810B), and aligning the capture element to the first predetermined location (step 1810C).

At step 1811, the first article component is released from the first electroadhesion zone while the second article component is retained at the second electroadhesion zone. Release of the first article component from the first electroadhesion zone for example comprises one or more of extension of the first electroadhesion zone (step 1811A) and reversal of the electrode voltage of the first electroadhesion zone (step 1811B).

At step 1812, the second article component is released onto the second platform. Release of the second article component from the second electroadhesion zone for example optionally comprises moving the robotic arm to align the capture element with a second predetermined location of the second platform as previously described herein. Release of the second article component from the second electroadhesion zone for example comprises any of the release mechanisms described previously herein.

At step 1813, the previously described steps are repeated for multiple article components.

At step 1814, metrics are generated. The methods generated for example comprise one or more of manufacturing production rates (step 1814A), incoming part acceptance (step 1814B), part capture accuracy (step 1814C), and part placement accuracy (step 1814D).

At step 1815, the metrics are sent to a remote computing device (also described herein as a remote computer host).

At step 1816, outgoing part information is sent to downstream manufacturing apparatus.

Although the steps above show a method of manufacturing an article using an electroadhesion manufacturing system comprising an electroadhesion gripper in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as necessary to assemble at least a part of an article.

For example, in many embodiments Steps 1802, 1803, 1804, and 1807 occur simultaneously such that the first and second article components are detected and recognized at the same time. Alternatively or in combination, Steps 1805 and 1808 of positioning the capture element optionally occur simultaneously when the first and second article components have been placed in predetermined capture locations such that Steps 1806 and 1809 are able to be performed simultaneously to capture the first and second article components at the same time. In many embodiments, additional article components are for example detected and captured simultaneously with the detection and capture of the first and second article components, respectively.

Although the steps above show a method 1800 of manufacturing an article in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as beneficial.

In many embodiments, one or more of the steps of the method 1800 are performed with circuitry of the various components described herein. In some embodiments, the circuitry is programmed to provide one or more of the steps of the method 1800, and the program comprises program instructions stored on a computer readable memory or programmed steps of the logic in the circuitry.

FIG. 19 shows a method 1900 of manufacturing an article using an actuating second platform as described previously herein. The method may use one or more of the systems and apparatus described herein.

At step 1901, a first article component is received on the first platform.

At step 1902, the first article component is identified.

At step 1903, the position of the first article component on the first platform is determined.

At step 1904, one or more of the identity and position of the first article component is communicated to the second platform.

At step 1905, the second platform is repositioned to receive the first article component.

At step 1906, the first article component is conveyed to the second platform.

At step 1907, the first article component is received at the second platform from the first platform.

At step 1908, steps 1901-1908 are repeated for additional article components.

At step 1909, the article component(s) is fed on to further manufacturing apparatus.

Although the steps above show a method 1900 of manufacturing an article in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as beneficial.

In many embodiments, one or more of the steps of the method 1900 are performed with circuitry of the various components described herein. In some embodiments, the circuitry is programmed to provide one or more of the steps of the method 1900, and the program comprises program instructions stored on a computer readable memory or programmed steps of the logic in the circuitry.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A system for manufacturing an article, the system comprising:
    a first platform configured to receive manual placement of a first article component at a first placement position and a second article component at a second placement position thereon by an operator located adjacent an operator-side of the first platform, and wherein the first platform includes a robot-side spaced from the operator-side;
    a second platform having a first predetermined location for the first article component and a second predetermined location for the second article component;
    an electroadhesive capture element for capturing the first and second article components placed on the first platform;
    a multi-axis robotic actuator coupled to the capture element, wherein the robotic actuator is mounted for movement at a mounting location spaced away from the operator-side of the first platform to enable an operator to be located adjacent the operator-side of the first platform; and
    a cover disposed over a portion of the first platform between the operator-side of the first platform and the capture element;
    wherein the first platform is moveable to reposition the first article component from the first placement position to a first pick-up position on the first platform away from the operator-side and toward the robot-side of the first platform while the operator is adjacent the operator-side and reposition the second article component from the second placement position to a second pick-up position on the first platform away from the operator-side of the first platform and toward the robot-side of the first platform while the operator is adjacent the operator-side, wherein the cover is disposed over the first and second pick-up positions and the first and second placement positions are separated from the first and second pick-up positions by the cover, and wherein the robotic actuator is configured to move the capture element over the first platform to capture the first and second article components from the first platform at the first and second pick-up positions and to move the capture element to reposition the captured first and second article components over the first and second predetermined locations on the second platform, respectively, wherein the capture element is configured to release the first and second article components onto the first and second predetermined locations, respectively, for assembly of the first and second article components into the article.

2. The system of claim 1, further comprising an automated visualization system configured to recognize one or more of the first and second article components placed on the first platform.

3. The system of claim 1, further comprising an automated visualization system configured to determine one or more of the first and second predetermined locations on the second platform to facilitate release of one or more of the first and second article components onto the first and second predetermined locations, respectively.

4. The system of claim 1, wherein the capture element comprises an electroadhesive surface, and wherein the electroadhesive surface comprises a first zone for capturing the first article component and a second zone for capturing the second article component.

5. The system of claim 4, wherein the first and second zones of the electroadhesive surface are separately activated to selectively capture or release one or more of the first and second article components.

6. The system of claim 1, wherein the robotic actuator is configured to position the capture element to sequentially capture the first and second article components from the first platform.

7. The system of claim 1, wherein the robotic actuator is configured to position the capture element to simultaneously capture the first and second article components from the first platform.

8. The system of claim 1, wherein the robotic actuator is configured to move the capture element to sequentially position the captured first and second article components over the first and second predetermined locations on the second platform, respectively.

9. The system of claim 1, wherein the robotic actuator is configured to move the capture element to simultaneously position the captured first and second article components over the first and second predetermined locations on the second platform, respectively.

10. The system of claim 1, further comprising an image projector adapted to project one or more guiding images onto the first platform to guide placement of the first and second article components.

11. The system of claim 1, wherein at least a portion of the first of one or more guiding images therethrough to indicate the predetermined locations on the first platform.

12. The system of claim 1, wherein the second platform comprises a conveyer or conveyer belt.

13. The system of claim 1, wherein one or more of the first and second article components comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit.

14. The system of claim 1, further comprising a controller coupled to one or more of the first platform, the second platform, the capture element, and the robotic actuator, and wherein the controller is configured to generate one or more manufacturing metrics based on one or more of acquiring one or more images of the first and second article components on the first platform, capturing the first and second article components, moving the captured first and second article components, releasing the captured first and second article components, and acquiring one or more images of the first and second article components on the second platform.

15. A system for manufacturing an article, the system comprising:
- a first platform configured to receive manual placement of a first article component at a first placement location thereon by an operator located adjacent an operator-side of the first platform, wherein the first platform is moveable to reposition the first article component from the first placement position to a first pick-up position;
- a second platform having a first predetermined location for the first article component;
- an electroadhesive capture element for capturing the first article component placed on the first platform;
- a multi-axis robotic actuator coupled to the capture element, wherein the robotic actuator is spaced away from the operator-side of the first platform to enable an operator to be located adjacent the operator-side of the first platform;
- an image projector configured to project a guiding image comprising an outline of the first article component onto the first platform to guide manual placement of the first article component at the first placement location on the first platform; and
- a cover disposed over a portion of the first platform between the operator-side of the first platform and the capture element, wherein the cover is disposed over the first pick-up position of the first platform and the first placement position is separated from the first pick-up position by the cover;
- wherein the robotic actuator is configured to move the capture element within the cover and over the first platform to capture the first article component from the first platform at the first pick-up position and to move the capture element to reposition the captured first article component over the first predetermined location on the second platform, wherein the capture element is configured to release the first article component onto the first predetermined location, for assembly of the first article component into the article.

16. The system of claim 15, wherein the robotic actuator comprises a robotic arm.

17. The system of claim 15, wherein the first platform comprises a turntable or a conveyor.

18. A system for manufacturing an article, the system comprising:
- a first platform configured to receive manual placement of a first article component at a first placement location thereon by an operator located adjacent an operator-side of the first platform, wherein the first platform is moveable to reposition the first article component from the first placement position to a first pick-up position;
- a second platform having a first predetermined location for the first article component;
- an electroadhesive capture element for capturing the first article component placed on the first platform;
- a multi-axis robotic actuator coupled to the capture element, wherein the robotic actuator is spaced away from the operator-side of the first platform to enable an operator to be located adjacent the operator-side of the first platform; and
- a cover disposed over a portion of the first platform between the operator-side of the first platform and the capture element, wherein the cover is disposed over the first pick-up position of the first platform and the first placement position is separated from the first pick-up position by the cover;
- wherein the robotic actuator is configured to move the capture element within the cover over the first platform to capture the first article component from the first platform at the first pick-up position and to move the capture element to reposition the captured first article component over the first predetermined location on the second platform, wherein the capture element is configured to release the first article component onto the first predetermined location, for assembly of the first article component into the article.

19. The system of claim 18, wherein the capture element comprises an electroadhesive plate comprising a planar electroadhesive surface comprising a plurality of electrodes disposed at the planar electroadhesive surface.

20. The system of claim 15, wherein the capture element comprises an electroadhesive plate comprising a planar electroadhesive surface comprising a plurality of electrodes disposed at the planar electroadhesive surface.

* * * * *